United States Patent
Bennett, III et al.

(10) Patent No.: US 6,424,959 B1
(45) Date of Patent: Jul. 23, 2002

(54) METHOD AND APPARATUS FOR AUTOMATIC SYNTHESIS, PLACEMENT AND ROUTING OF COMPLEX STRUCTURES

(75) Inventors: Forrest H. Bennett, III, Menlo Park, CA (US); John R. Koza, 25372 La Rena La., Los Altos Hills, CA (US) 94022

(73) Assignee: John R. Koza, Los Altos Hills, CA (US)

(*) Notice: Subject to any disclaimer, the term of this patent is extended or adjusted under 35 U.S.C. 154(b) by 0 days.

(21) Appl. No.: 09/336,373

(22) Filed: Jun. 17, 1999

(51) Int. Cl.$^7$ .................................. G06F 9/445
(52) U.S. Cl. ..................... 706/13; 706/919; 706/921; 714/8; 714/724; 716/8
(58) Field of Search .................... 706/13, 27, 921, 706/919; 707/102; 716/8

(56) References Cited

U.S. PATENT DOCUMENTS

| | | | | |
|---|---|---|---|---|
| 4,935,877 A | * | 6/1990 | Koza | 706/13 |
| 5,136,686 A | * | 8/1992 | Koza | 706/13 |
| 5,148,513 A | * | 9/1992 | Koza et al. | 706/13 |
| 5,239,643 A | * | 8/1993 | Blount et al. | 707/102 |
| 5,329,464 A | * | 7/1994 | Sumic et al. | 703/1 |
| 5,343,554 A | * | 8/1994 | Koza et al. | 706/13 |
| 5,535,134 A | * | 7/1996 | Cohn et al. | 716/8 |
| 5,550,839 A | * | 8/1996 | Buch et al. | 714/724 |
| 5,651,099 A | * | 7/1997 | Konsella | 706/13 |
| 5,742,738 A | * | 4/1998 | Koza et al. | 706/13 |
| 5,867,397 A | * | 2/1999 | Koza et al. | 703/14 |

* cited by examiner

Primary Examiner—Thomas Black
Assistant Examiner—Michael B. Holmes
(74) Attorney, Agent, or Firm—Blakely, Sokoloff Taylor & Zafman LLP

(57) ABSTRACT

The present invention consists of a method and apparatus for the automatic creation of the topology, component sizing, placement, and routing of complex structures, such as electronic circuits or mechanical systems, to satisfy prespecified high-level design goals. The present invention uses a population of entities which are evolved over a series of generations by an iterative process involving the application of operations, such as mutation, crossover, reproduction, and architecture-altering operations. The individuals in the population are each developed, in a developmental process, into a structure that may potentially satisfy the design goals. The present invention also determines the placement of components within the developing structure and determining the routing of the connecting means (wires for electrical circuits) between the components. The behavior of the structures is evaluated in relation to the high-level design goals, and those structures more closely satisfying the design goals are evolved further until a structure is generated that either meets the prespecified design goal. In this manner, the topology, component sizing, placement, and routing of a complex structure may be obtained.

96 Claims, 27 Drawing Sheets

METHOD AND APPARATUS FOR
AUTOMATIC SYNTHESIS, PLACEMENT
AND ROUTING OF COMPLEX
STRUCTURES

FIELD OF THE INVENTION

The present invention relates to the field of automatic development of complex structures; more particularly, the present invention relates to the automatic creation of the topology, component sizing, placement, and routing of components in complex structures, such as, for example, electrical circuits or mechanical system.

BACKGROUND OF THE INVENTION

Engineers are often called upon to design complex structures, such as electrical circuits or mechanical systems, that satisfy certain high-level design goals or requirements. The design of such structures is ordinarily thought to require human intelligence and typically involves intricate tradeoffs between competing design considerations.

Electrical circuits, for example, are composed of a variety of types of components, including resistors, capacitors, inductors, diodes, transistors, and energy sources. The individual components of an electrical circuit may be connected to one another in a particular topological arrangement to form an electrical circuit. Moreover, the actual physical location on a printed circuit board, a silicon wafer, or other substrate is often important in determining the behavior or usefulness of a circuit.

Similarly, mechanical structures are composed from a variety of types of components, including springs, dash pots, wheels, belts, gears, pulleys, and so forth. The individual components of a mechanical system are connected to one another in a particular topological arrangement. Moreover, the actual physical location of the components, in two or three dimensions, in relation to each other plays a crucial role in determining the behavior of a mechanical system.

In designing an electrical circuit, mechanical structure, or other complex structure, the goal is to attain certain desired values of one or more observable behavioral quantities (e.g., certain voltages at certain times or frequencies at a certain probe point in the circuit, velocity of a certain mechanical part at a certain time) and, often, certain values of certain additional characteristics (e.g., the cost or number of components).

The creation of a complex structure typically requires creation of the topology, component sizing, placement, and routing of components of complex structures where the structure satisfies certain user-specified high-level design requirements.

The topology of an electrical circuit or mechanical system refers to the number of components, the type of each component (e.g., resistor, spring), and a list of all the connections between the leads of the components (e.g., leads of a resistor, ends of a spring). Topology also includes information about whether a particular lead or other type of interface point of a particular component is connected, in a graphical sense, to the lead of another component. That is, "topology" herein refers to whether or not a connection exists between two particular leads or interface points of components, and does not include information about the actual physical location (placement) of the component or about the actual physical location (routing) of the connecting means (wires, in the case of circuits) that connect the leads of components.

The sizing of a circuit refers to the component value(s) of each component. The sizing of a component is typically a numerical value (e.g., the capacitance of a capacitor, the spring constant of a spring), but is sometimes a non-numerical parameter (e.g., whether an electrical energy source is AC or DC, or the material used for a particular mechanical component).

Placement involves the assignment of each of the circuit's components to a particular physical location. In the case of electrical circuits, electrical components are placed onto a printed circuit board, silicon wafer, or other substrate. In mechanical systems, placement involves the assignment of each of the system's components to a particular physical location in two or three dimensions.

Routing involves the assignment of a particular physical location to the connecting mechanism (e.g., wires) between the leads of the structure's components.

The actual physical location (placement) of components, in two or three dimensions, is almost always crucial to the operation of mechanical systems.

Similarly, for electrical circuits, the actual physical location (placement) of components and the actual physical location (routing) of the wires that connect the components is often important for various different reasons. For example, it may be desirable to minimize the total area occupied by the circuit. Two circuits may have identical topology and sizing (e.g., the same number of transistors and capacitors whose leads are topologically connected in the same way), but one circuit may be preferable to the other because it is laid out in such a way that it occupies less space. In addition, the routing is often crucial because it affects the distance between two components (thereby affecting, say, the time required for an electrical signal to travel between two components along a wire). Also, the exact physical location of each component and wire is important because electrical components subtly interact with one another based on their physical location. These interactions, called parasitic effects, are generally small in magnitude (relative to other effects within the circuit) and can sometimes be ignored in simple circuits operating in non-challenging regimes. However, for many operating regimes, it is impossible to design a practical circuit without considering parasitic effects. For example, parasitic effects may crucially affect the performance of a circuit operating, say, at radio frequencies (RF).

Search Techniques

There are many techniques for searching a space for its optimum points, including, as examples, hill-climbing, simulated annealing, and genetic programming.

A search through any search space involves starting with one or more entities (points) from the search space, ascertaining the "goodness" of the entity for solving the problem at hand, creating a new candidate entity by modifying an existing entity, ascertaining the "goodness" of the new candidate entity, and using the "goodness" measure to select among entities. The "goodness" measure is typically called the "fitness measure" when talking about genetic programming and "energy level" when talking about simulated annealing. The term "fitness" will be used below to refer to either the fitness measure in a genetic programming sense and the energy level in a simulated annealing sense.

Search by Use of Hill Climbing

Simple hill climbing involves starting with a single initial entity (point) in the search space, ascertaining the fitness of the entity, creating a new (usually nearby) candidate entity, ascertaining the fitness of the new candidate entity, and using the fitness measure to select between the preexisting entity and the new candidate entity. In hill climbing, a new candidate point with a better fitness than the preexisting point is unconditionally selected. Conducting a search using hill climbing through a space of entities in a nontrivial problem typically results in the search becoming trapped at a local optimum point rather than finding the global optimum point of the search space.

Search by Use of Simulated Annealing

Simulated annealing (Kirkpatrick, Gelatt, and Vecchi 1983; Aarts and Korst 1989) resembles hill climbing in that it is a point-to-point search technique. Like hill climbing, it employs a problem-specific probabilistic modification operation (usually called a mutation when talking about simulated annealing) for modifying the current entity (point) in the search space in order to obtain a new candidate entity. At each step of the search, the current point in the search space is modified using the modification operator and the new point's fitness is ascertained. In general terms, the beginning of a run of simulated annealing conducts a broad-based search for promising regions of the search space, while the end of the run resembles does hill-climbing in a localized area.

Specifically, simulated annealing involves starting with a single initial entity (point) in the search space, ascertaining the fitness of the entity, creating a new candidate entity, ascertaining the fitness of the new candidate entity, and using the fitness measure to select between the preexisting entity and the new candidate entity. Simulated annealing always selects the new candidate entity if it is better than the preexisting entity. However, simulated annealing differs from hill climbing in the way it handles the case when the new candidate entity is worse than the preexisting entity. In this event, the Metropolis algorithm and the Boltzmann equation are applied to determine whether to accept a non-improving new candidate entity. A run of simulated annealing is governed by an annealing schedule in which a temperature T changes as the run proceeds (typically in an exponentially decreasing way). The effect of the Metropolis algorithm and the Boltzmann equation are that the probability of acceptance of a non-improving modification is greater if the fitness difference is small or if the temperature T is high. Thus, fairly large non-improving modifications are likely to be accepted early in the run (when the temperature is high), while only small non-improving modifications are likely to be accepted later in the run. In other words, simulated annealing becomes very similar to hill climbing in later stages of the run. If a modification is not accepted at any step of the run of simulated annealing, the probabilistic modification operator is reinvoked to produce another new point.

Simulated annealing is similar to genetic programming in that it sometimes accepts a newly created point that is known to be inferior in the hope that it will lead to better points. Simulated annealing differs from genetic programming in that simulated annealing always accepts an improving modification while genetic programming do not. Simulated annealing and hill climbing differ from searches conducted by the genetic programming (described below) in that there is no population of entities in simulated annealing or hill climbing. Only one entity (point) is retained at each generation of the search in simulated annealing or hill climbing. Because there is no population in simulated annealing or hill climbing, there is no analog to the crossover operation of genetic programming (where two parents recombine to produce offspring).

Search by Use of Genetic Programming

"Genetic programming" (also referred to as the "non-linear genetic algorithm" or the "hierarchical genetic algorithm" in previous years) is described in the book entitled *Genetic Programming: On the Programming of Computers by Means of Natural Selection*, by John R. Koza, Cambridge, Ma.: The MIT Press, 1992; the book entitled *Genetic Programming II: Automatic Discovery of Reusable Programs*, by John R. Koza, Cambridge, Ma.: The MIT Press, 1994; *Genetic Programming III: Darwinian Invention and Problem Solving* by John R. Koza, Forrest H Bennett III, David Andre, and Martin A. Keane, San Francisco, Calif.; Morgan Kaufmann Publishers, 1999; and in U.S. Pat. Nos. 4,935,877, 5,136,686, 5,148,513, 5,343,554, 5,742,738, and 5,867,397.

Genetic programming is referred to as "non-linear" or "hierarchical" because the original genetic algorithm described by John H. Holland in *Adaptation in Natural and Artificial Systems: An Introductory Analysis with Applications to Biology, Control, and Artificial Intelligence*, Ann Arbor, Mich.: University of Michigan Press, Second edition, Cambridge, Ma.: The MIT Press, 1975, operated on linear strings of characters (resembling chromosomes in nature), whereas genetic programming operates on hierarchical program trees of various sizes and shapes.

Genetic programming is capable of evolving computer programs that solve, or approximately solve, a variety of problems from a variety of fields. Genetic programming may start with a "primordial ooze" of randomly generated programs composed of the available programmatic ingredients and then applies the principles of animal husbandry to breed a new (and often improved) population of programs. Genetic programming may perform the breeding in a domain-independent way using the Darwinian principle of survival of the fittest, an analog of the naturally-occurring genetic operation of crossover (sexual recombination), and occasional mutation. The crossover operation is designed to create syntactically valid offspring programs (given closure amongst the set of ingredients). Genetic programming combines the expressive high-level symbolic representations of computer programs with the near-optimal efficiency of learning associated with Holland's genetic algorithm. A program that solves (or approximately solves) a given problem often emerges from this process.

As demonstrated in the book entitled *Genetic Programming II: Automatic Discovery of Reusable Programs*, by John R. Koza, Cambridge, Ma.: The MIT Press, 1994, genetic programming can evolve multi-part programs having a main program and one or more reusable, parameterized, hierarchically-called subprograms (called automatically defined functions or ADFs). See U.S. Pat. No. 5,343,554, entitled "A Non-Linear Genetic Process for Data Encoding and for Solving Problems Using Automatically Defined Functions", issued Aug. 30, 1994, by Koza, John R., and Rice, James P.

Architecture-altering operations, such as described in *Genetic Programming III: Darwinian Invention and Problem Solving* (1999), enable genetic programming to automatically determine the number of subroutines, the number of arguments that each possesses, and the nature of the hierarchical references, if any, among such automatically defined functions. Certain architecture-altering operations also enable genetic programming to automatically determine whether and how to use internal memory, iterations, and recursion in evolved programs. See U.S. Pat. No. 5,742,738, entitled "Simultaneous Evolution of the Architecture of a Multi-part Program to Solve a Problem Using Architecture Altering Operations," issued Apr. 21, 1998, by Koza, John R., Andre, David, and Tackett, Walter Alden.

Genetic programming may breed computer programs to solve problems by executing the following steps:

(1) Generate an initial population of random compositions of the functions and terminals of the problem (i.e., programs).
(2) Iteratively perform the following substeps (referred to herein as a generation) on the population until the termination criterion has been satisfied:
   (A) Execute each program in the population and assign it a fitness value using the fitness measure.
   (B) Create a new population of programs by applying the following operations. The operations are applied to program(s) selected from the population with a probability based on fitness (with reselection allowed).
      (i) Reproduction: Copy the selected program to the new population.
      (ii) Crossover: Create a new offspring program for the new population by recombining randomly chosen parts of two selected programs.
      (iii) Mutation: Create one new offspring program for the new population by randomly mutating a randomly chosen part of the selected program.
      (iv) Architecture-altering operations: Select an architecture-altering operation from the available repertoire of such operations and create one new offspring program for the new population by applying the selected architecture-altering operation to the selected program.
(3) Designate the individual program that is identified by result designation (e.g., the best-so-far individual) as the result of the run of genetic programming. This result may be a solution (or an approximate solution) to the problem.

Genetic programming conducts a search for a solution, or approximate solution, to a problem. It is preferable to hill climbing because hill-climbing operates on only a single entity (point) in the search space of the problem and because hill-climbing greedily unconditionally selects a better point in preference to a worse point. Because of this, hill climbing tends to become trapped on local optimum points that are not global optimum points. Simulated annealing also operates on a single entity (point) in the search space of the problem; however, simulated annealing is preferable to hill climbing because it typically uses the Metropolis algorithm and the Boltzmann equation to attempt to avoid becoming entrapped on locally optimum points.

Genetic programming is preferable to simulated annealing (which resembles a genetic algorithm operating on a population of size 1) because the existence of a population permits crossover (recombination) to occur between two (or more) parents, each chosen probabilistically based on their fitness. Experience indicates that the recombination of parts of already fit parents often yields superior offspring in a far more rapid way than that provided by search techniques that lack recombination.

Until recently, there has been no general technique for automatically creating the topology and sizing for an analog electrical circuit from a high-level statement of the circuit's desired behavior. However, see U.S. Pat. No. 5,867,397, entitled "Method and Apparatus for Automated Design of Complex Structures Using Genetic Programming," issued Feb. 2, 1999.

There has been extensive previous work on the problem of automating various aspects of the design of electrical circuits and other structures usmg simulated annealing, artificial intelligence, and other techniques, including genetic algorithms (Kruiskamp, Wim and Leenaerts, Domine, DARWIN: CMOS opamp synthesis by means of a genetic algorithm, *Proceedings of the 32$^{nd}$ Design Automation Conference*, New York, N.Y.: Association for Computing Machinery, 1995; Grimbleby, J. B., Automatic analogue network synthesis using genetic algorithms, *Proceedings of the First International Conference on Genetic Algorithms in Engineering Systems: Innovations and Applications*, London: Institution of Electrical Engineers, 1995; Thompson, Adrian, Silicon evolution, in Koza, John R., Goldberg, David E., Fogel, David B., and Riolo, Rick L. (editors), *Genetic Programming 1996: Proceedings of the First Annual Conference*, Cambridge, Ma.: MIT Press, 1996; Schnecke, V. and Vornberger, O. Genetic design of VLSI layouts. *Proceedings of the First International Conference on Genetic Algorithms in Engineering Systems: Innovations and Applications (GALESIA)*. London: Institution of Electrical Engineers. 1995). All of the existing techniques address only one or two of the four aspects (topology, sizing, placement, and routing) of circuit design. In addition, most of these techniques are limited to certain highly specialized types of circuits. Many of these techniques require the user to supply a reasonably good working circuit as a starting point (with the automated technique then merely adjusting the sizing of the components), while others involve choosing pre-established alternative subcircuits for preestablished places within a preestablished overall circuit design. Many of the techniques require repeated interactive intervention by the user. Generally, the decisions that are automated are only a small subset of the decisions that must be made.

Recently, a general technique using genetic programming has emerged for automatically creating the topology and sizing for an analog electrical circuit from a high-level statement of the circuit's desired behavior (Koza, John R., Bennett III, Forrest H., Andre, David, Keane, Martin A., and Dunlap, Frank, Automated synthesis of analog electrical circuits by means of genetic programming, *IEEE Transactions on Evolutionary Computation*, 1(2),1997. See U.S. Pat. No. 5,867,397, entitled "Method and Apparatus For Automated Design of Complex Structures Using Genetic Programming", issued Feb. 2, 1999).

The topology and sizing of numerous circuits have been automatically synthesized using genetic programming, including lowpass, highpass, bandpass, bandstop, crossover, multiple bandpass, and asymmetric bandpass filters, amplifiers, computational circuits, a temperature-sensing circuit, a voltage reference circuit, frequency-measuring circuits, and source identification circuits.

Genetic programming can be applied to circuit design by establishing a mapping between the rooted, point-labeled trees (i.e., acyclic graphs) with ordered branches used in genetic programming and the specialized type of line-labeled cyclic graphs germane to electrical circuits.

For electrical circuits, an embryo consisting of one (and sometime more) modifiable wires may be used as a starting point. The embryo may be embedded into a test fixture consisting of fixed (hard-wired) components (such as a source resistor and a load resistor) and certain fixed wires that provide connectivity to the circuit's external inputs and outputs. Until the modifiable wires of the embryo are modified by the developmental process, the initial circuit (e.g., the embryo and test fixture) produces only trivial output. A non-trivial electrical circuit is developed by progressively applying the functions in a circuit-constructing program tree (in the population being bred by genetic programming) to the modifiable wires of the original embryo and, during the developmental process, to newly created modifiable components and modifiable wires of the developing circuit.

Each branch of the program tree may be created in accordance with a constrained syntactic structure. Branches may be composed of construction-continuing subtrees that continue the developmental process and arithmetic-performing subtrees that determine the numerical value of components. Topology-modifying functions have one or more construction-continuing subtrees, but no arithmetic-performing subtree. Component-creating functions have one or more construction-continuing subtrees and typically have one arithmetic-performing subtree. This constrained syntactic structure is preserved using structure-preserving cross-over with point typing.

The foregoing method for automatically creating circuit topology and sizing does not address the problem of automatically placing and routing of components and wires at particular physical locations on a printed circuit board or silicon wafer.

References Cited

U.S. Patents

U.S. Pat. No. 4,697,242, "Adaptive Computing System Capable of Learning and Discovery", issued Sep. 29, 1987, Holland et al.

U.S. Pat. No. 4,881,178, "Method of Controlling a Classifier System," issued Nov. 14, 1989, Holland et al.

U.S. Pat. No. 4,935,877, "Non-Linear Genetic Algorithms for Solving Problems," issued Jun. 19, 1990, Koza.

U.S. Pat. No. 5,136,686, "Non-Linear Genetic Algorithms for Solving Problems by Finding a Fit Composition of Functions," issued Aug. 4, 1992, Koza.

U.S. Pat. No. 5,148,513, "A Non-Linear Genetic Process for Use with Plural Co-Evolving Populations," issued Sep. 15, 1992, Koza, John R., and Rice, James P.

U.S. Pat. No. 5,343,554, "A Non-Linear Genetic Process for Data Encoding and for Solving Problems Using Automatically Defined Functions," issued Aug. 30, 1994, Koza, John R., and Rice, James P.

U.S. Pat. No. 5,742,738, "Simultaneous Evolution of the Architecture of a Multi-part Program to Solve a Problem Using Architecture Altering Operations," issued Apr. 21, 1998, Koza, John R., Andre, David, and Tackett, Walter Alden.

U.S. Pat. No. 5,867,397, "Method and Apparatus for Automated Design of Complex Structures Using Genetic Programming", issued Feb. 2, 1999, Koza, John R., Bennett III, Forrest H., and Andre, David.

Other Publications

Grimbleby, J. B., Automatic analogue network synthesis using genetic algorithms. *Proceedings of the First International Conference on Genetic Algorithms in Engineering Systems: Innovations and Applications*. London: Institution of Electrical Engineers, 1995.

Holland, John H., *Adaptation in Natural and Artificial Systems: An Introductory Analysis with Applications to Biology, Control, and Artificial Intelligence*. Ann Arbor, Mich.: University of Michigan Press. Second edition. Cambridge, Ma.: The MIT Press, 1975.

Kirkpatrick, S., Gelatt, C. D., and Vecchi, M. P. 1983. Optimization by simulated annealing. *Science* 220, pages 671–680.

Koza, John R., *Genetic Programming: On the Programming of Computers by Means of Natural Selection*. Cambridge, Ma.: The MIT Press, 1992.

Koza, John R., *Genetic Programming II: Automatic Discovery of Reusable Programs*. Cambridge, Ma.: The MIT Press, 1994.

Kruiskamp, Wim and Leenaerts, Domine, DARWIN: CMOS opamp synthesis by means of a genetic algorithm. *Proceedings of the 32nd Design Automation Conference*. New York, N.Y.: Association for Computing Machinery, 1995.

Schnecke, V. and Vornberger, O. 1995. Genetic design of VLSI layouts. *Proceedings of the First International Conference on Genetic Algorithms in Engineering Systems: Innovations and Applications (GALESIA)*. London: Institution of Electrical Engineers, pages 430–435.

Sterling, Thomas L., Salmon, John, and Becker, Donald J., and Savarese, *How to Build a Beowulf: A Guide to Implementation and Application of PC Clusters*. Cambridge, Ma.: The MIT Press, 1999.

Thompson, Adrian, Silicon evolution. In Koza, John R., Goldberg, David E., Fogel, David B., and Riolo, Rick L. (editors), *Genetic Programming 1996: Proceedings of the First Annual Conference*. Cambridge, Ma.: MIT Press, 1996.

SUMMARY OF THE INVENTION

A method and apparatus for the automatic creation of the topology, component sizing, placement, and routing of complex structures, such as, but not limited to, analog and digital circuits. In one embodiment, the present invention operates with a system having a population of entities, of various sizes and shapes, in which the entities include constructing actions. An iterative process may be run to create a design of a structure that satisfies prespecified high-level design goals. In one embodiment, iteratively executing constructing actions in entities in the population results in the development of a structure that has components connected in a topological arrangement, where each component possesses a component value and occupies a particular physical location.

DESCRIPTION OF THE DRAWINGS

The present invention will be understood more fully from the detailed description given below and from the accompanying drawings of the preferred embodiments of the invention, which, however, should not be taken to limit the invention to the specific embodiments but are for explanation and understanding only.

DETAILED DESCRIPTION

Figure 1:
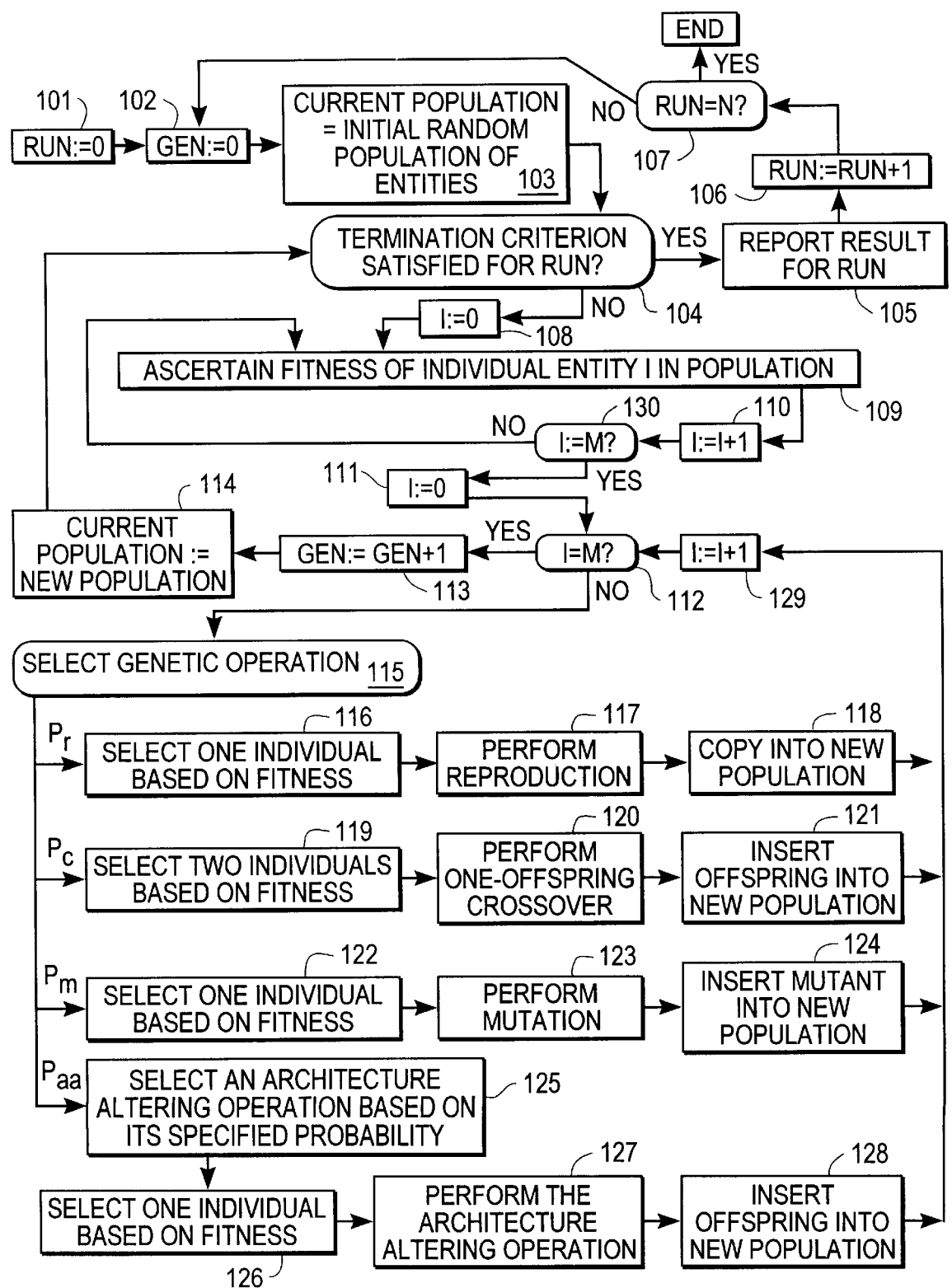
FIG. 1 is a flowchart of one embodiment of a process for genetic programming of electrical circuits.

A method and apparatus for the automatic synthesis, placement, and routing of complex structures (e.g., electrical circuits) is described. Although the present invention is described in terms of electrical circuits, the present invention may be used to design other complex structures such as physical structures, mechanical structures, or other complex structures having components that are interfaced with each other in accordance with a particular topological arrangement and that are sized, placed, and routed in terms of numerical parameters or other types of parameters.

In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations discussed. This apparatus may be specially constructed for the required purposes, or it may comprise a general purpose computer selectively activated or reconfigured by a computer program stored in the computer. The algorithms and displays presented here are not inherently related to any particular computer or other apparatus. Various general purpose machines may be used with programs in accordance with the teachings described, or it may prove convenient to construct a more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described here.

Overview

A process described herein provides for the automatic synthesis, placement, and routing of complex structures such as electrical circuits (e.g., analog circuits, digital circuits, etc.). The process also applies to other types of complex structures having components whose physical location affects the behavior of the structure. For example, in a mechanical system, the overall behavior of the system depends not only on the particular components (e.g., springs, masses, etc.) and the topological interconnections, but also on the actual physical location of the individual mechanical components. In one embodiment, the electrical circuits may comprise a wide variety of different types of components including, but not limited to, resistors, capacitors, inductors, diodes, transistors, and energy sources. The individual components are coupled in a particular "topology" to form a circuit. In addition, each component may be further specified ("sized") by a set of component values (e.g., numerical values). The individual components are placed at particular physical locations on a circuit board, silicon wafer, or other substrate, and wires are routed between the components. In one embodiment, the placement and routing is performed to reduce, or even minimize, the area for the circuit.

A circuit's components typically receive one or more input signals from one or more input sources and produce one or more output signals at one or more output ports. In one embodiment, circuits have at least one energy source (e.g., an incoming signal, a power supply, etc.). Thus, in one embodiment, an electrical circuit may be specified as to its topology, sizing, placement of all of its components (or a specification of the locations for placement with respect to some or all of the components), and the routing of wires between components.

A "circuit" includes (1) a set of components and (2) a set of wires between the interface points (leads) of the components. Each undirected wire indicates the existence of a connection between the interface point of one component and another interface point (typically the lead of another component).

In one embodiment, a "component" is an object that has a type, some number of component values that further specify the component, and some number of interface points. Consider, for example, a resistor. A resistor is a component because it is an object of the type "resistor;" it has a single numerical component value of its resistance (e.g., 1,000 Ohms) and it has two interface points (leads, ends). In addition, the resistor has a known size.

The interface points of a component may be operationally indistinguishable (as, for example, the two leads of a resistor) or they may be operationally different (as, for example, the collector, base, and emitter of a transistor).

Once the user specifies the design goals for the electronic circuit that is to be designed, the automated design process generates a complete design. This goal-driven automated design process creates the topology, sizing, placement, and routing of the electronic circuit.

FIG. 1 is a flowchart of one embodiment of a process for generating a complete design of a structure, such as a circuit, using genetic programming. The process is performed by processing logic that may comprise hardware, software or a combination of both. The process is performed on a population of entities (e.g., circuit-constructing program trees) that represent complex structures (e.g., a circuit). The initial population may be created in a variety of ways (e.g., randomly) or may be supplied to begin the process.

The methodology may be applied to many problems including the problem of designing analog electrical filter circuits. One such filter is a one-input, one-output electronic circuit that receives a signal as its input and passes the frequency components of the incoming signal that lie in a certain specified frequency range (the passband) while stopping the frequency components of the signal that lie in other frequency ranges (the stopband).

In the case where the complex structure is a circuit, genetic programming starts from a high-level statement of a circuit's desired behavior and automatically creates the design of the circuit's topology, component sizing, placement and routing. In one embodiment, genetic programming breeds a population of rooted, point-labeled trees (e.g., graphs without cycles) with ordered branches that specify how to develop (construct) the circuit.

Referring to FIG. 1, processing logic initializes variables indicating the current run (Run) and the current generation (Gen) to 0 (processing blocks 101 and 102). Processing logic also initializes the current population to an initial random population of entities (processing block 103).

After initialization, processing logic tests whether the termination criteria for the run have been satisfied (processing block 104). If the termination criteria has been met, processing logic reports the result of the run (processing block 105) and increments by one the variable Run (processing block 106). Thereafter, processing logic tests whether the variable representing the current run (Run) is equal to a predetermined number (processing block 107). If the value of Run is equal to the predetermined number, then the process ends; otherwise, processing transitions to processing block 102 in which the variable Gen is initialized to 0.

If the termination criteria has not been met, processing transitions to processing block 108 where a variable indicating the current entity in the population is initialized to 0. Processing logic ascertains the fitness of an individual entity in the population (processing block 109).

After ascertaining the fitness of an individual entity in the population, processing logic increments the variable I (processing block 110) and tests whether the value of variable I is equal to a predetermined value (processing block 130). If the value of variable I is not equal to the predetermined value M, then processing transitions to processing block 109. In one embodiment, an example value of M is 1,000. If the value of variable I is equal to the predetermined value M, then processing logic re-initializes the variable I to 0 (processing block 111) and then tests whether the variable I is equal to a predetermined value M (processing block 112). If the value of variable I is equal to the predetermined value M, then processing logic increments the generation variable Gen (processing block 113) and sets the variable Current Population to the new population (processing logic 114) and transitions to processing block 109.

If the variable I does not equal the predetermined value M, then processing transitions to processing block 115 where processing logic selects a genetic operation. Processing block may select one individual based on fitness (processing block 116), perform reproduction (processing block 117) and then copy the resulting entity into the population (processing block 118). Processing block may select two individuals based on fitness (processing block 119), perform one-offspring crossover (processing block 120) and then insert the offspring into the population (processing block 121). Processing block may select one individual based on fitness (processing block 122), perform mutation (processing block 123) and then insert the mutant into the new population (processing block 124). Processing block may select an architecture altering operation based on its specified probability (processing block 125), select one individual based on fitness (processing block 126), perform the architecture altering operation (processing block 127), and then insert the offspring into the new population (processing block 128).

After performing the genetic operation, processing block transitions to processing block 129 where the variable I is incremented by 1. Then processing logic transitions to processing block 112.

Some of the steps in the process described above and other processes described below are described in U.S. Pat.

No. 5,867,397, "Method and Apparatus for Automated Design of Complex Structures Using Genetic Programming", issued Feb. 2,1999, Koza, John R., Bennett III, Forrest H., and Andre, David, which is incorporated herein by reference.

Figure 1A:
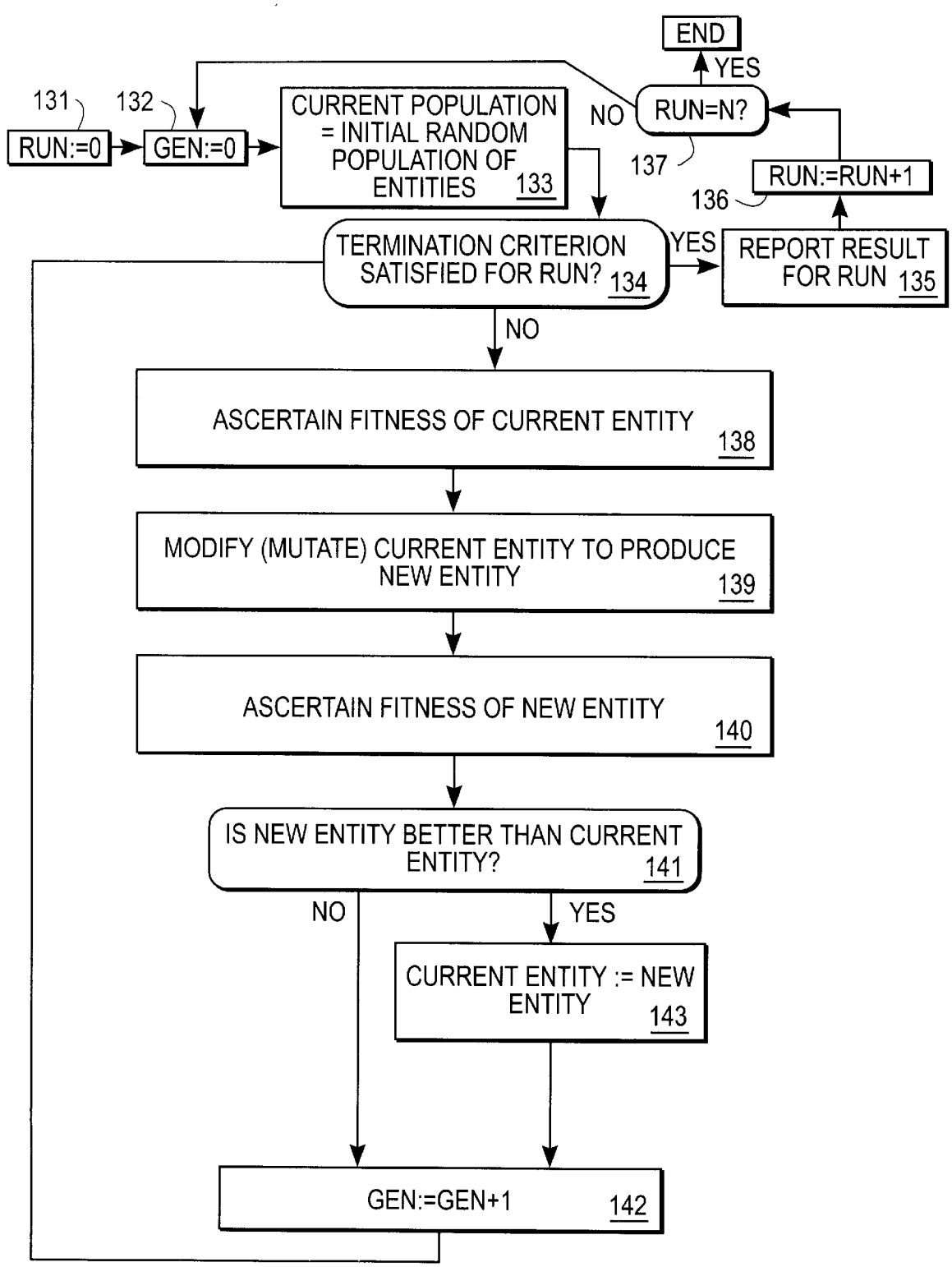
FIG. 1A is a flow chart of one embodiment of a process for performing hill climbing.

FIG. 1A is a flow chart of one embodiment of a process for performing hill climbing. Referring to FIG. 1A, processing logic initializes variables indicating the current run (Run) and the current generation (Gen) to 0 (processing blocks 131 and 132). Processing logic also initializes the current population to an initial entity (processing block 133).

After initialization, processing logic tests whether the termination criteria for the run have been satisfied (processing block 134). If the termination criteria has been met, processing logic reports the result of the run (processing block 135) and increments by one the variable Run (processing block 136). Thereafter, processing logic tests whether the variable representing the current run (Run) is equal to a predetermined number (processing block 137). If the value of Run is equal to the predetermined number, then the process ends; otherwise, processing transitions to processing block 132 in which the variable Gen is initialized to 0.

If the termination criteria has not been met, processing transitions to processing block 138 where processing logic ascertains the fitness of an individual entity in the population (processing block 139).

After ascertaining the fitness of an individual entity in the population, processing logic modifies (mutates) the current entity to produce a new entity (processing block 139) and ascertains the fitness of the new entity (processing block 140).

Next, processing logic tests whether the new entity is better than the current entity (processing block 141). If the new entity is not better than the current entity, then processing transitions to processing block 142 where the variable Gen is incremented by 1. If the new entity is better than the current entity, then the current entity variable is reset to the new entity (processing block 143) and processing transitions to processing block 142. After incrementing the variable Gen, processing transitions to processing block 134.

Specifically, suppose that the fitness of the current entity is $f_c$ and the fitness of the new entity is $f_n$. Suppose that the new entity is worse than the current entity (i.e., the new entity is not an improvement). Given the convention that low values of fitness are better, $f_n-f_c$ is positive and the Boltzmann equation assigns a probability of e raised to the power of $-(f_n-f_c)/kT$, where k is the Boltzmann constant and T is the temperature of the current generation. If $f_n-f_c$ is positive, then the probability is a negative power of e, namely a positive value less than 1.

If the temperature T is high (as it usually is at early generations of a run of simulated annealing), almost any non-improving new entity will be accepted since the Boltzmann equation will yield a probability near 1.0. If the temperature T is low (as it usually is later in a run of simulated annealing), then it will be unlikely that a non-improving new entity will be accepted. If the difference $f_n-f_c$ is large (and positive), then it will be less likely that a non-improving entity will be accepted, whereas if the difference $f_n-f_c$ small (and positive), then there is a good chance of acceptance of a non-improving entity (i.e., non-greedy choice will be made).

Figure 1B:
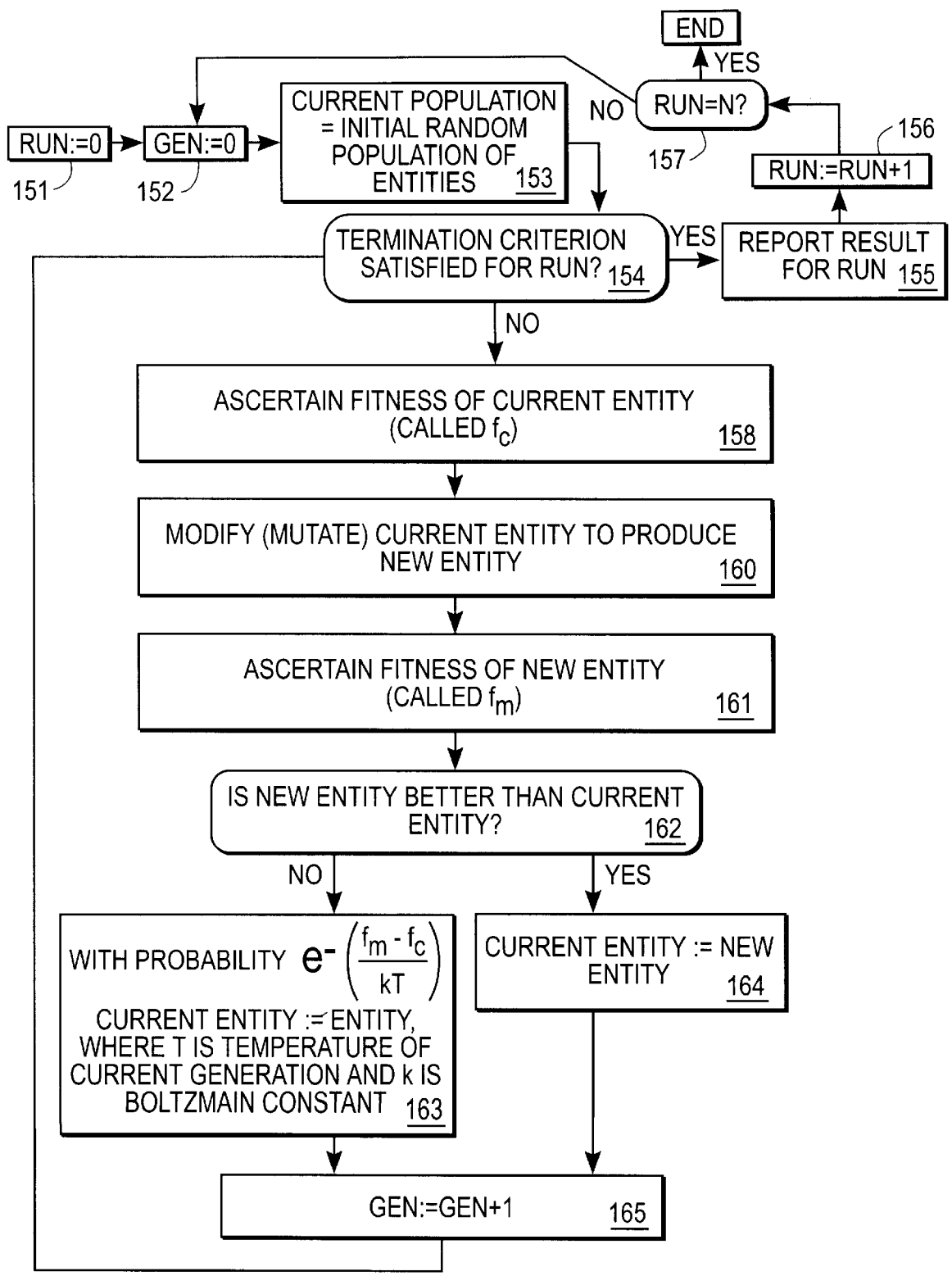
FIG. 1B is a flow chart of one embodiment of a process for performing simulated annealing.

FIG. 1B is a flow chart of one embodiment of a process for performing simulated annealing. Referring to FIG. 1B, processing logic initializes variables indicating the current run (Run) and the current generation (Gen) to 0 (processing blocks 151 and 152). Processing logic also initializes the current population to an initial entity.

After initialization, processing logic tests whether the termination criteria for the run have been satisfied (processing block 154). If the termination criteria has been met, processing logic reports the result of the run (processing block 155) and increments by one the variable Run (processing block 156). Thereafter, processing logic tests whether the variable representing the current run (Run) is equal to a predetermined number (processing block 157). If the value of Run is equal to the predetermined number, then the process ends; otherwise, processing transitions to processing block 152 in which the variable Gen is initialized to 0.

If the termination criteria has not been met, processing transitions to processing block 158 where processing logic ascertains the fitness of an individual entity in the population.

After ascertaining the fitness of an individual entity in the population, processing logic modifies (mutates) the current entity to produce a new entity (processing block 160) and ascertains the fitness of the new entity (processing block 161).

Next, processing logic tests whether the new entity is better than the current entity (processing block 162). If the new entity is not better than the current entity, then processing logic sets the current entity to the new entity probabalistically as described below and then transitions to processing block 163 where the variable Gen is incremented by 1. If the new entity is better than the current entity, then the current entity variable is reset to the new entity (processing block 164) and processing transitions to processing block 165. After incrementing the variable Gen, processing transitions to processing block 166 and thereafter to processing block 154.

Figure 2:
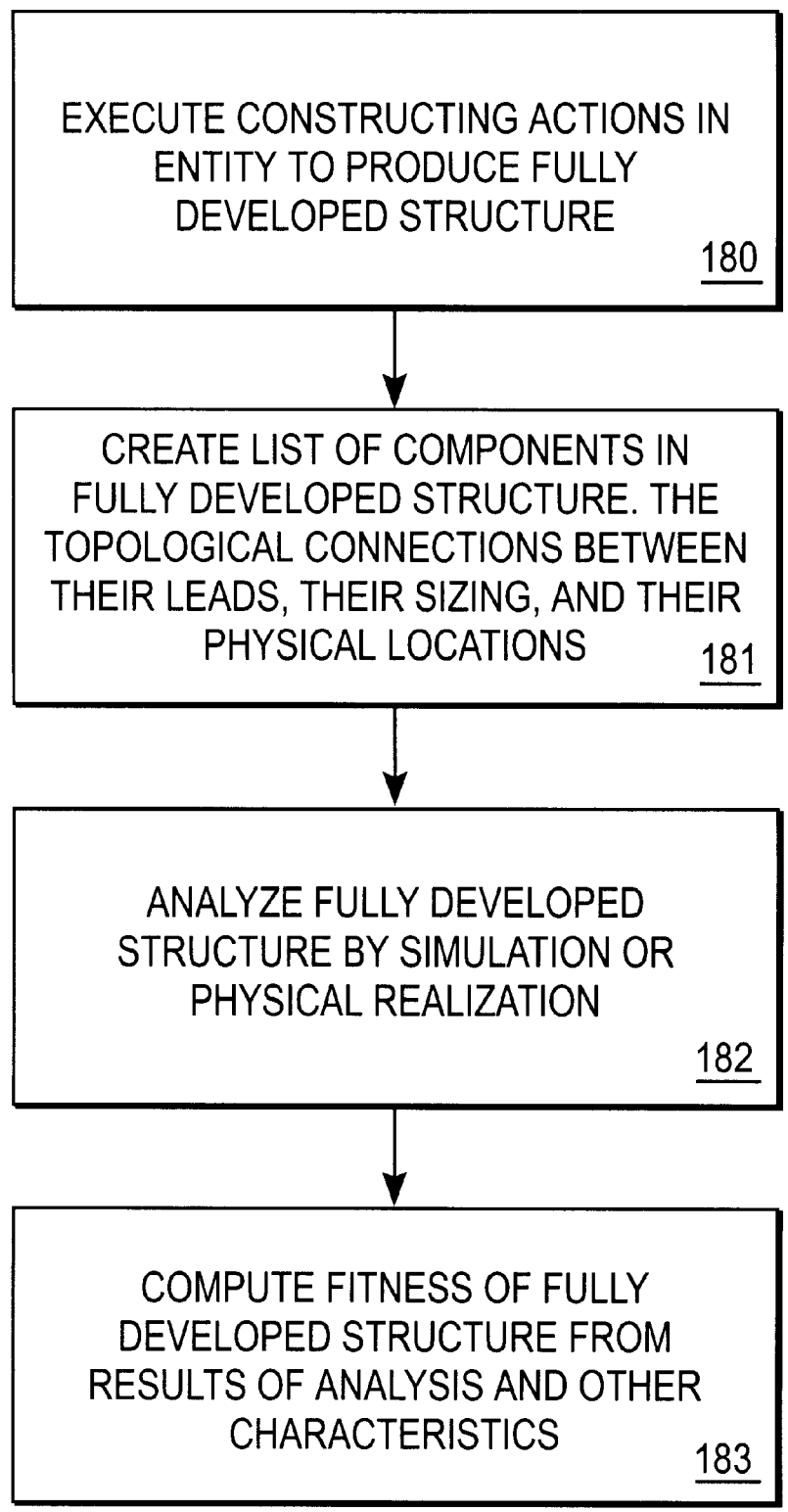
FIG. 2 is a flow chart of one embodiment of a process for ascertaining fitness of a new entity.

FIG. 2 is a flow chart of one embodiment of a process for ascertaining fitness of a new entity. Referring to FIG. 2, the process for ascertaining fitness to an individual entity begins by processing logic executing constructing actions in the entity to produce a fully developed structure (processing block 180). Then processing logic creates a list of components in the fully developed structure, the topological connections between their leads, their sizing, and their physical locations (processing block 181). Next, processing logic analyzes the fully developed structure by simulation or physical realization (processing block 182) and then computes the fitness of the fully developed structure from results of analysis and other characteristics (processing block 183).

Electrical circuits are not trees, but, instead, are cyclic graphs. In fact, electrical circuits are cyclic graphs in which lines belong to a cycle (e.g., there are no loose wires or dangling components). Alternatively, electric circuits may be described using loose wires or dangling components that belong to the graphs that produce graphs that are cyclic in nature. Moreover, the lines of a graph that represents an electrical circuit are each labeled. Usually there are multiple labels on each line. The primary label on each line may provide the type of an electrical component (e.g., a wire, resistor, capacitor, etc.). The secondary label on each line may provide the value(s) of the component (with the exception of the components that do not carry any component value, such as diodes). A single numerical value is sufficient to specify many components (e.g., resistors, capacitors, and inductors). Multiple values are required to specify other components (e.g., the frequency and peak voltage of a sinusoidal wave source). Many components in electrical circuits have a polarity (e.g., diodes) or orientation or distinction of their leads (e.g., the collector, base, and emitter of a transistor). Electrical circuits may have at least one energy source (e.g., an incoming signal or an internal power source). Some component values are non-numerical, such as whether an energy source is "AC" or "DC." In addition, a group of component values may be conveniently specified by referring to a "model" that provides numerous values that are applicable to a component. For example, complicated components, such as transistors and diodes, are described by extensive models.

In one embodiment, the developmental growth process begins with a very simple, essentially useless, initial electrical circuit. Although in alternative embodiments, more sophisticated or useful initial circuits could be used. In addition to this initial circuit, there is a program tree of the type ordinarily used in genetic programming. The electrical circuit is then developed as the functions in the program tree are executed and progressively applied to the initial circuit (and its successors). The functions in the program tree manipulate the initial circuit (and its successors). The final result of this developmental process is a circuit that is described by the topology of the circuit, the sizing of all of its components, the placement of its components at particular physical locations on the circuit, and the routing of its wires between the components. FIG. 1 illustrates one embodiment of the process for automated design of electrical circuits and will be described in more detail below.

In one embodiment, the design that results from the process may be fed, directly or indirectly, into a machine or apparatus that implements or constructs the actual structure. Such machines and their construction are well-known in the art. For example, electrical circuits may be made using well-known semiconductor processing techniques based on a design, and/or place and route tools. Programmable devices, such as a field-programmable gate array (FPGA) or field-programmable analog array (FPAA), may be programmed using tools responsive to netlists, etc.

In one embodiment, an electrical circuit is created by executing the functions in a circuit-constructing program tree. In one embodiment, the functions are progressively applied in a developmental process to an initial circuit consisting of an embryo and test fixture and its successors until all of the functions in the program tree are executed. That is, the functions in the circuit-constructing program tree progressively side-effect the embryo and its successors until a fully developed circuit eventually emerges. In one embodiment, the functions are applied in a breadth-first order.

In one embodiment, the functions in the circuit-constructing program trees are divided into five categories: (1) topology-modifying functions that alter the circuit topology, (2) component-creating functions that insert components into the circuit, (3) development-controlling functions that control the development process by which the embryo and its successors is changed into a fully developed circuit, (4) value-setting subtrees that appear in subtrees as argument(s) to the component-creating functions and specify the numerical value of the component, and (5) automatically defined functions that appear in the function-defining branches and potentially enable certain substructures of the circuit to be reused (with parameterization).

The above functions in the circuit-constructing program trees may be referred to as "constructing actions". In one embodiment, the cumulative effect of the execution of such constructing actions is to construct a fully developed circuit starting from an initial circuit consisting of an embryo and test fixture.

Constrained Syntactic Structure of the Program Trees in the Population

In one embodiment, each branch of the program tree is created in accordance with a constrained syntactic structure (strong typing). Each branch includes topology-modifying functions, component-creating functions, development-controlling functions, and terminals. Component-creating functions typically have one arithmetic-performing subtree, while topology-modifying functions and development-controlling functions do not. Component-creating functions and topology-modifying functions are internal points on branches and possess one or more arguments (construction-continuing subtrees). The constrained syntactic structure is preserved using structure-preserving crossover with point typing.

In one embodiment, both the random program trees in the initial population (generation 0) and any random subtrees created by the mutation operation in later generations are created so as to conform to the constrained syntactic structure.

Example of a One-Input, One-Output Initial Circuit

In one embodiment, each program tree in the population creates one electrical circuit from an initial circuit that includes an embryo and a test fixture. The initial circuit used on a particular problem depends on the number of input signals and the number of output signals (e.g., probe points) for the design. It may also incorporate certain fixed components that are required or desired for the circuit being designed. All the wires and components of the initial circuit are initially located at specified physical locations on a printed circuit board, silicon wafer, or other substrate. The printed circuit board, silicon wafer or substrate has a fixed number of layers that are available for components (usually one for a silicon wafer and one or two for a printed circuit board) and a fixed number of layers that are available for wires.

In one embodiment, the embryo is an electrical substructure that contains at least one modifiable wire. An embryo may have one or more ports that enable it to be embedded into a test fixture. In one embodiment, the test fixture contains one input signal, one probe point, a fixed source resistor, and a fixed load resistor. In the initial circuit, each modifiable wire initially possesses a writing head. The writing head indicates that the wire (or component) may be modified. In one embodiment, the test fixture is a fixed (hard-wired) substructure composed of non-modifiable wires and non-modifiable electrical components. The test fixture provides access to the circuit's external input(s) and permits probing of the circuit's output. In one embodiment, a test fixture has one or more ports that enable an embryo to be embedded into it.

A circuit is developed by modifying the component to which a writing head is pointing in accordance with the functions in the circuit-constructing program tree. Each component-creating, topology-modifying, and development-controlling function in the program tree modifies an associated highlighted component in the developing circuit in a particular way and specifies the future disposition of successor writing head(s), if any.

In the description that follows, the location of components, wires, and leads in a circuit may be indicated by a Cartesian pair (X, Y). In one embodiment, the positions of the wires and components of the circuit are at specified physical locations on a printed circuit board, silicon wafer, or other substrate. The origin of the positions is at the lower left relative position of the printed circuit board or wafer. The first coordinate of the physical location indicates the position in the X direction (left to right) relative to the origin and the second coordinate indicates the position in the Y direction (bottom to top) relative to the origin. All locations may change during the development process. The (X, Y) pair position given for components indicates the center of the component.

Figure 3:
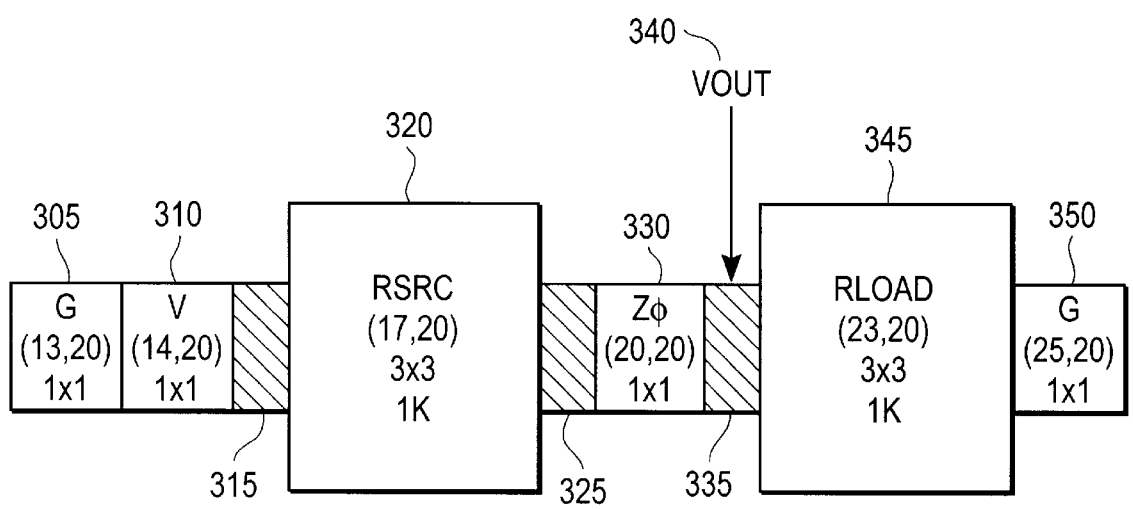
FIG. 3 illustrates one embodiment of a one-input, one-output initial electrical circuit composed of an embryo and test fixture.

FIG. 3 illustrates one embodiment of a one-input, one-output initial circuit. Referring to FIG. 3, the initial circuit includes a first ground 305, source V 310, non-modifiable wires 315, 325, and 335, 1000-Ohm fixed source resistor 320 (RSRC), 1000-Ohm fixed load resistor 345 (RLOAD), ground 350, voltage probe VOUT 340, and modifiable wire Z0 (330). In one embodiment, all development originates from the modifiable wire Z0 (330). All the other elements of this initial circuit constitute the test fixture. In one embodiment, each of the two resistors occupy a three-by-three (3×3) area while all the other elements of this initial circuit each occupy a one-by-one (1'1) area. The three-by-three size of the resistors are purely illustrative. In general, components may be of any specified size. Each element has a particular physical location, indicated by its (X,Y) position, in the initial circuit. For example, the position of the 1×1 ground point G (305) is at (13, 20), the position of the center of the 3×3 source resistor RSRC (320) is at (17,20), and the position of the 1×1 modifiable wire Z0 (330) is at (20,20). All elements typically change positions multiple times during the developmental process.

In the discussion herein, the term "end" or "lead" or "interface" may be used to describe the places at which a component becomes connected (coupled) to other components in the overall circuit structure.

The initial circuit embodies little domain knowledge of the desired end circuit. In one embodiment, the initial circuit has one modifiable wire between the output and the source. A human designer may find it advantageous to apply his or her domain knowledge of a particular field to create the initial circuit for a particular problem. Such knowledge would bias the search for a satisfactory design in the direction of particular known or desirable characteristic. Also, some design problems call for the inclusion of particular components (possibly arranged in particular ways) as a part of the overall design. Such components may, if desired, be built into the test fixture (non-modifiable part) of the initial circuit.

In one embodiment, the same initial circuit is used as a starting point for the development for all individual program trees in the population. That is, there is a common initial circuit that is the starting point for the developmental process for each individual program tree in the population. In one embodiment, the individual entity in the population is the program tree. When an individual entity in the population is traversed, the traversal includes applying the constructing actions of the program tree contained in the particular individual entity to the common initial circuit. In alternate embodiments, a run may begin with a different initial circuits.

Alternatively, it may be advantageous to co-evolve a pair of entities that includes the initial circuit and the program tree. That is, each entity in the population has a pair that includes of an initial circuit and a program tree. When an individual entity in the population is traversed, the traversal includes applying the constructing actions of the program tree to the particular initial circuit contained in the same individual entity. In one embodiment, the evolutionary process favors those entities in the population whose initial circuit and program trees, when acting in conjunction with one another, better satisfy the design goals of the problem.

It is not necessary to have an initial circuit. Instead, the set of circuit-constructing functions may contain functions that build the entire circuit. However, a useful circuit requires certain minimum essential features (e.g., access to the incoming signal, inclusion of a ground, inclusion of a probe point, etc.). If these essential features are not built into the initial circuit, many individual circuits would lack, for example, any incoming signal source (and hence achieve poor scores in terms of satisfying the design goals of a problem). Evolving such essential features requires the expenditure of additional effort. Thus, in one embodiment, these minimal features are provided, in advance, in the form of the initial circuit.

The initial circuit conforms with the requirement of one embodiment that wires cannot cross on a particular layer of a silicon chip or on a particular side of a printed circuit board or other substrate and with the requirement of one embodiment that there be a wire connecting 100% of the leads. Each of the component creating and topology modifying functions preserves compliance with these two mandatory requirements for successful placement and routing so any sequence of such functions yields a fully laid out circuit that complies with these two requirements.

Component-Creating Functions

In one embodiment, each individual circuit-constructing program tree in the population generally contains component-creating functions, topology-modifying functions, and development-controlling functions.

Components are inserted into the topology of a circuit by the component-creating functions. A component acquires its sizing from the value-setting argument(s) of its component-creating function. The value-setting argument(s) may be an arithmetic-performing subtree (described in more detail below) or other mechanism for representing a value (e.g., a number). Each component-creating function in a program tree points to a highlighted modifiable wire or modifiable component (e.g., a component with a writing head) in the developing circuit. Each component-creating function in a program tree modifies the highlighted component or wire in a well-defined way. In one embodiment, each component-creating function spawns one or more writing heads (through its construction-continuing subtrees).

In one embodiment, each component-creating function leaves the number of lines impinging at any one node in the circuit at either two or three. However, this is not a requirement.

Some of the component-creating functions are context-free and some are context-sensitive. When a component-creating function is context-free, the outcome depends only on the single highlighted component or wire (e.g., the component or wire with the writing head). When a component-creating function is context-sensitive, the outcome depends not solely upon the single highlighted component or wire, but also upon other nearby elements of the circuit structure. In one embodiment, the creation of complex structures resulting from the execution of context-sensitive functions is supported as well as from the execution of context-free functions.

The construction-continuing subtree(s) of each component-creating function points to a successor function(s) in the circuit-constructing program tree.

The value(s), if any, of an inserted component is established by value-setting arguments to the component-creating function. Two approaches may be used typically for this purpose.

In one embodiment, the value of a component is established by way of an arithmetic-performing subtree. The arithmetic-performing subtree(s) of the component-creating functions contains a composition of arithmetic functions (addition and subtraction) and random constants (in the range −1.000 to +1.000). The arithmetic-performing subtree returns a floating-point value. During the breadth-first traversal of the circuit-constructing program tree, arithmetic-performing subtrees are completely traversed in depth first order.

The arithmetic-performing subtree(s) of the component-creating functions are compositions of arithmetic-performing functions and floating point random constants (denoted by "R"). In particular, "R" represents floating-point random constants between −1.000 and +1.000.

In one embodiment, multiplication and division (and other functions, such as exponential and logarithmic functions) are not included in the set of arithmetic-performing functions because the floating-point value returned by an arithmetic-performing subtree is interpreted on a logarithmic scale. However, other arithmetic-performing functions may be added if desired or required by a particular application.

In one embodiment, the functions in arithmetic-performing subtrees are executed in depth-first order (in accordance with programming languages such as LISP).

Automatically defined functions, such as ADF0, and their dummy variables (formal parameters), such as ARG0, are discussed below. They may or may not be used on a particular problem and they may or may not be used in arithmetic-performing subtrees.

Figure 13:
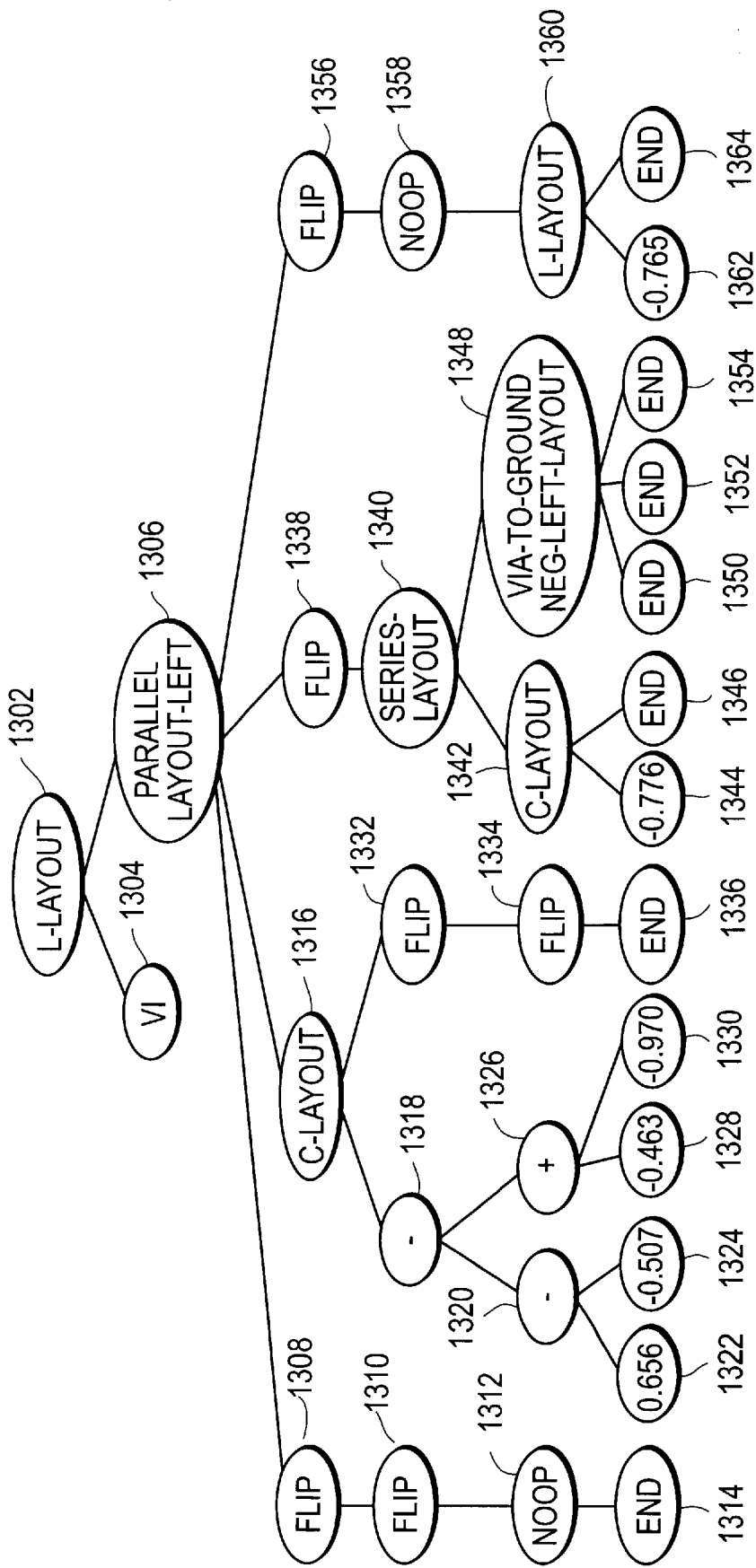
FIG. 13 illustrates a circuit-constructing program tree for the best circuit of generation 0 for one run of the illustrative lowpass filter problem.

FIG. 13 shows an arithmetic-performing subtree consisting of seven points. The subtree is rooted at the subtraction function 1318 and contains another subtraction function 1320 and an addition function 1326. The subtree also contains four floating-point numerical constants (1322, 1324, 1328, and 1330). The execution of this seven-point subtree returns a particular numerical value that is used by the component-creating C-LAYOUT function 1316 to determine the numerical value in Farads of the capacitor that is being inserted into the developing circuit. FIG. 13 also contains one-point arithmetic-performing subtrees at 1344 and 1362 as well as one very large arithmetic-performing subtree that is abbreviated as V1 at 1304.

When arithmetic-performing subtrees are used to establish the value of a component, the subtree may be subjected to modification during the run of genetic programming by the genetic operations of crossover and mutation. When performing the crossover operation on arithmetic-performing subtrees and when the crossover point of the first parent is in an arithmetic-performing subtree, then the choice of crossover points in the second parent is restricted to an arithmetic-performing subtree of the second parent. When performing the mutation operation on arithmetic-performing subtrees, a new subtree is created at the chosen mutation point with the arithmetic-performing subtree. In one embodiment, the new subtree is randomly created using the same random growth method that may be used in creating arithmetic-performing subtrees in the initial random generation of the run of genetic programming.

In another embodiment, the value of a component is established by use of a value-setting argument of the component-creating function. The value-setting argument includes a numerical component value. Such value-setting numerical arguments are subjected to modification during the run of genetic programming by a special mutation operation that operates only on such value-setting numerical arguments. This mutation operation perturbs the existing numerical value by a relatively small amount determined probabilistically by a Gaussian probability distribution. The existing to-be-perturned value is considered to be the mean of the Gaussian distribution. A relatively small preset parameter establishes the standard deviation of the Gaussian distribution. This approach has the advantage of changing numerical component values by a relatively small amount and searching the space of possible component value most thoroughly in the immediate neighbor of the value of the existing value.

Regardless of which of the above two approaches is used to modify component values during the run of genetic programming, it is desirable to interpret the value returned by the value-setting argument of a component-creating function so that it yields a value that is reasonable and practical for the type of circuit involved.

Typical values of components in electrical circuits span a range of many orders of magnitude. Therefore, it is useful to view component values on a logarithmic scale. In one embodiment, the floating-point value returned by value-setting argument of a component creating function is interpreted as the value for the component in a range of 11 orders of magnitude using a unit of measure that is appropriate for the particular type of component involved. In one embodiment, the value setting argument may be a floating-point value which is, in turn, interpreted as the value of the component in the following way: if the return value is between −5.0 and +5.0, the valuable U is set to the value returned by the subtree. If the return value is less than −100.0 or greater than +100, U is set to zero. If the return value is between −100 and −5.0, U is found from the straight line connecting the points (−100, 0) and (−5, −5). If the return value is between +5.0 and +100, U is found from the straight line connecting (5,5) and (100, 0). The value of the component is $10^U$ in a unit that is appropriate for the type of component. This mapping gives the component a value that is centered on an appropriate or predetermined value that was determined upon after examining a large number of practical circuits in contemporary electrical engineering books. In alternate embodiments, different methods of interpretation may be used for certain specialized categories of applications (e.g., where more extreme values are commonly needed).

If a component (e.g., a diode) has no numerical values, there is no left subtree (arithmetic argument). If more than one numerical value is required to describe the component, the component-creating function possesses multiple value-setting arguments. For example, the complete specification of an independent alternating current sinusoidal voltage source may require five numerical components, namely the amplitude of the voltage source, its frequency, its offset voltage, its time delay, and its damping factor. A component may require additional numerical component values in situations where it is necessary to specify the initial condition of the component (e.g., the initial voltage on a capacitor, the initial current on an inductor, or the initial voltage on a transistor in certain oscillator circuits).

The C-LAYOUT Function

In one embodiment, the two-argument C-LAYOUT function causes a highlighted modifiable component or modifiable wire to be changed into a capacitor.

Figure 4:
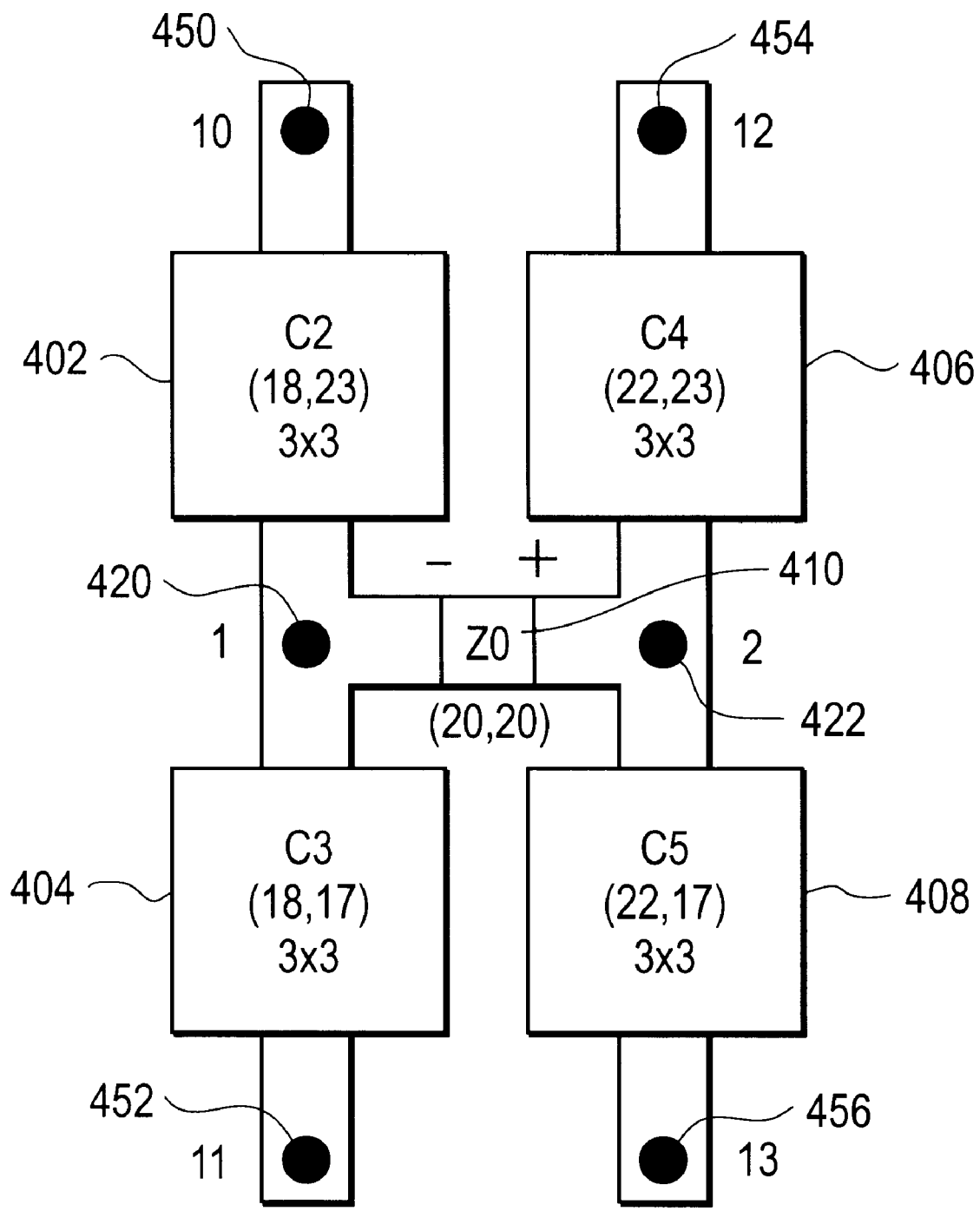
FIG. 4 illustrates a partial circuit containing a modifiable wire Z0.

FIG. 4 illustrates a partial circuit with modifiable wire Z0 (410) connecting nodes 1 (420) and 2 (422). The partial circuit also contains four capacitors (402, 404, 406, and 408). Modifiable wire Z0 (410) possesses a writing head and is initially located at relative position (20, 20).

Figure 5:
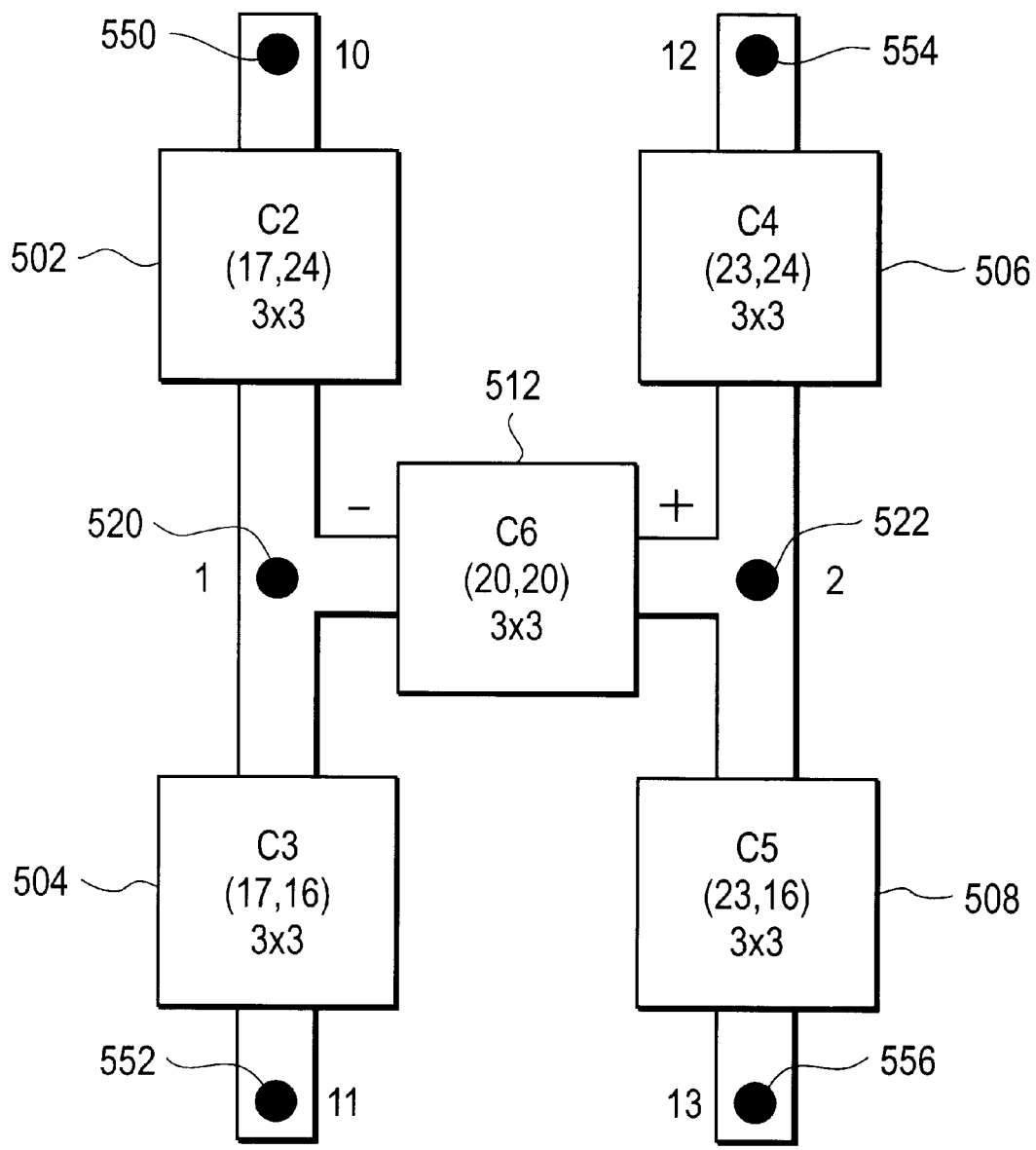
FIG. 5 illustrates a partial circuit containing a modifiable capacitor C6 and is the result of applying a capacitor-creating C-LAYOUT function to the modifiable wire of FIG. 4.

FIG. 5 shows the result of applying the C-LAYOUT function to the modifiable wire Z0 (410) of FIG. 4, thereby creating a capacitor C6 (512) connecting nodes 1 (520) and 2 (522) in place of the modifiable wire Z0 (410) of FIG. 4. Note that the polarity of the capacitor matches that of the modifiable wire that it replaces.

Capacitors occupy a certain amount of area (3×3 in the examples herein). Because the 3×3 capacitor C6 (512) of FIG. 5 is larger than that which it replaced (e.g., the 1×1 modifiable wire Z0 of FIG. 4), the locations of the various other pre-existing components C2 (402) and C3 (404) of FIG. 4 are affected by the insertion of this new capacitor C6. In this example, capacitor C2 (402 in FIG. 4) is moved from (18,23) in FIG. 4 to (17, 24) in FIG. 5. Similarly, capacitor C3 (404 in FIG. 4) is moved from (18,17) to (17,16) in FIG. 5. Similarly, capacitors C4 and C5 of FIG. 4 are moved in order to make room of the new capacitor C6 in FIG. 5. The method for accomplishing this relative movement of components is discussed in additional detail in reference to FIG. 12.

The value of a component is specified by the value-setting argument of the component-creating function that created the component. In one embodiment, the value of the capacitor is the antilogarithm (base 10) of the intermediate value (U) in nano-Farads (nF).

The netlist for a circuit is a list that identifies each component of the circuit, the nodes to which that component is connected, and the value of that component. In one embodiment, the netlist for the circuit is not created until the circuit is fully developed. The process described herein is intended to automatically synthesize (create) the topology, sizing, placement, and routing of a circuit that satisfies user-specified high-level requirements. The user may choose to use the automatically created information about the physical location of each component and wires into two distinct ways.

First, placement and routing are themselves difficult tasks in the process of designing electrical circuits. The user may use the automatically created information about exact physical location of each component (i.e., the placement of the components) on the printed circuit board, silicon wafer, or other substrate and the exact physical location of each connecting wire between circuit's components (i.e., the routing of the wires) on the printed circuit board, silicon wafer, or other substrate for the limited (but important) purpose of automatically generating an acceptable placement and routing (layout) of the components and wires. If the user is using the automatically created information for the limited purpose of generating an acceptable placement and routing (layout) of the circuit, then the netlist may be passed, in one embodiment, to a circuit simulator (such as SPICE) is order to determine the circuit's behavior without regard to the physical location of the circuit's components and wires.

Second, the exact physical location of each component and wire affects the overall behavior of all circuits to some extent. Physical location is important because electrical components subtly interact with one another based on their physical location. These interactions, called parasitic effects, are generally small and may not be important to the performance of simple circuits operating in non-challenging regimes. However, parasitic effects may crucially affect the performance of a circuit operating, say, at radio frequencies (RF). For many operating regimes, it is impossible to design an acceptable and practical circuit without considering parasitic effects. If the physical location of components and wires is considered relevant to determining the behavior of the circuit, the user may pass the netlist (with the added information about the physical location of the components) to a commercially available simulator that considers such information as part of its simulation. For example, Hewlett-Packard of Palo Alto, Calif., markets a simulator for radio frequency (RF) circuits composed of capacitors, inductors, and resistors that considers the physical location of the components and wires in determining the circuit's overall behavior. Alternately, there is a commercially available tool (one of which is called MAGIC from the University of California at Berkeley and one of which is available from Advanced Microelectronics of Ridgeland, Mass. that takes, as its input, a netlist (with information about the physical location of the components) and that produces a new (and expanded) netlist that contains additional components that represent the parasitic effects of each of the original components. The expanded netlist may then be supplied as input to a circuit simulator such as SPICE. In both approaches, the result is a simulation of the circuit that considers the effect of the physical location of the circuit's components and wires.

Circuit simulators are not required to implement the present invention. It is also possible to determine the behavior of a circuit by embedding it in evolvable hardware, such as field-programmable analog arrays (FPAA's).

In any event, the single wire Z0 in the partial circuit of FIG. 4 could be represented as the following single line:

Z0 422 420

The interpretation of this line of the netlist is that there is a component called Z0 (410) that is connected between node 2 (422) and node 1 (420) of the circuit. The positive end of the component is connected to node 2 (422), while the negative end is connected to node 1 (420). By convention, the node of the positive end of the component is the first in the list, although this is not a requirement.

The effect of the C-LAYOUT function creating capacitor C6 (512) is to change this single line into following:

C6 422 420 X Ohms

The interpretation of this line of the netlist is that there is a capacitor called C6 (512) that is connected between node 2 (422) and node 1 (420) of the circuit and that this component has a value of X Ohms. The first-listed node in a netlist is the node connected to the positive end of the capacitor C6 (512).

As previously mentioned, the C-LAYOUT function, in the embodiment described above, possesses two arguments. The first argument is the value-setting subtree that establishes (after interpretation) the value of the newly inserted capacitor. The second argument of the C-LAYOUT function is a construction-continuing subtree that passes control of the developmental process on to the successor subtree of the overall circuit-constructing program tree. A construction-continuing subtree corresponds to the passing along of a writing head. The L-LAYOUT function (described below) similarly has one such construction-continuing subtree. Some of the topology-modifying functions (described below) have more than one construction-continuing subtree. In contrast, the development-controlling END function (described below) appears at the endpoints (leaves) of circuit-constructing program trees and does not have any construction-continuing subtree.

The above approach to the capacitor-creating function has proved to be workable. However, the capacitor-creating function (and the other component-creating functions described herein) may be implemented in many additional ways that are consistent with the spirit of the present invention.

In the embodiment described above, a writing head is assigned to the newly created component. In an alternate embodiment, the component-creating functions (e.g., the C-LAYOUT function described above) may be defined so that that new component thereafter always remains in the circuit once a wire is converted into a component. That is, there is no construction-continuing subtree.

The L-LAYOUT Function

In one embodiment, the two-argument L-LAYOUT ("inductor") function causes the highlighted modifiable component or modifiable wire to be changed into an inductor. This function operates in a manner similar to that described for the C-LAYOUT function. In one embodiment, the value of the inductor is the antilogarithm base 10) of the intermediate value U in micro-Henrys, specified by the arithmetic-performing subtree (first argument). Inductors occupy a certain amount of area (3×3 in the samples herein).

The LAYOUT-CMOS-TRANSISTOR Function

Figure 6:
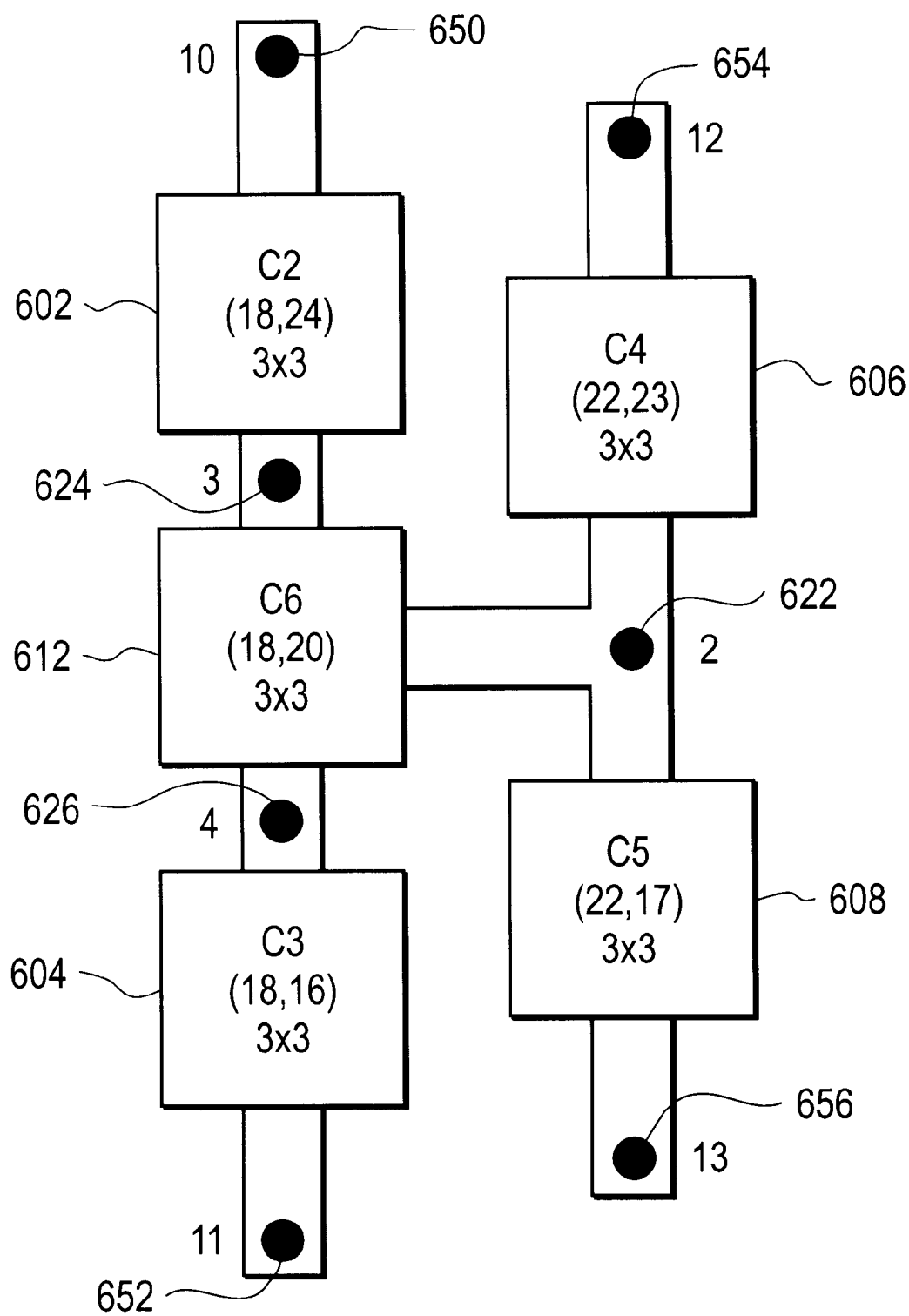
FIG. 6 illustrates the result of applying a transistor-creating LAYOUT-CMOS-TRANSISTOR function to the modifiable wire Z0 of FIG. 4.

In one embodiment, the one-argument LAYOUT-CMOS-TRANSISTOR function replaces the highlighted component with a bipolar junction transistor (BJT). FIG. 6 illustrates the partial circuit created by applying the LAYOUT-CMOS-TRANSISTOR function to the modifiable wire Z0 (410) of FIG. 4. The newly created transistor Q6 (612) occupies a 3×3 area centered at location (18,20). Because 3×3 transistor Q6 (612) is larger than that which it replaced (i.e., modifiable wire Z0), the locations of the pre-existing components C2 (602) and C3 (604) are affected. In this example, capacitor C2 (602) is moved from (18,23) to (18,24) (in the positive Y direction) and capacitor C3 (604) is moved from (18,17) to (18,16) (in the negative Y direction). The movement of the components is discussed in reference to FIG. 12.

The NON-MODIFIABLE-WIRE-LAYOUT Function

In one embodiment, wires can be treated as components. In this approach, the two-argument NON-MODIFIABLE-WIRE-LAYOUT function causes the highlighted modifiable component or modifiable wire to be changed into a specified length of nonmodifiable wire. The first argument of this function specifies the length of wire to be laid down. The second argument is the construction-continuing subtree.

Subcircuit Definitions in SPICE

Subcircuit definitions may be included among the component-creating functions. Subcircuits permit combinations of components to be defined once and then included in the netlist of a circuit. Subcircuit definitions define components that will be treated as if they were primitive components for the circuit to be designed. They are defined prior to the run of genetic programming. They are treated just like all other components (e.g., resistors, capacitors) once they are defined. SPICE supports subcircuit definition using the "subckt" command.

Other Component-Creating Functions

The above component-creating functions are illustrative of the generality and flexibility of the automated design system of various embodiments. Many other component-creating functions can be created to accommodate the requirements of designing particular classes of circuits or particular topological arrangements of circuit elements. Components may be inserted to replace a node (point) as well as to replace an edge (line) in the circuit diagram. Components with five (or more) leads may be inserted in a similar way, sometimes replacing a node (point), an edge (line), and an additional adjacent component. Many other functions that can be used can operate on more than one node (point) or edge (line) in the circuit diagram or operate in a context-sensitive way. For example, a component-creating function for insertion of a four-leaded transformer may be created for insertion of a transformer onto a printed circuit board. Component-creating functions for MOSFET transistors (which have a source, gain, gate, and bulk) may be created for insertion of such transistors onto silicon wafers or other substrates.

Although the degree of nodes is two or three in the foregoing description, other component-creating functions, in conjunction with other topology-modifying functions, can be defined to accommodate nodes with greater degrees.

Topology-Modifying Functions

The topology-modifying functions modify the topology of the circuit. Each topology-modifying function in a program tree points to an associated highlighted component (which is often a modifiable wire) and modifies the topology of the developing circuit in a well-defined way. Each topology-modifying function spawns zero, one, or more writing heads. In addition, in one embodiment, each topology-modifying function leaves the number of lines impinging at any one node in the circuit at either two or three. In other embodiments, the number of lines impinging at any one node left as a result of each topology-modifying function may be greater than three (e.g., 4, 5, etc.).

Some topology-modifying functions are context-free and some are context-sensitive. When a topology-modifying function is context-free, the outcome depends only on the single highlighted modifiable component or modifiable wire (i.e., the component with the writing head). When a topology-modifying function is context-sensitive, the outcome depends not just upon the single highlighted component, but also upon other usually nearby elements of the circuit structure.

The SERIES-LAYOUT Function

Figure 7:
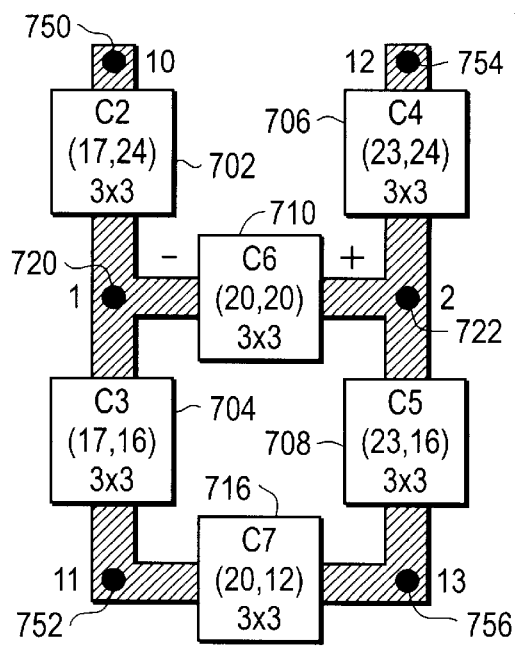
FIG. 7 illustrates a partial circuit containing a modifiable capacitor C6.

In one embodiment, the two argument SERIES-LAYOUT function creates a series composition consisting of the modifiable component with which the function is associated and a copy of it. The function also creates two new nodes. FIG. 7 shows a partial circuit consisting of six capacitors C2–C7 (702, 704, 706, 708, 710, and 716), and nodes 1, 2, 10, 11, 12, and 13 (720, 722, 750, 752, 754, and 756).

Figure 8:
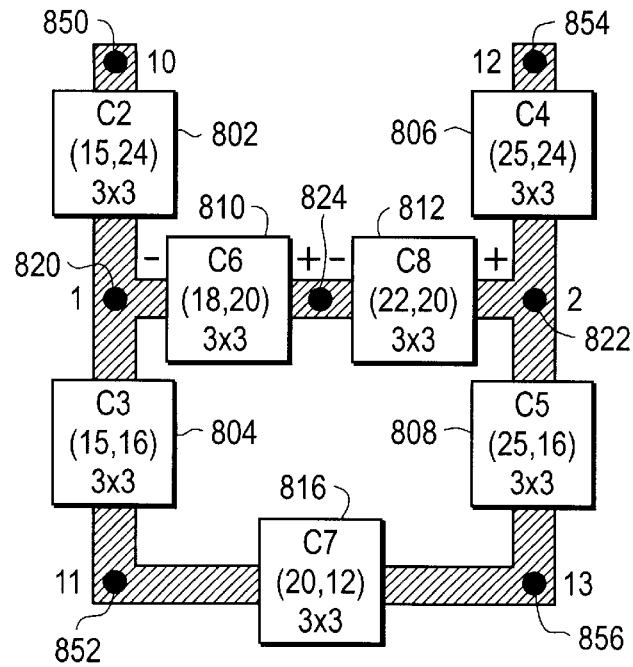
FIG. 8 illustrates the result of applying a SERIES-LAYOUT function to the modifiable capacitor C6 of FIG. 7.

FIG. 8 shows the result of applying the SERIES-LAYOUT function to the modifiable capacitor C6 (710) of FIG. 7. Capacitor C6 (710) is initially located at position (20,20) in FIG. 7. The SERIES-LAYOUT function creates a new capacitor C8 (812) in FIG. 8 occupying a 3×3 area. Newly created capacitor C8 (812) has the same capacitance value as modifiable capacitor C6 (810). In one embodiment, the SERIES-LAYOUT function does not remove or relocate the preexisting component C6 (810). Instead, space is made for the newly created capacitor C8 (812) in the direction specified by the positive lead of the preexisting component C6 (810). Thus, C8 (812) is located at position (22,20) to the right of C6 (810) in this example.

To accommodate newly inserted capacitor C8 (812), preexisting capacitors C2 through C7 (802, 804, 806, and 808) are subsequently moved to accommodate for C8 (812). For example, preexisting capacitor C2 (702) in FIG. 7 is moved to the left two units thereby relocating it from position (17,24) to position (15,24) as shown in FIG. 8. Similarly, preexisting capacitor C5 (708) of FIG. 7 is pushed to the right by two units, relocating it from position (23,16) to position (25,16) of FIG. 8. Insertion of capacitor C8 (812) also affects other parts of the developing circuit. For example, the wires to the left and right of preexisting capacitor C7 (816) are lengthened by two units each to reflect the addition of the four horizontal units associated with the creation of C8 (812). The movement of components is discussed further in reference to FIG. 12.

In one embodiment, both arguments of the SERIES-LAYOUT function are construction-continuing subtrees so that both C6 (810) and C8 (812) remain subject to subsequent modification. New node 3 (824) is located between preexisting capacitor C6 (810) and new capacitor C8 (812) at the original position (20,20) of preexisting capacitor C6 (710).

The above approach to the series composition function has proved to be workable. However, the series composition function (and other topology-modifying functions described herein) may be implemented in many additional ways that are consistent with the spirit of the present invention.

The PARALLEL-LAYOUT Functions

Each of the two functions in the PARALLEL-LAYOUT family of four-argument functions creates a parallel composition having two new modifiable wires, the preexisting modifiable wire or modifiable component with which the function is associated, and a copy of the modifiable wire or modifiable component. Each function also creates two new nodes.

Figure 9:
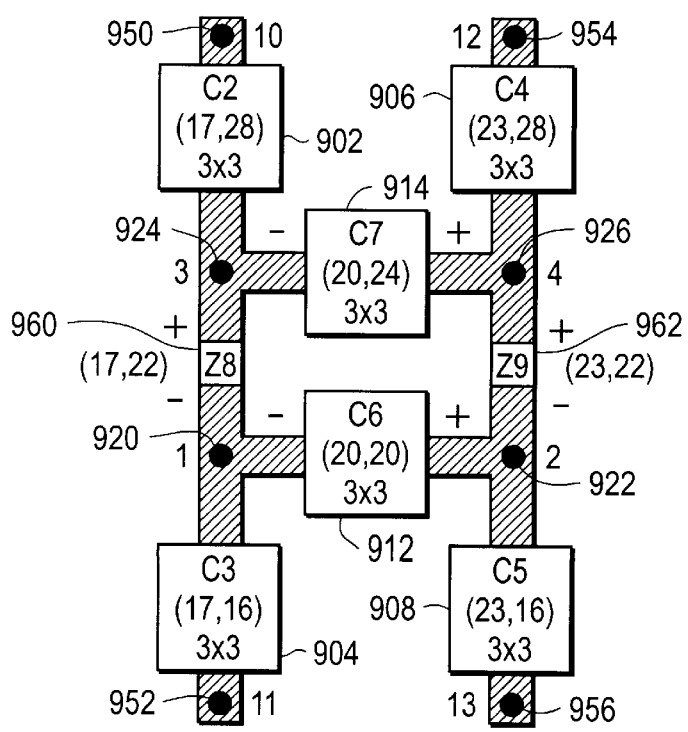
FIG. 9 illustrates the result of applying a PARALLEL-LAYOUT-LEFT function to the modifiable capacitor C6 of FIG. 4.

FIG. 9 shows the result of applying the PARALLEL-LAYOUT-LEFT function to modifiable capacitor C6 (710) located at position (20,20) of FIG. 4. The function does not change the position of the modifiable component or modifiable wire with which the function is associated. The function, in this example, creates a new capacitor C7 (914) occupying a 3×3 area in FIG. 9 with the same values as modifiable capacitor C6 (912). The function positions the new capacitor C7 (914) to the left of C6 (912) (looking from the negative to positive lead of the modifiable component or modifiable wire with which the function is associated). The function does not affect the position of preexisting circuitry to the right of C6 (912) (i.e., C3 (904) and C5 (908)). The function inserts a new 1×1 modifiable wire Z9 (962) at position (23,22) to the left of C6 (912), a new 1×1 iece of wire between preexisting node 2 (922) and new modifiable wire Z9 (962), and a new 1×1 piece of wire between new node 4 (926) and Z9 (962). The function inserts a new 1×1 modifiable wire Z8 (960) at position (17,22) to the left of C6 (912), a new 1×1 piece of wire between preexisting node 1 (920) and new modifiable wire Z8 (960), and a new 1×1 piece of wire between new node 3 (924) and Z8 (960). The new capacitor C7 (914) is located at position (20,24).

The function also relocates the preexisting circuitry to the left of C6 (912). Preexisting capacitor C2 (902) is pushed up from position (17,24) (FIG. 4) to position (17,22) (FIG. 9) and capacitor C4 (906) is moved up from position (23,24) (FIG. 4) to position (23,28) (FIG. 9).

The parallel composition function differs from the series composition function in that there are two distinct ways for performing the parallelization. The first is referred to herein as PARALLEL-LAYOUT-LEFT and the second is referred to herein as PARALLEL-LAYOUT RIGHT.

Figure 10:
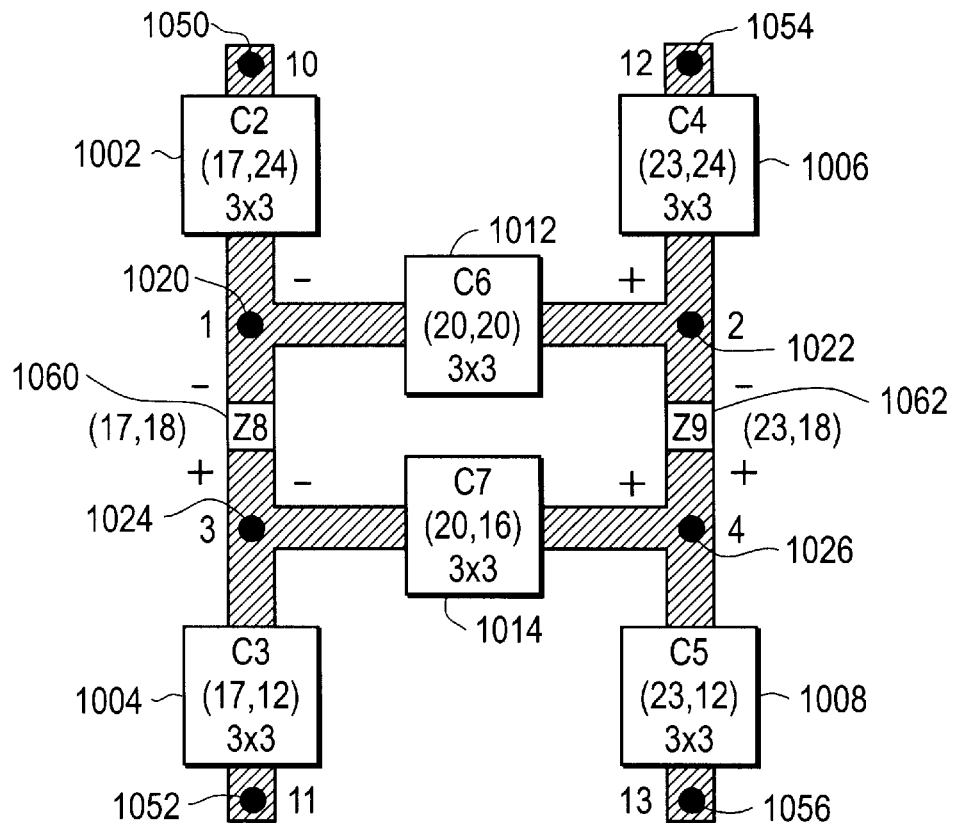
FIG. 10 illustrates the result of applying a PARALLEL-LAYOUT-RIGHT function to the modifiable capacitor C6 of FIG. 4.

FIG. 10 shows the result of applying the PARALLEL-LAYOUT-RIGHT function to modifiable capacitor C6 (710) located at position (20,20) of FIG. 4. This function operates in a manner similar to the PARALLEL-LAYOUT-LEFT function as describe above, except that new capacitor C7 (1014) is positioned to the right of capacitor C6 (1012) and the position of preexisting circuitry to the right of C6 (1012) is pushed down accordingly.

The FLIP Function

The one argument polarity-reversing FLIP function reverses the polarity of the modifiable component or modifiable wire with which the function is associated.

The VIA-TO-GROUND-LAYOUT Functions

All of the foregoing circuit-constructing functions operate in a plane. However, most practical circuits are not entirely planar. Vias provide a way to connect distant points of a circuit. Each of the four functions in the VIA-TO-GROUND-LAYOUT family of three argument functions creates a T-shaped composition that includes the modifiable wire or modifiable component with which the function is associated, a copy of it, two new modifiable wires, and a VIA-TO-GROUND. The function also creates two new nodes.

Figure 11:
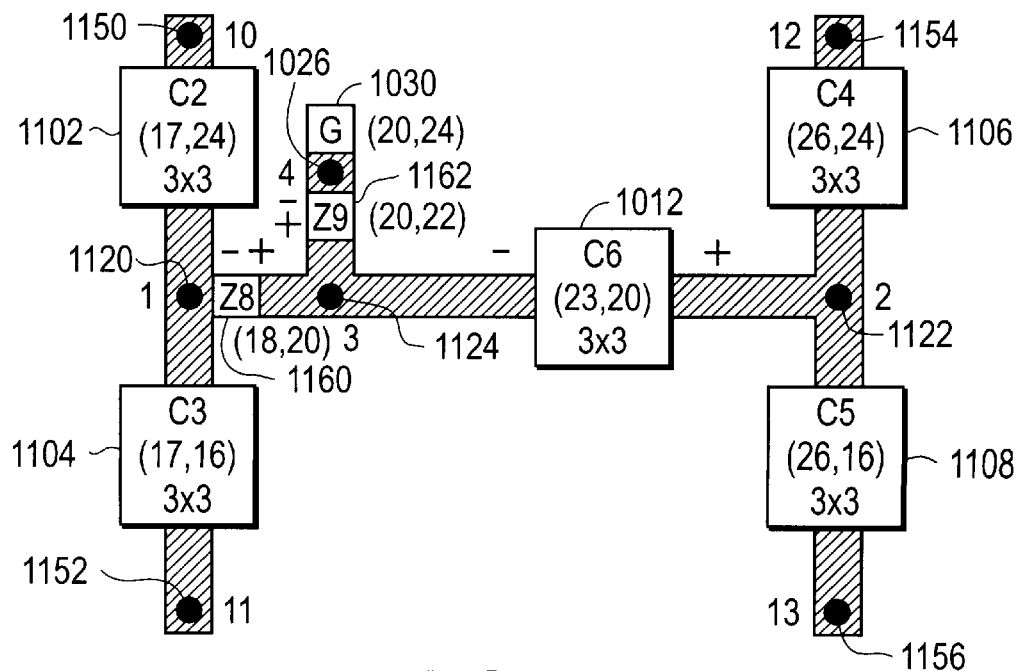
FIG. 11 illustrates the result of applying a VIA-TO-GROUND-NEG-LEFT-LAYOUT function to the modifiable capacitor C6 of FIG. 4.

FIG. 11 shows the result of applying the VIA-TO-GROUND-NEG-LEFT-LAYOUT function to modifiable capacitor C6 (710) located at position (20,20) of FIG. 4. The function creates a new node 3 (1124) at position (20,20) of the modifiable component or modifiable wire with which the function is associated, creates a new 2×1 area at the negative end of the modifiable component or modifiable wire with which the function is associated, and creates a new 4×1 area to the left of the modifiable component or modifiable wire.

The new 4×1 area includes a new 1×1 piece of wire perpendicular and to the left of the modifiable component or modifiable wire with which the function is associated (facing from the negative to positive lead of the modifiable component or modifiable wire with which the function is associated), a new 1×1 modifiable wire Z9 (1162) at position (20,11) beyond the new 1×1 piece of wire, a new node 4 (1026) at position (20,23) beyond Z9 (1162) and the new 1×1 piece, and a VIA-TO-GROUND (1030) at position (20,24) beyond node 4 (1026), Z9 (1162), and the new 1×1 piece.

The new 2×1 area includes a 1×1 piece of wire at position (19,20) at the negative lead of the modifiable component or modifiable wire with which the function is associated, and a new modifiable wire Z8 (1160) at position (18,20). Because the VIA-TO-GROUND-NEG-LEFT-LAYOUT function creates a new 2×1 area at the negative end of preexisting capacitor C6 (1012) and a new 1×1 node 3 (1124), capacitor C6 (1012) is pushed to the right by three units in order that C6 (1012) become centered at position (23,20). Consequentially, preexisting capacitor C4 (1106) is pushed right from position (23,24) (FIG. 4) to new position (26,24) (FIG. 11) and preexisting capacitor C5 (1108) is pushed right from position (23,16) (FIG. 4) to new position (26,16) (FIG. 11).

The three other members of this family of functions (VIA-TO-GROUND-POS-LEFT-LAYOUT, VIA-TO-GROUND-NEG-RIGHT-LAYOUT, and VIA-TO-GROUND-POS-RIGHT-LAYOUT) are named to reflect the fact that they create the new 2×1 area at the positive rather than negative end of the modifiable component or modifiable wire with which the function is associated and that they create the new 4×1 area to the right instead of to the left of the modifiable component or wire.

Connections to Power Supplies

A similar family of four different three-argument functions can be defined to allow a direct connection to the positive power supply. For example, the VIA-TO-POS-NEG-LEFT-LAYOUT function operates in a manner similar to the VIA-TO-GROUND-NEG-LEFT-LAYOUT function except that the newly created point 1030 (as shown in FIG. 11) is connected to the positive power supply (called POS) for the overall circuit, instead of being connected to ground (G).

Moreover, a similar family of four different three-argument functions can be defined to allow a direct connection to the negative power supply for the overall circuit.

Two-Argument VIA-LAYOUT Function

The previous discussion has implicitly assumed that printed circuit boards, silicon wafers, or other substrates have only one layer. However, commercially common printed circuit boards, silicon wafers, or other substrates typically have more than one layer.

Numbered vias can be created to provide connectivity between two different parts of a circuit.

The two-argument VIA-LAYOUT functions enable connections between parts of a circuit that are physically located on different layers of the printed circuit board, silicon wafer, or other multi-layer substrate. These VIA-LAYOUT functions provide a way to escape the planarity of the other circuit-constructing operations. The VIA-LAYOUT function also provides a convenient way to connect many nodes together.

The additional layers of a particular printed circuit board, silicon wafer, or other substrate may be available only for wires or for both wires and components. For example, some commercially common two-sided printed circuit boards permit both components and wires to be on both sides on the board, while other two-sided printed circuit boards permit components and wires on only one side of the board (with only wires being permitted on the other side of the board). In the case of silicon chips, it is common for transistors and other components to appear on the main layer, while the additional layers are only available for wires.

For purposes of illustrating one embodiment of the VIA-LAYOUT functions, suppose there are two layers available in addition to previously described main layer of the printed circuit board, silicon wafer, or other substrate. Each of the two-argument functions in the VIA-LAYOUT family of functions (called VIA-LAYOUT0 and VIA-LAYOUT1) create a new node and a composition of two modifiable wires and one non modifiable wire such that the nonmodifiable wire makes a connection, called a via, to a designated one of two numbered layers (0 or 1) of the printed circuit board, silicon wafer, or other substrate. For example, the VIA-LAYOUT-0 function creates a via to make a connection to layer 0; while the VIA-LAYOUT-1 function creates a via to make a connection to layer 1. Note that there are four members of the VIA-LAYOUT-0 family of functions (analagous to the pos-left, neg-left, pos-right, and neg-right) and four additional members of the VIA-LAYOUT-1 family.

The operation of one embodiment of the VIA-LAYOUT-1 family of functions can be illustrated using FIG. 11. In this embodiment, one of the VIA-LAYOUT-1 functions creates a via (in the same manner as one of VIA-TO-GROUND functions) at point 1030. When the via is to layer 1 (instead of ground "G"), then point 1030 is labeled "1" (instead of "G").

The component-creating NON-MODIFIABLE-WIRE-LAYOUT function is used for laying down wires on a layer where there are no components.

Other Topology-Modifying Functions

The above topology-modifying functions are illustrative of the generality and flexibility of the automated design system of the present invention. The above topology-modifying functions are sufficient to handle a wide variety of circuits. Many other topology-modifying functions may be used to accommodate the requirements of designing particular classes of circuits or topological arrangements of circuit elements.

Development-Controlling Functions

The NOOP Function

The one-argument NOOP function has no effect on the highlighted modifiable component or modifiable wire; however, it delays activity on the developmental path on which it appears in relation to other developmental paths in the overall program tree, thereby (possibly) affecting the overall result produced by the construction process. After execution of the NOOP function, the writing head points to the original highlighted component or wire.

The END Function

The zero-argument END function causes the highlighted modifiable component to lose its writing head, thereby ending that particular developmental path. The occurrence of an END function stops the development only along its developmental path within the overall program tree.

Other Development-Controlling Functions

The above development-controlling functions are illustrative of the generality and flexibility of the automated design system of the present invention. Many other development-controlling functions may be used to accommodate the requirements of designing particular classes of circuits or topological arrangements of circuit elements.

Placement and Routing of Components and Wires

In one embodiment, the specification of the initial circuit for any layout problem includes the initial (X,Y) coordinates for the center of each node. In one embodiment, the node coordinates in the initial circuit do not allow for the widths or lengths of any other components or wires. Thus, all the initial node coordinates are specified as if the width and length of the components are zero and the width of the wires are zero. Initial coordinates for the initial components and wires do not need to be specified as they are assumed to be centered between the nodes that they are connected to. In one embodiment, the initial circuit is planar.

During the evaluation of the program tree, in one embodiment, all components are treated as though they have zero width and length, and wires are treated as though they have zero width. During the evaluation of the program tree, the coordinates of the node center never changes once the node is initially inserted. All functions in the program tree preserve the planarity of the circuit. For example, given the horizontal modifiable component C6 (710) of FIG. 7, connected to node 1 (720) at position (17,20) and the second node two (722) at position (23,20), the SERIES-LAYOUT function works as follows: a new node 3 (824), as shown in FIG. 8, is inserted one half of the way from node 1 (720) (X1, Y) to node 2 (722) (X2, Y) (i.e., ((X1)+(X2−X1)/2, Y))). The original component capacitor C6 (810) is connected to the original node 1 (720) at position (X1,Y) (17,20) and to the new node 3 (824). The new modifiable component C8 (812) is connected between new node 3 (824) and the original node 2 (822) at position (23,20) (X2,Y).

Once the entire circuit-constructing program tree is traversed, the topology of the resulting circuit is known, the component values are known, the orientation of the components are known, and the relative positions of the components are partially known. However, the exact widths and lengths of the components and wires have not yet been taken into account.

In one embodiment, the editing phase simplifies collinear-passive components of the same kind in series into a single component with the appropriate value. In addition, collinear wires and series are converted into single wires.

Figure 12:
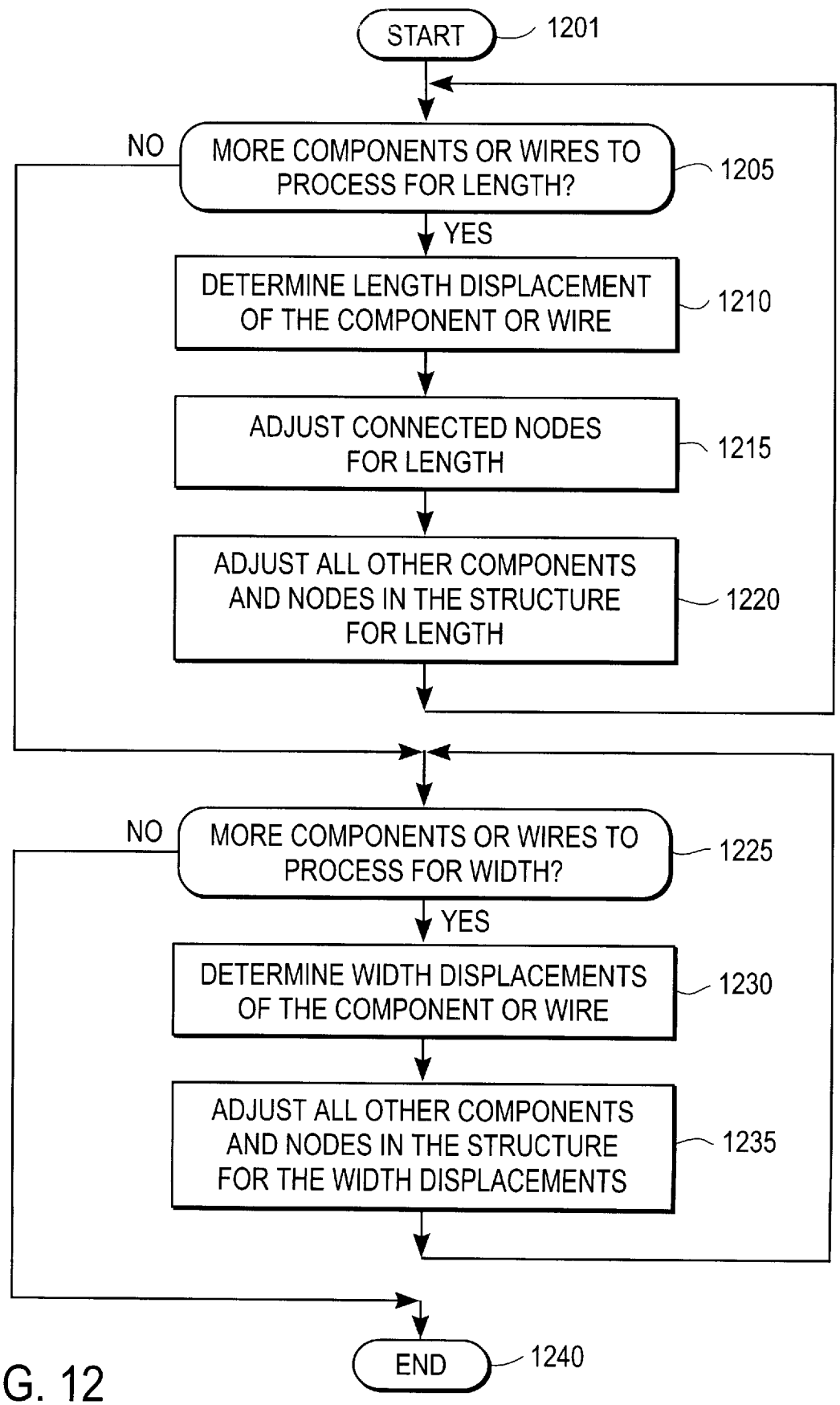
FIG. 12 is a flowchart of one embodiment for adjusting the placement and routing of automatically generated electrical circuits.

Next, the dimensions of every component and wire is accounted for in the layout. Referring to FIG. 12, a flowchart is shown of a method of one embodiment to adjust the length and width of the components and wires in the layout. During the process of FIG. 12, for each wire or component, the center of the wire or component being processed is fixed and other parts of the circuit are moved to make room for the component or wire. In one embodiment, each component and wire is processed in the numerical order of their creation by applying the steps of FIG. 12. The process is initiated at processing block 1201, and, at processing block 1205, processing logic determines if there are any components or wires to be processed for length displacement. If no components or wires are remaining to be processed for length displacement, processing logic continues at processing block 1225. However, if more components or wires are left to be processed for length displacement, processing logic continues at processing block 1210.

Next, at processing block 1210, processing logic determines the length displacement for each lead of the component or wire. Wires have a minimum length. In one embodiment, for components, each lead that connects directly to a node (rather than to a wire) will have a wire added to connect the component's lead to the node in the layout. In one embodiment, for two leaded components, the length displacement for each lead is calculated as follows: a node connected to the component is moved far enough away from the center of the component to allow enough distance for half the component's length dimension, plus the minimum allowed length for the wire connected to the lead, plus one-half the minimum width of a node. In addition, if the node connected to the component has a wire perpendicular to the component, then a minimum clearance will be included between that perpendicular wire and the nearest edge of the component. The length displacement is computed for each of the component's leads. If the distance from the center of the component to a node is less than the calculated length displacement for that node, then the adjustment for that node is the difference; otherwise, steps 1215 and 1220 are skipped for that node.

Next, at processing block 1215, processing logic adjusts each node connected directly to the component for the length displacement for the lead connected to that node. First consider the case where a component is oriented horizontally. In one embodiment, each attached node is defined as laying in a half plane defined by a line through the center of the component and perpendicular to the component's length. The attached node with a horizontal position value (x-coordinate) less than the x-coordinate of the component is defined as laying in the left half-plane. The node with an x-coordinate greater than the x-coordinate of the component is defined as laying in the right half-plane. The left half-plane node is adjusted for the length of the component by subtracting the left lead's adjustment from the node's x-coordinate. Also, the right half-plane node's x-coordinate is adjusted by adding the right lead's adjustment to its x-coordinate. A similar procedure is used for vertically oriented components.

Next, at processing block 1220, the process adjusts all other components and nodes in the structure. Again, consider the horizontal case first. In one embodiment, all components and nodes laying in the left half-plane are adjusted by subtracting the left lead's adjustment from their x-coordinates and all components and nodes laying the right half-plane are adjusted by adding the right lead's adjustment to their x-coordinates. Processing logic then returns to processing block 1205 to determine if any more components or wires are remaining to process for length displacement. If no components or wires are remaining to process for length displacement, processing logic then continues at processing block 1225. A similar procedure is used for vertically oriented components.

At processing block 1225, processing logic determines if there are any components or wires to be processed for width displacement. (In one embodiment, each component and wire is processed in numerical order by iteratively applying processing blocks 1225 through 1235.) If no components or wires remain to be processed, the process ends execution at processing block 1240. However, if more components or wires remain to be processed, the process continues at processing block 1230.

Next, at processing block 1230, the process determines the width displacement of the component or wire. In one embodiment, during the steps for the adjustment for width (processing blocks 1225 through 1235), the center of the component or wire being processed is fixed and other parts of the circuit are moved to make room for the width of the component or wire. For two leaded components, the width displacement is calculated as follows: for each of the two directions that the component's width extends, space is created to allow for the component's width. The amount of space that is needed to accommodate the component's width in each direction from the component's center is calculated based on the component's width plus the minimum feature clearance distance. First consider the case of a horizontally oriented component. A vertical displacement is calculated for both directions based on the distance of the nearest other circuit element. Thus, for components in the half-plane defined as being those elements whose vertical position value (y-coordinate) is less than the y-coordinate of the component, a vertical displacement (lower vertical displacement) is calculated. In addition, for those components in the half-plane defined as being those elements whose y-coordinate is greater than the y-coordinate of the component, another vertical displacement (upper vertical displacement) is calculated.

If the distance from the center of the components to the nearest other circuit element in a half plane is less than the calculated width displacement for that half plane, then the adjustment for that half plane is the difference; otherwise step 1235 skipped for that half plane.

Next, at processing block 1235, the process adjusts all other components and nodes for the width displacement. In one embodiment, the process adjusts all components and nodes according to the vertical adjustment calculated in processing block 1230. Components in the lower vertical half-plane are adjusted by subtracting the lower vertical adjustment from their y-coordinates. Components in the upper vertical half-plane are adjusted by adding the upper vertical adjustment to their y-coordinates. The process then returns to processing block 1275 and continues processing.

As an example of the above methodology, referring to FIG. 4, modifiable wire Z0 (410) is centered at position (20,20). Newly inserted capacitor C6 (512) of FIG. 5 is centered at position (20,20); however, capacitors C2 through C5 (402, 404, 406, and 408) and nodes 1, 2, and 10 through 13 (420, 427, 450, 452, 454 and 456) initially remain at their original locations as indicated in FIG. 4 after the insertion. The process of FIG. 12 is then applied to all the components. For C6 (512), the process defines the needed displacement length from the center of the new component to each of the attached nodes, namely node 1 (520) and node 2 (522) corresponding to processing block 1210. The length from the new capacitor to each of its nodes is calculated as follows: half the length of the component (3), plus the minimum length of a wire, plus one-half the length of a node for a total length of 3. (In this example, because wires lead from the nodes perpendicular to the capacitor C6 (512), minimum clearance allowance would also need to be made; however, for the example, this value is ignored.) The process of FIG. 12 then defines the new positions for the attached nodes (nodes 1 (520) and 2 (522)) and adjust their positions accordingly (corresponding to processing block 1215 of FIG. 12). The new position of node 1 (520) is calculated from the fixed center location of the modifiable component C6 (512) using the adjustment to that node. Thus, in this example, a value of 1 is subtracted from 17 to give the new X coordinate of 17. Similarly, node 2 (522) would be located at 1+22. Node 1 (520) lies in the half-plane to the left of C6 (512) and all components in this half-plane are adjusted in the X direction by the same value as node 1 (520) (i.e., by −1). Thus, C2 (502), C3 (504), node 10 (550), and node 11 (552) have their X coordinate position adjusted by −1 and are located at X location 17 as shown in FIG. 5. Similarly, C4 (506), C5 (508), node 12 (554) and node 13 (556) are adjusted in the X direction by the same amount as node 2 (522) (i.e., by +1). Thus, these components and nodes have their X coordinate position adjusted by +1 and located at X position 23 as shown in FIG. 5.

After the process of FIG. 12 finishes adjusting all the components for length, the process adjusts all the components and nodes for width (corresponding to processing blocks 1230 and 1235 of FIG. 12). The width needed on each side of component C6 (512) is calculated based on the half width of C6 (512) (1.5) plus a minimum feature distance. An adjustment width is calculated for both directions based on the nearest circuit element (here, a value of 1). Thus, C2 (502), C4 (506), node 10 (550) and node 12 (554) are moved +1 in the Y direction as shown in FIG. 5. The components in the half-plane below component C6 (512) (i.e., having lower Y location values) are adjusted down for their corresponding adjustment width. Thus, C3 (504), C5 (508), node 11 (552) and node 13 (556) are moved −1 in the Y direction, as shown in FIG. 5.

Other Functions

Components may be created to replace a node (point) as well as to replace an edge (line) in the circuit diagram. In addition, although the degree of nodes is two or three in the foregoing description, other topology-modifying functions, in conjunction with other component-creating functions, can be defined to accommodate nodes with greater degree.

Placement and Routing in a Restrained Area

The above descriptions of the component-creating and topology-modifying functions and the above description of a process of adjusting the physical locations assumes that the layout (placement and routing) process is conducted on a printed circuit board, silicon wafer, or other substrate of unlimited expanse. This approach is often used in conjunction with a multiobjective fitness measure that gives preference to layouts with smaller total area (typically measured by a bounding rectangle). However, it is sometimes necessary to lay out a circuit within a preestablished restrained area. For example, it may be necessary to insert the entire laid-out circuit into a particular L-shaped area. In that event, an alternative embodiment of the above-described component-creating and topology-modifying functions and process for adjusting the physical locations may be used. In this alternative embodiment, all component-creating functions, all topology-modifying functions, and adjustments are made within the preestablished restrained area. This can be accomplished by attaching a significant penalty to any component or wire that is located outside the preestablished restrained area, thereby using the selective pressure of the fitness measure to drive the process to a compliant final layout.

Automatically Defined Functions

Problems of automated design are replete with regularities, symmetries, homogeneities, similarities, patterns, and modularities. The approach to automated design described herein may incorporate a hierarchical mechanism to exploit, by reuse and parameterization, the regularities, symmetries, homogeneities, similarities, patterns, and modularities inherent in design problems. Subroutines provide a mechanism for reusing code in ordinary computer programs.

Describing how to evolve multi-part programs having a main program and one or more reusable, parameterized, hierarchically-called subroutines is well-known in the art. For instance, see U.S. Pat. No. 5,343,554, which is incorporated herein by reference.

An automatically defined function (ADF) is a function (sometimes referred to herein as a subroutine, subprogram, DEFUN, procedure, or module) whose work-performing body is dynamically evolved during a run of genetic programming and which may be called by a calling main program (or calling subprogram) whose work-performing body is concurrently being evolved. When automatically defined functions are being used, a program in the population has a hierarchy of one or more reusable function-defining branches (e.g., automatically defined functions) along with one or more main result-producing branches. The automatically defined functions may possess one or more dummy arguments (formal parameters). Typically, the automatically defined functions are reused with different instantiations of these dummy arguments. During a run, genetic programming evolves different subprograms in the function-defining branches of the overall program, different main programs in the result-producing branch, different instantiations of the dummy arguments of the automatically defined functions in the function-defining branches, and different hierarchical references between the branches.

In one embodiment, when automatically defined functions are being used in genetic programming, the initial random generation of the population is created so that every individual program has a constrained syntactic structure that includes a particular architectural arrangement of branches. In one embodiment, when crossover is to be performed, a type is assigned to each potential crossover point in the parental computer programs either on a branch-wide basis (called branch typing) or on the basis of the actual content of the subtree below the potential crossover point (called point typing). Crossover is then performed in a structure-preserving way (given closure) so as to ensure the syntactic validity of the offspring.

In the context of design, automatically defined functions provide a way to exploit, by reuse and parameterization, the regularities, symmetries, homogeneities, similarities, patterns, and modularities inherent in design problems. Thus, it is desirable to include automatically defined functions in runs of genetic programming for designing complex structures.

It is possible for arithmetic-performing subtrees to invoke automatically defined functions in order to provide reusability of the results of numerical calculations.

When an automatically defined function is encountered during execution of a program tree, the order of execution of the functions in the automatically defined function and the program tree is as if the entire body of the automatically defined function had been inserted into the program tree.

Automatically defined functions may be used in two distinct ways. First, they may be composed of topology-modifying and component-creating functions and invoked as part of the process of creating the topology and inserting components into the topology. Second, they may be composed of arithmetic functions and invoked from an arithmetic-performing subtree as part of the process of sizing components.

Detailed Example of Development of a Circuit from the Initial Circuit

An example of the process of developing the topology, sizing, placement, and routing a circuit from an initial circuit is presented below. The individual circuit-constructing program tree used in this section is the best-of-generation circuit from generation 0 of the run discussed below in the section on the design of a lowpass filter. The program tree has 62 points (i.e., functions and terminals) and is shown below:

(L-LAYOUT
    (+(+(−(−1.696670e-01 −9.698411e-01) (+−4.141619e-01 −9.698411e-01)) (−(+−6.726407e-01 7.125187e-02) (−−4.626930e-01 −7.907990e-01))) (−(+(+− 7.676864e-02 −4.264433e-01) (−(−−3.240008e-01 −3.083229e-03))))
(PARALLEL-LAYOUT-LEFT
    (FLIP(FLIP(NOOP END)))
    (C-LAYOUT
        (−(−6.556802E-01 −5.067028E-01) (+−4.626930E-01 −9.698411e-01))
        (FLIP(FLIP END)))
    (FLIP
        (SERIES-LAYOUT
            (C-LAYOUT −7.763983e-01 END)
            (VIA-TO-GROUND-NEG-LEFT-LAYOUT END END END)))
    (FLIP
        (NOOP(L-LAYOUT 7.648563e-01 END)))))

The program tree is illustrated in FIG. 13. Referring to FIG. 13, the program begins with a two-argument inductor-creating L-LAYOUT function 1302. The value of the new inductor is established by the first argument of this top-most L-LAYOUT function (a very large arithmetic-performing subtree composed of addition and subtraction functions and floating-point random constants and that is abbreviated and labeled V1 (1304) in the figure). The second argument (construction-continuing subtree) of this top-most L-LAYOUT function is a four-argument PARALLEL-LAYOUT-LEFT function 1306.

The first argument of the four-argument PARALLEL-LAYOUT-LEFT function 1306 executes two one-argument polarity-reversing FLIP (1308, 1310) functions and one one-argument NOOP ("No Operation") function 1312 before reaching a development-terminating zero-argument END function 1314. The second argument of the four-argument PARALLEL-LAYOUT-LEFT function executes a capacitor-creating two-argument C-LAYOUT function 1316 whose value is established by a seven-point arithmetic-performing subtree (1318 through 1330) and whose construction-continuing subtree contains two polarity-reversing FLIP functions 1332 and 1334 and one END function 1336. The third argument of the four-argument PARALLEL-LAYOUT-LEFT function is a one-argument FLIP function 1338 whose construction-continuing subtree consists of a two-argument SERIES-LAYOUT function 1340. The first construction-continuing subtree of the SERIES-LAYOUT function 1340 executes a second two-argument capacitor-creating C-LAYOUT function 1342. The value of the second capacitor is established by the one-point arithmetic-performing subtree 1344 consisting of the floating-point random constant −0.7763983. The second construction-continuing subtree of the SERIES-LAYOUT function 1340 executes a three-argument VIA-TO-GROUND-NEG-LEFT-LAYOUT function 1348. The fourth (and final) argument of the four-argument PARALLEL-LAYOUT-LEFT function 1306 is a FLIP function 1356 whose construction-continuing subtree executes a one-argument NOOP function 1358 which, in turn, causes execution of a second two-argument inductor-creating L-LAYOUT function 1360. The value of the second inductor is established by the one-point arithmetic-performing subtree 1362 consisting of the floating-point random constant 0.7648563.

In one embodiment, the program tree is traversed in a breath-first way (except for the immediately executed arithmetic-performing subtrees). This process of traversal appears advantageous based on current experience with this process. However, the process could be implemented using alternative approaches, such as depth-first search.

Figure 14:
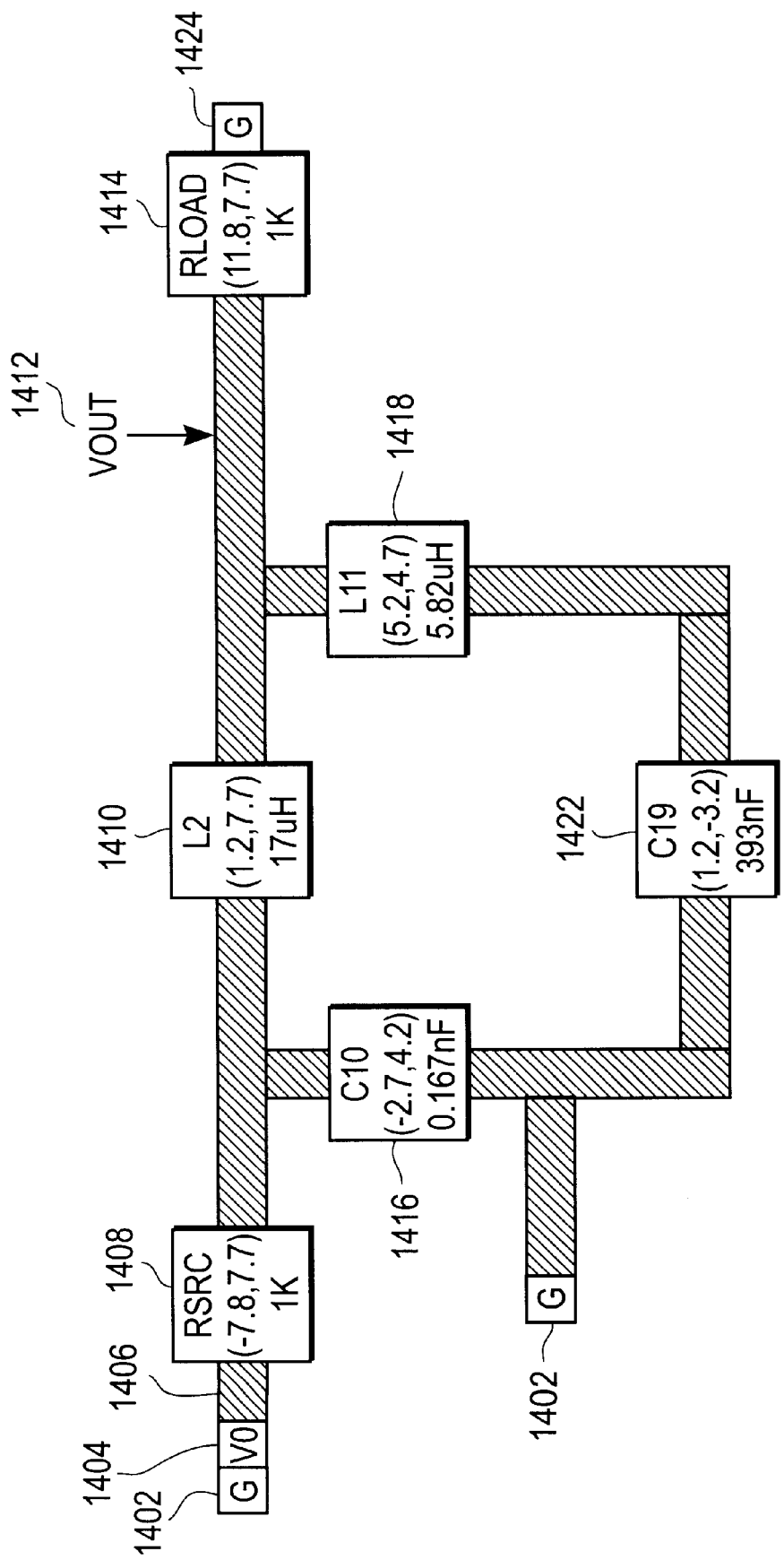
FIG. 14 illustrates the best-of-generation circuit of generation 0.

When this circuit-constructing program tree for the best-of-generation circuit of generation 0 is traversed, it yields a circuit with two inductors and two capacitors. FIG. 14 illustrates this best-of-generation circuit from generation 0. The incoming signal V 1404 passes through source resistor RSRC 1408 and is fed into inductor L2 (1410). Capacitor C10 (1416) is connected to ground G (1420). Inductor L11 (1418) and capacitors C19 (1422) are also connected to ground 1420. The output probe point VOUT 1412, the load resistor RLOAD 1414, and a connection to ground 1424 complete the circuit.

Designing a Lowpass LC Filter

An ideal lowpass filter passes all frequencies below a certain specified frequency, but stops all higher frequencies. An ideal highpass filter does the opposite. An ideal bandpass filter passes all frequencies in one or more specified ranges while stopping all other frequencies. An ideal stopband filter stops all frequencies in one or more specified ranges while passing all other frequencies. Practical filters never achieve ideal performance. In the illustrated example, the circuit is to be constructed on a two-sided printed circuit board whose top side contains circuit components (capacitors and inductors) that are connected by perpendicular indirecting metallic wires and whose bottom side is devoted to connection to ground.

The starting point for the design of a filter is the specification by the user of the frequency ranges for the passband (s) and the stopband(s). Additionally, the user may specify the maximum passband ripple (i.e., the small variation that is tolerated within the passband) and the minimum stopband attenuation (i.e., the large degree of blockage in the signal that is demanded in the stopband) or other factors.

The design of filters becomes increasingly difficult as the user imposes more requirements and more stringent constraints. In practice, the user may impose additional design requirements, which involve, for example, the power consumption of the circuit, the number of components in the circuit, the cost of components, the surface area occupied by all of the components, or the sensitivity of the circuit to temperature.

Consider a circuit design problem in which the goal is to design a filter using inductors and capacitors with an AC input signal with a 2 volt amplitude. The circuit is to be driven from a source with an internal (source) resistance of 1,000 Ohms and terminated in a load resistance of 1,000 Ohms. The filter is to have a passband below 1,000 Hertz with voltage values between 970 millivolts and 1 volt and to have a stopband above 2,000 Hz with voltage values between 0 volts and 1 millivolt.

A decibel is a unitless measure of relative voltage. A decibel is defined as 20 times the common logarithm of the ratio between the voltage at a particular probe point and a reference voltage (which is 1.0 volt here). Thus, the above requirement may be restated as a requirement for a pass band ripple of at most 0.3 decibels and a stop band attenuation of at least 60 decibels (relative to the reference voltage of 1 volts).

A practicing engineer would recognize that these requirements can be satisfied by a Cauer (Elliptic) filter of order 5.

Preparatory Steps for the Lowpass LC Filter

In one embodiment, before applying genetic programming to a circuit design problem, seven major preparatory steps are performed, typically by the user. These steps include: (1) identify the initial circuit, (2) determine the architecture of the circuit-constructing program trees, (3) identify the terminals of the program trees, (4) identify the primitive functions of the program trees, (5) create the fitness measure, (6) choose parameters, and (7) determine the termination criterion and method of result designation.

Initial Circuit

Since the problem of designing the lowpass LC filter calls for a one-input, one-output circuit with a source resistor and a load resistor, the initial circuit in FIG. 3 is suitable for this illustrative problem.

Program Architecture

Since there is one result-producing branch in the program tree for each modifiable wire in the embryo, the architecture of each circuit-constructing program tree has one result-producing branch in this illustrative problem. Neither automatically defined functions nor architecture-altering operations are used in this illustrative problem.

Function and Terminal Sets

The result-producing branch for this example is created in accordance with the constrained syntactic structure.

The program tree for this example may contain the following functions:

(1) component-creating functions that convert modifiable components and wires within the circuit into other specified components;

(2) topology-modifying functions that modify the topology to the development circuit; and (3) value-setting arguments that specify the numerical value (sizing) for each component in the circuit.

The arithmetic-performing subtree(s) contains arithmetic constants and random constants and specifies (after interpretation) the numerical value of the component. The construction-continuing subtree(s) continue the developmental process. Since the components used in this problem (i.e., inductors and capacitors) each take one numerical component value, there is only one value-setting argument associated with each component-creating function.

Topology-modifying functions have one or more construction-continuing subtrees, but have no arithmetic-performing subtrees.

For this illustrative problem, the function set, $F_{ccs}$, for each construction-continuing subtree is $F_{ccs}$={C-LAYOUT, L-LAYOUT, SERIES-LAYOUT, PARALLEL-LAYOUT-LEFT, PARALLEL-LAYOUT-RIGHT, FLIP, NOOP, VIA-TO-GROUND-NEG-LEFT-LAYOUT, VIA-TO-GROUND-NEG-RIGHT-LAYOUT, VIA-TO-GROUND-POS-LEFT-LAYOUT, VIA-TO-GROUND-POS-RIGHT-LAYOUT}, taking 2, 2, 1, 4, 4, 1, 1, 3, 3, 3, and 3 arguments, respectively.

The terminal set, $T_{CCS}$, for each construction-continuing subtree consists of $T_{CCS}$={END}.

Arithmetic-performing subtrees are used as the value-setting arguments for component-creating functions for this first example of the problem of automatically synthesizing the topology, sizing, placement, and layout of a lowpass filter consisting of inductors and capacitors.

The function set, $f_{aps}$, for the arithmetic-performing subtrees of the component-creating functions, consists of addition and subtraction $T_{aps}$={+, −}

The terminal set, $T_{aps}$, for each arithmetic-performing subtree is $T_{aps}$={R} where "R" represents random floating-point constants between −1.000 and +1.000.

Note that in the second and third examples (below), the value-setting arguments for component-creating functions are implemented as constant numbers that are subject to Gaussian perturbations. In those problems, the floating-point random constants range between +5.0 and −5.0. These constants are coded by 30 bits. In the initial random generation, these constants are set, individually and separately, to random values in the range between +5.0 and −5.0.

Fitness Measure

The initial circuit, the program architecture, the function and terminal sets, and the constrained syntactic structure described above could be applied to any one-input, one-output LC circuit. It is the user-provided fitness measure that directs the evolutionary process (in the search space of circuit-constructing program trees) to a program that constructs the desired circuit. The fitness measure is a high-level statement of requirements for the desired circuit that has been translated into a measurable quantity. Thus, the fitness measure guides the evolutionary search for a satisfactory solution. The fitness measure for a circuit is expressed in terms of the circuit's behavior in response to inputs of various frequencies and to a minimum topology.

FIG. 1 is a flowchart of one embodiment using genetic programming for the overall process for designing a circuit. RUN is the current run number while N is the maximum number of runs to be made. The variable GEN refers to the current generation number. The variable M is the population size. The index i refers to the current individual circuit in the population.

Referring to FIG. 1, the overall process of one embodiment comprises several independent runs, controlled by processing logic. Processing logic initializes the number of runs, RUN, to 0 at step 1002. The processing logic may comprise hardware, software, or a combination of both. Each run consists of many generations; therefore, processing logic initializes the generation number, GEN, to 0 at processing block 1004.

Next, at processing block 1006, for generation 0, the process initially creates an initial population for the run. This creates a number, M, of individual program trees (typically randomly).

Next, at processing block 1008, processing logic determines if the termination criteria has been satisfied for the run. The criteria is typically based on either reaching a certain maximum number of generations, G, or on satisfying some problem-specific criteria (the destination of problem-specific criteria is explained further in reference to processing block 1028). If the criteria is satisfied at processing block 1008, processing continues at processing block 1010 where processing logic designates the result for run (e.g., in one embodiment, by designating the best individual achieved over the generations). Then, at processing block 1012, processing logic increments the run number, RUN. If the run number, RUN, is equal to the maximum number of runs, N, at processing block 1014, then processing logic ends at processing block 1016. Otherwise, processing logic continues at processing block 1014 by performing another RUN.

If, at processing block 1008, the criteria for the run has not been satisfied, processing logic continues processing at processing block 1020. Beginning at processing block 1020, processing logic preferably performs two main iterative loops over the individual circuits (i) in the population. In the first of these two main iterative loops (beginning at processing block 1020), the fitness of each individual i in the population is determined. In the second of these two main iterative loops (beginning at processing block 1040), the genetic operations are performed.

Processing logic begins processing the fitness loop at processing block 1020 by initializing the index, i, of the individual in the population to zero. Processing logic tests the index, i, at processing block 1021 to determine if it equals (or exceeds) the population size, M. If index, i, equals M, processing logic begins processing the genetic operation loop at processing block 1040. If it does not, processing logic determines the fitness of each individual i in the population. In general, the determination of fitness may be implicit or explicit and it may or may not produce a numerical value of fitness. In one embodiment, the determination of fitness is explicit and a numerical value of fitness is determined. When genetic programming is being used for the design of a circuit, in one embodiment, processing logic determines the fitness of the circuit by the following four steps:

(1) apply the individual circuit-constructing program tree to the embryonic circuit in order to produce a fully developed circuit (processing block 1022), (2) create a description of the fully developed circuit (processing block 1024), (3) analyze the circuit (in a real environment or by simulating the circuit based on its description) in order to produce its behavior and to identify its characteristics (processing block 1026), and (4) apply the fitness measure (or measures) to the behavior and characteristics of the circuit to produce a fitness for the circuit (processing block 1028). (The application of the fitness is described in detail below.)

Then, the index, i, of the individual in the population is incremented at processing block 1030. If the index, i, satisfies the test at processing block 1021 of being equal to (or greater than) the population size, M, then the first of these main iterative loops over the individuals in the population ends and processing continues at processing block 1040.

Processing logic begins processing the second of these two main iterative loops over the individuals in the population by initializing the index, i, of the individual in the population to 0 at processing block 1040. Processing logic tests the index, i, to determine if it equals (or exceeds) the population size, M. If it does, the genetic operation loop ends and the process continues execution at processing block 1044. If it is not, processing logic processes processing block 1046.

Next, at processing block 1046, processing logic chooses a genetic operation to perform by a probabilistic determination. The sum of the probabilities of choosing the operations of reproduction, crossover, mutation, architecture-altering operations. Thus, one of the four alternatives is chosen.

Each of the four alternatives begins with a selection step. For example, for the genetic operation of reproduction, processing logic processes processing block 1058. In processing block 1058, processing logic selects an individual from the population with relatively high fitness values, in a probabilistic manner. The selection, in one embodiment, is substantially based on the fitness of the individual such that individuals having a relatively high value of fitness are preferred over individuals having a relatively low value of fitness. Note that the selection processing block 1060 for the crossover operation 1010 requires the selection of two individuals based on fitness. Selection processing block 1010 for the mutation operation and the other six selection steps requires selection of one individual based on fitness. Note that the same individual in the population may be selected more than once during each generation. In fact, more fit individuals are usually reselected.

For each of the nine alternatives, processing logic processes the appropriate genetic operation. For example, if the operation of reproduction is chosen, then processing logic processes the operation of reproduction at processing block 1052. If the operation of crossover is chosen, then processing logic processes the crossover operation at processing block 1062. In the version of the crossover operation used in this embodiment, a single offspring is produced. If the operation of mutation is chosen, then processing logic processes the mutation operation at processing block 1072. The architecture-altering operations are processed similarly.

After processing the genetic operations, processing logic adds the newly created individuals to the population at processing block 1090.

Then, at processing block 1092, processing logic increments the index, i, of the individual in the population is incremented. If the index, i, does not satisfy the test at processing block 1042 of being equal to (or greater than) the population size, M, processing logic continues processing at processing block 1046.

If the index, i, satisfies the test at processing block 1042, then processing logic ends processing the second of these main iterative loops over the individuals in the population. The generation number, GEN, is incremented at processing block 1044 and processing continues at processing block 1008.

In one embodiment, processing logic comprises a series of software steps implemented on top of a multithreaded operating system and may, therefore, run in parallel operation. It should be recognized that there are numerous slight variations of the overall process possible. Some of these variations can be used as a matter of convenience. For simplicity, the flowchart does not show certain additional genetic operations such as "permutation" or "define building block" (also called "encapsulation") that are not employed in one embodiment but could be employed in others.

Referring to processing block 1022, processing logic begins processing the individual circuit-constructing program tree in the population by traversing the tree. This traversal applies the functions in the program tree to the very simple initial circuit, thereby developing the initial circuit into a fully developed circuit. A netlist describing the circuit is then created at processing block 1024. The netlist identifies each component of the circuit, the nodes to which that component is connected, the value of that component (if applicable). The netlist also may contain the model of the component (if applicable). Each circuit is then analyzed to determine its behavior at processing block 1026. In one embodiment, the 217,000-line SPICE simulator runs as a submodule within the process. The input to a SPICE simulation is a netlist describing the circuit to be analyzed and certain commands that instruct SPICE as to the type of analysis to be performed and the nature of the output to be produced. SPICE can produce tabular information describing the circuit's electrical behavior. This tabular information is then used to measure fitness. Alternatively, other programs may be used for the simulation.

The integro-differential equations that govern the behavior of many electrical components (such as resistors, capacitors, and inductors) are the same as the equations that govern certain corresponding mechanical components. Thus, the SPICE simulator is capable, without modification, of performing simulations of many mechanical systems. In addition, there are many commercially available simulators that are specifically designed to simulate the behavior mechanical systems. A two-dimensional mechanical system is treated in the same way as a circuit whose components are laid out on a single-sided printed circuit board, single-layer of silicon, or single layer of a substrate. A three-dimension mechanical system requires three-dimensional coordinates for specifying the location of a component and component-creating functions, topology-modifying functions, and adjustments in three dimensions.

Referring to processing block 1028, in one embodiment, the fitness measure may incorporate any calculable behavior or characteristic or combination of behaviors or characteristics of the circuit. The circuit's behavior may include, but is not limited to, its behavior in the time domain, its behavior in the frequency domain, or its power consumption. The circuit's characteristics may include, but is not limited to, the number of components, cost of components, surface area occupied by its components, or sensitivity to temperature or other variables.

The fitness measure is typically multi-objective. It might, in the case of a lowpass filter, be expressed in terms of minimization of area of the bounding rectangle around the fully laid-out circuit as well as the degree to which the circuit acts as an effective lowpass filter (i.e., its nearly complete suppression of frequencies in the stopband of the desired lowpass filter and its passage, at nearly full power, of frequencies in the passband of the desired lowpass filter).

Since the development process for creating the fully developed circuit also yields the actual physical location components and the actual physical location of wires between the components, the area of the bounding rectangle for the fully developed circuit is easily computed.

The voltage VOUT is probed at isolated node 340 of FIG. 3 and the circuit is viewed in the frequency domain. The SPICE simulator is requested to perform an AC small signal analysis and to report the circuit's behavior for each of 101 frequency values chosen over five decades of frequency (from 1 Hz to 100,000 Hz). Each decade is divided into 20 parts (using a logarithmic scale).

For this example, fitness is defined using two terms: (1) the weighted average of the frequency response of the circuit and (2) the area of the bounding rectangle of the fully developed circuit.

The first term of the fitness measure is the sum, over the 101 fitness cases, of the absolute weighted deviation between the actual value of the voltage in the frequency domain) that is produced by the circuit at the probe point VOUT at isolated node 340 and the target value for voltage. The smaller the value of fitness, the better. A fitness of zero represents an ideal filter.

Specifically, the first term of the fitness measure $$F(t) = \sum_{i=0}^{100} [W(d(f_i), f_i) d(f_i)]$$

where f(i) is the frequency (in Hertz) of fitness case i; d(x) is the difference between the target and observed values at frequency x; and W(y,x) is the weighting for difference y at frequency x. The fitness measure does not penalize ideal values; it slightly penalizes every acceptable deviation; and it heavily penalizes every unacceptable deviation.

The procedure for each of the 61 points in the 3-decade interval from 1 Hz to 1,000 Hz is as follows: if the voltage equals the ideal value of 1.0 volts in this interval, then the deviation d(f;) is 0.0; if the voltage is between 970 millivolts and 1,000 millivolts, then the absolute value of the deviation from 1,000 millivolts is weighted by a factor of 1.0; if the voltage is less than 970 millivolts, then the absolute value of the deviation from 1,000 millivolts is weighted by a factor of 10.0. This arrangement reflects the fact that the ideal voltage in the passband is 1.0 volt, the fact that a 30 millivolt shortfall is acceptable, and the fact that a voltage below 970 millivolts in the passband is not acceptable. It is not possible for the voltage to exceed 1.0 volts in an LC circuit of this kind.

The acceptable and unacceptable deviations for each of the 35 points in the interval from 2,000 Hz to 100,000 Hz in the intended stopband are similarly weighed (by 1.0 or 10.0) based on the amount of deviation from the ideal voltage of 0 volts and the acceptable deviation of 1 millivolt and may be expressed as follows: If the voltage is between 0 millivolts and 1 millivolt, the absolute value of the deviation from 0 millivolts is weighted by a factor of 1.0. If the voltage is more than 1 millvolt, the absolute value of the deviation from 0 millivolts is weighted by a factor of 10.0. This arrangement reflects the fact that the ideal voltage in the stopband is 0.0 volts, the fact that a 1 millivolt ripple above 0 millivolts is acceptable, and the fact that a voltage above 1 millivolt in the stopband is not acceptable.

For this particular illustrative example, the number of fitness cases (61 and 35) in these two main bands are sufficiently close that no attempt was made to equalize the weight given to the differing numbers of fitness cases in these two main bands.

The deviation is considered to be zero for each of the 5 points in the interval above 1,000 Hz and below 2,000 Hz (i.e., the "don't care" band).

Hits are defined as the number of fitness cases for which the voltage is acceptable or ideal or that lie in the "don't care" band. Thus, the number of hits ranges from a low of 5 to a high of 101 for this problem. Note that the user-supplied problem-specific fitness measure drives the evolutionary process.

The second term of the fitness measure for the present example is the minimization of the area of the bounding rectangle of the circuit. The area is divided by 100,000 square units of area. The area is calculated from the physical locations of the components and wires in the laid-out circuit.

The area fitness term is much smaller in value than the frequency response term until the frequency response scores near or at 101 hits. For circuits not scoring the maximum 101 hits, fitness is the sum of the two terms. For individuals scoring the maximum 101 hits, fitness is only the area-based term. For all cases, the smaller the fitness value, the more acceptable the circuit. A fitness value of 0 is unattainable as no circuit may have zero area and as no actual analog filter may perfectly satisfy the frequency requirements of the example.

Some of the circuits that are randomly created for the initial random population and that are created by the crossover operation and the mutation operation in later generations cannot be simulated by SPICE. Circuits that cannot be simulated by SPICE are assigned a high penalty value of fitness ($10^8$). These circuits become the worst-of-generation circuits for each generation. The practical effect of this high penalty value of fitness is that these individuals are rarely selected to participate in genetic operations and that they quickly disappear from the population.

In one embodiment, if the netlist of a circuit has any of the following pathological characteristics, it is not passed along to SPICE for simulation, but, instead, is immediately assigned the high penalty value of fitness:

(1) the circuit contains a voltage source with both ends connected to the same node;

(2) the circuit contains an inductor with both ends connected to the same node;

(3) the circuit contains a component with an unconnected lead;

(4) the circuit contains a node with no DC path to ground that does not pass through a capacitor; or (5) the circuit has a pair of nodes with no path between them.

In one embodiment, if any of the following types of errors occur during the SPICE simulation, the simulation is stopped and the circuit is assigned the high penalty value of fitness:

(1) the number of memory allocation requests exceeds a prespecified upper limit of 2,000 requests;

(2) the amount of memory allocated exceeds a prespecified upper limit of 300 kilobytes (This limit indirectly acts as a time limit on the simulation);

(3) a floating-point error (e.g., division by zero, underflow, overflow, etc.) occurs, for example, during the simulation of bipolar junction transistors, floating-point overflows sometimes occurs or during the probe output setup, divisions by zero sometimes occur;

(4) a null (invalid) pointer appears in one of the matrix routines; or (5) an attempt is made to free a block of memory that has not previously been allocated.

It should be appreciated that the above fitness measure is illustrative of the many different factors and considerations that may be used to guide the evolutionary process. The above fitness measure is advantageous in that it is multi-objective and combines a term relating directly to the electrical functionality of the desired circuit (i.e., the suppressing or passing of certain frequencies) with a term relating to the physical placement and routing of the circuit on a printed circuit board, silicon wafer, or other substrate (i.e., the area of the bounding rectangle).

In more complex circuits, additional factors are appropriate. For example, in designing an amplifier, factors such as gain, bias, distortion, power consumption, power supply rejection ratio, and parts count are relevant. Factors such as slew rate and common mode rejection ratio are also relevant.

Control Parameters

For this illustrative problem involving genetic programming involving genetic programming, the population size, M, was 1,120,000. The percentage of genetic operations on each generation was 89% crossovers, 10% reproductions, and 1% mutations. The architecture-altering operations were not used on this illustrative problem. A maximum size of 600 points (for functions and terminals) was established for each circuit-constructing program tree.

The other parameters for controlling the runs of genetic programming are the default values: For example, see *Genetic Programming III: Darwinian Invention and Problem Solving* by John R. Koza, Forrest H Bennett III, David Andre, and Martin A. Keane, San Francisco, Calif.; Morgan Kaufmann Publishers, 1999.

Termination Criterion and Results Designation

The maximum number of generations, G, is set to an arbitrary large number (e.g., 501) and the run was manually monitored and manually terminated when the fitness of the best-of-generation individual appeared to have reached a plateau. The best-so-far individual is harvested and designated as the result of the run of genetic programming.

Parallel Computer System

Parallel processing is advantageous, but not required, for implementation of the present invention because of the uncoupled nature of the time-consuming fitness measurements of the genetic programming process. Parallelization can employed with almost 100% efficiency by genetic programming.

Relatively little time is expended on tasks such as the creation of the initial population at the beginning of the run of genetic programming and the execution of the genetic operations during the run (e.g., reproduction, crossover, mutation, and architecture-altering operations). The task of measuring the fitness of each individual in each generation of the evolving population is usually the dominant component of the computational burden.

These observations give rise to the most commonly used approach to parallelization of evolutionary algorithms, namely the asynchronous island model for parallelization. In this approach, the population for a given run is divided into semi-isolated subpopulations called demes. Each subpopulation is assigned to a separate processor of the parallel computing system. A variety of embodiments may be used to implement this approach. In one embodiment, the run begins with the random creation of the initial population and each individual in a subpopulation is randomly created locally on its local processor. Similarly, the genetic operations are performed locally at each processor. In particular, the selection of individuals to participate in crossover is localized to the processor. The time-consuming task of measuring the fitness of each individual is performed locally at each processor. Upon completion of a generation (or other interval), a relatively small percentage of the individuals in each subpopulation are probabilistically selected (based on fitness) for emigration from each processor to other nearby processors. The processors operate asynchronously in the sense that generations start and end independently at each processor and in the sense that the time of migration is not synchronized. In one embodiment, the immigrants to a particular destination wait in a buffer at their destination until the destination is ready to assimilate them. The immigrants are then inserted into the subpopulation at the destination processor in lieu of the just-departed emigrants. The overall iterative process then proceeds to the next generation. The guiding principle in implementing this parallel approach is always to fully utilize the computing power of each processor. Thus, for example, if a full complement of immigrants has not yet been received when a processor is ready to assimilate immigrants, one advantageous embodiment is to make up the deficiency in immigrants with randomly chosen copies of the just-departed emigrants. Similarly, if a processor receives two groups of immigrants from a particular other processor before it finishes its current generation, another advantageous embodiment is that the later immigrants may overwrite the previous immigrants.

The inter-processor communication requirements of migration are low because only a modest number of individuals migrate during each generation and because each migration is separated by a comparatively long periods of time for fitness evaluation.

Because the time-consuming task of measuring fitness is performed independently for each individual at each processing node, the asynchronous island model for parallelization delivers an overall increase in the total amount of work performed that is nearly linear with the number of independent processing nodes.

In one embodiment, the processing logic generates and executes a run on a parallel Beowulf-style computer system consisting of 56 Dec Alpha® 533 megahertz (MHz) processors with 64 megabytes of Random Access Memory (RAM) arranged in a two-dimensional 7×8 toroidal mesh with a DEC Alpha® computer as host. The DEC Alpha® processors communicate by way of a 100 megabit-per-second Ethernet. The so-called distributed genetic algorithm or island model for parallelization is used (*Genetic Programming III: Darwinian Invention and Problem Solving* by John R. Koza, Forrest H Bennett III, David Andre, and Martin A. Keane, San Francisco, Calif.; Morgan Kaufmann Publishers, 1999). That is, subpopulations (referred to herein as demes) are situated at each of the processing nodes of the system. The population size may be, for example, Q=20,000 at each of the D=56 demes, so that the total population size, M, is 1,120,000. The initial random subpopulations of generation zero are created locally at each processing node. Generations are run asynchronously on each node. After the genetic operations are performed locally on each node, four boatloads of emigrants, each consisting of B=2% (the migration rate used in one embodiment of the system) of the node's subpopulation (selected on the basis of fitness) are dispatched to each of the four toroidally adjacent processing nodes. The immigrants are assimilated into each destination processing node just after that node dispatches its immigrants to its neighboring nodes.

A 56-node parallel system with a 533-MHz DEC Alpha® microprocessor at each processing node operates at about 30 giga-hertz (GHz) in the aggregate. The DEC Alpha® processor has a total of four instruction units. Two of these are integer units and two are floating-point units. The instruction units are pipelined and able to produce a result on every clock cycle if the pipelines are kept full.

In one embodiment, the system is arranged as a computing cluster or Beowulf style system. The system has a host computer with a 533-MHz DEC Alpha® microprocessor with 64 megabytes of RAM (running the Linux operating system). The host contains a 4 giga-byte (GB) hard disk, video display, and keyboard. Each of the processing nodes of the system contains a 533-MHz DEC Alpha® microprocessor with 64 megabytes (MB) of RAM. There is no disk storage at the processing nodes. The processing nodes do not directly access input-output devices or the host's file system. The processing nodes also run the Linux operating system. The processing nodes are arranged in a toroidal network with each processing node communicating with four torodially adjacent neighbors. The communication between processing nodes is by means of 100 megabit-per-second Ethernet. A system such as this can be built with "Commodity Off The Shelf" (COTS) products.

Approximately half of 64 MB of RAM is available for the storage of the population (with the remainder housing the Linux operating system, the application software, and buffers for exporting and importing individuals, and other items of overhead). Memory is a potential constraining consideration for the genetic programming. For genetic programming, a population of 32,000 individuals, each occupying 1,000 bytes of RAM, can be accommodated with 32 MB of RAM. Using the commonly used one-byte-per-point method of storing individual program trees in genetic programming, each individual in the population can possess 1,000 points (functions or terminals). Each processing node may, therefore, accommodate a population of 32,000 1,000-point individuals. Depending on the intended size of individuals in the population for the user's particular application, it may be desirable to install more than 64 MB of RAM on each processing node.

The 100 megabit-per-second Ethernet is sufficient to handle the migration of individuals in most practical runs of genetic programming using the island model. Migration usually occurs at a rate of about 2% in each of four directions on each generation for each processing node. For example, if the population size is 32,000 at each processing node and 2% of the population migrates in each of four directions, then communication of 2,560 individuals (2.56 MB of data if each individual consists of 1,000 bytes) is required for every generation for each processing node. If one generation is processed every 15 minutes (900 seconds), this amounts to transmission of 2,844 bytes (about 23 kilobits) per second for each processing node. This inter-node communication does not tax a 100 megabit-per-second Ethernet. The Ethernet also easily handles the end-of-generation messages (usually involving less than 10,000 bytes each and occurring only once per generation) from each of the processing nodes to the host processor (as well as other less frequent messages).

The DEC Alpha® 164LX processor is available on a motherboard with the ATX form factor. A standard midtower-style case for a DEC Alpha® motherboard with the ATX form factor is available as an off-the-shelf commodity product. Such a case solves the electromagnetic emission problems associated with a 533 MHz microprocessor as well as the heat dissipation requirements associated with the Alpha® chip. The use of standard cases does not minimize the space occupied by the system; however, it provides a highly cost-effective solution to the emission and heat problems. The standard 230 watt power supplies (produced and priced as a commodity product) are similarly cost-effective. Each processing node has three fans (one for the Alpha® microprocessor chip, one for the power supply, and one for the case). The fan on the microprocessor contains a sensor that shuts down the node if it fails.

An Ethernet ("dumb") hub may be sufficient for a 10-node system. However, in a larger system, for example, (such as a 56-node system), Ethernet ("smart") switches are required in conjunction with the hubs. In one embodiment, a 16-port switch such as a Bay Networks BayStack 350T 16-port 10/100 BT Ethernet switch for every 15 processing nodes is suitable.

An uninterruptable power supply (UPS) providing 15 minutes of support for the system is advisable.

Linux is the most common operating system used on individual nodes of Beowulf-style parallel computer systems (whether the nodes are Alpha® processors, Pentium® processors, or other processors). The Linux operating system is remarkably robust. The relatively small size of the Linux operating system obviates the need for disk storage at each processing node. Since the main requirement for memory in genetic programming work is storage of the population and the relatively small genetic programming application, in one embodiment no hard disks are used at each processing node. In this embodiment, diskless booting of the processing nodes is handled by using the BOOTP protocol and configuring the host computer as a BOOTP server.

In one embodiment, the host computer receives the end-of-generation reports from each processing node. The host creates an output file containing statistics about the run and all pace-setting individuals. In this embodiment, this file is stored on the hard disk of the host computer. Since communication between the host processor and the processing nodes is by means of Ethernet, in one embodiment, the host computer need not be an Alpha® processor and need not employ the Linux operating system. In alternate embodiments, it is possible to have a heterogeneous mixture of processing nodes with different types of computers, running different operating systems, at various nodes in the overall system.

Figure 25:
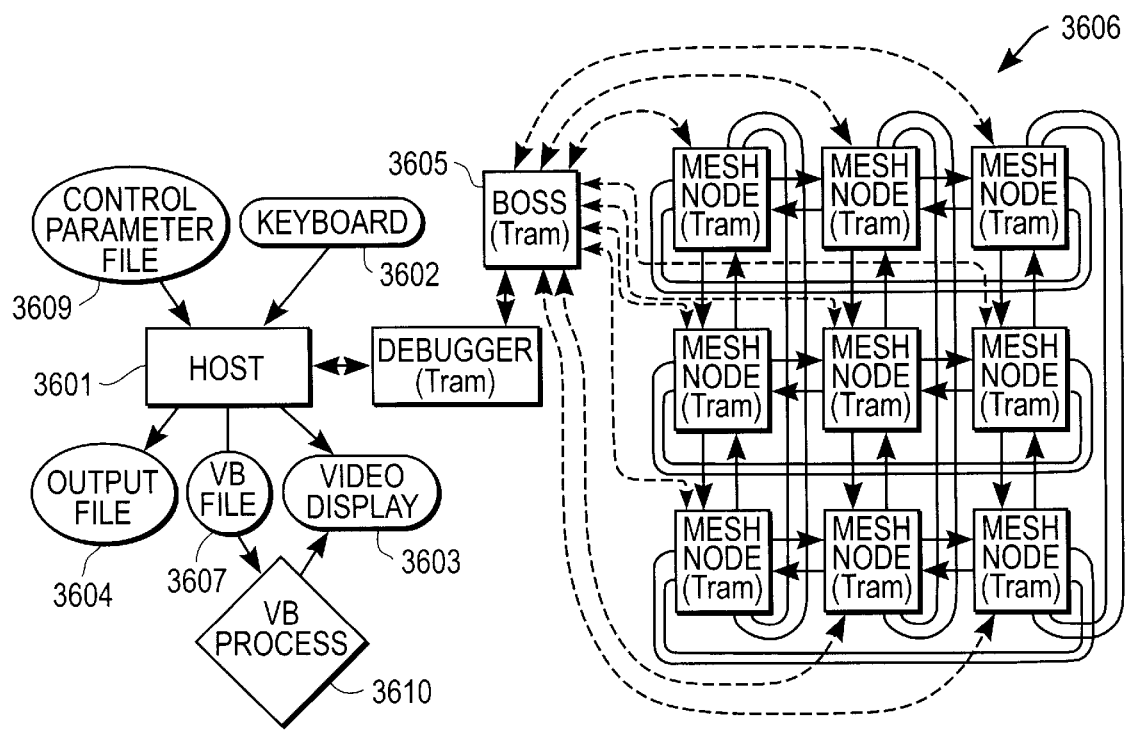
FIG. 25 illustrates the parallel genetic programming system.
Figure 26:
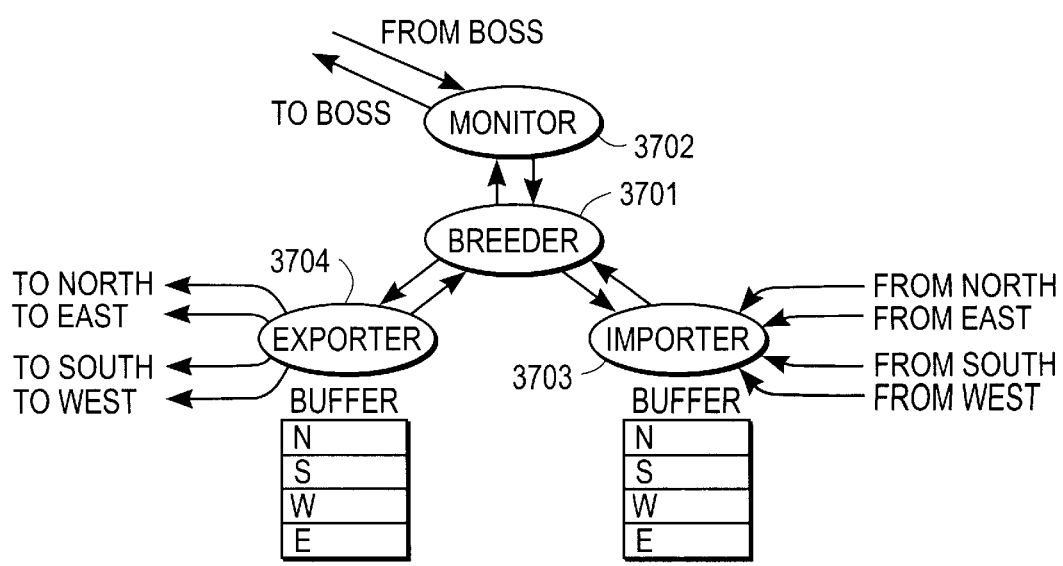
FIG. 26 illustrates the four processes resident on each node of one embodiment of a parallel genetic programming system.

The physical system used in one implementation of parallel genetic programming uses a DEC Alpha® processor type computer as a host and a network of processing nodes. FIG. 25 shows the various elements of the system. These elements are arranged in an overall system consisting of the following:

(1) the host computer consisting of a keyboard 3602, a video display monitor 3603, and a large disk memory 3604, (2) a processor 3605 containing the central supervisory process (the Boss process), and (3) the 56 processors 3606 of the parallel network, each running a Monitor process, a Breeder process, an Exporter process, and an Importer Process.

A DEC Alpha® computer 3601 is the host and acts as the file server for the overall system. The "Boss Node" 3605 contains the central supervisory process for running genetic programming.

Results for the Lowpass LC Filter

The results of a run of genetic programming on the problem of designing a lowpass LC filter will illustrate the principles behind the automated design process described herein.

Description of a Run of the Lowpass Filter Problem

A run of genetic programming for this illustrative problem starts with the random creation of an initial population of 1,120,000 circuit-constructing program trees (each consisting of one result-producing branch) composed of the functions and terminals identified above and in accordance with the constrained syntactic structure described above.

For each of the 1,120,000 program trees in the population, the sequence of functions in the circuit-constructing program tree is applied to the initial circuit for this problem (FIG. 3) in order to create a fully developed circuit. The netlist for the resulting circuit is then determined. This netlist is wrapped inside an appropriate set of SPICE commands and the circuit is then simulated using the modified version of SPICE. The SPICE simulator returns information from which the first fitness term and the number of hits for the circuit can be computed. Then, the second fitness term for area of the bounding rectangle of the circuit is obtained from the physical locations of the components of the laid-out circuit.

The initial random population of a run of genetic programming is a blind random search of the search space of the problem. As such, it provides a baseline for comparing the results of subsequent generations.

The worst individual circuit-constructing program trees from generation 0 create circuits which are so pathological that the SPICE simulator is incapable of simulating them. These circuits are assigned a high penalty value of fitness (i.e., $10^8$).

When the circuit-constructing program tree for the best-of-generation circuit of generation 0 (FIG. 13) is executed, it yields a fully laid-out circuit as described in reference to FIG. 14 above. All the nonmodifiable elements of the original test fixture of the initial circuit of FIG. 3 remain in the fully developed and laid-out circuit. In addition, the circuit of FIG. 14 complies with the requirement that wires cannot cross on a particular layer of a silicon chip or on a particular side of a printed circuit board and with the requirement that there will be a wire connecting 100% of the leads of all components.

The best-of-generation circuit of generation 0 (FIG. 14) scores 53 hits and has a fitness of 57.961037. The area-based fitness term is 0.003710.

Figure 15:
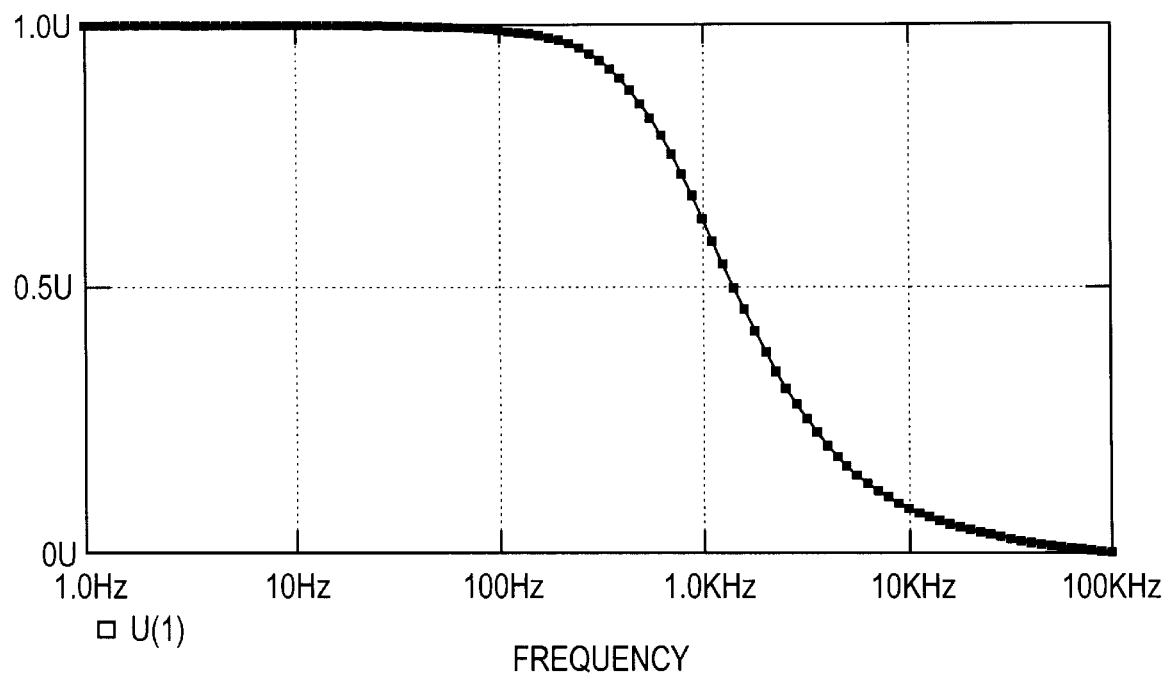
FIG. 15 illustrates the frequency response of the best-of-run circuit of generation 0 for FIG. 14.

FIG. 15 shows the frequency behavior of the FIG. 14 circuit. The horizontal axis represents the five decades of frequency on a logarithmic scale. The vertical axis represents linear voltage. The behavior of the FIG. 14 circuit does not meet the original high-level design specifications for a lowpass filter. The behavior of this circuit in the frequency domain in the interval between 1 Hz and 100 Hz is close to the required 1 volt (accounting for most of the 51 hits scored by this individual). However, the voltages produced between 100 Hz and 1,000 Hz are considerably below the minimum of 970 millivolts required by the design specification (in fact, by hundreds of millivolts as one approaches 1,000 Hz). Moreover, the voltages produced above 2,000 Hz are, for the most part, considerably above the minimum of 1 millivolt required by the design specification (by hundreds of millivolts in most cases). Nonetheless, the behavior of this noncompliant circuit from generation 0 bears some resemblance to that of a lowpass filter in that the voltage is near 1 volt for the first two decades of frequency and the voltage is near zero for a few sample points at higher frequencies.

Generation 1 (and each subsequent generation of the run) is created from the population at the preceding generation by performing reproduction, crossover, and mutation on individuals (or pairs of individuals in the case of crossover) selected from the population on the basis of fitness.

Figure 16:
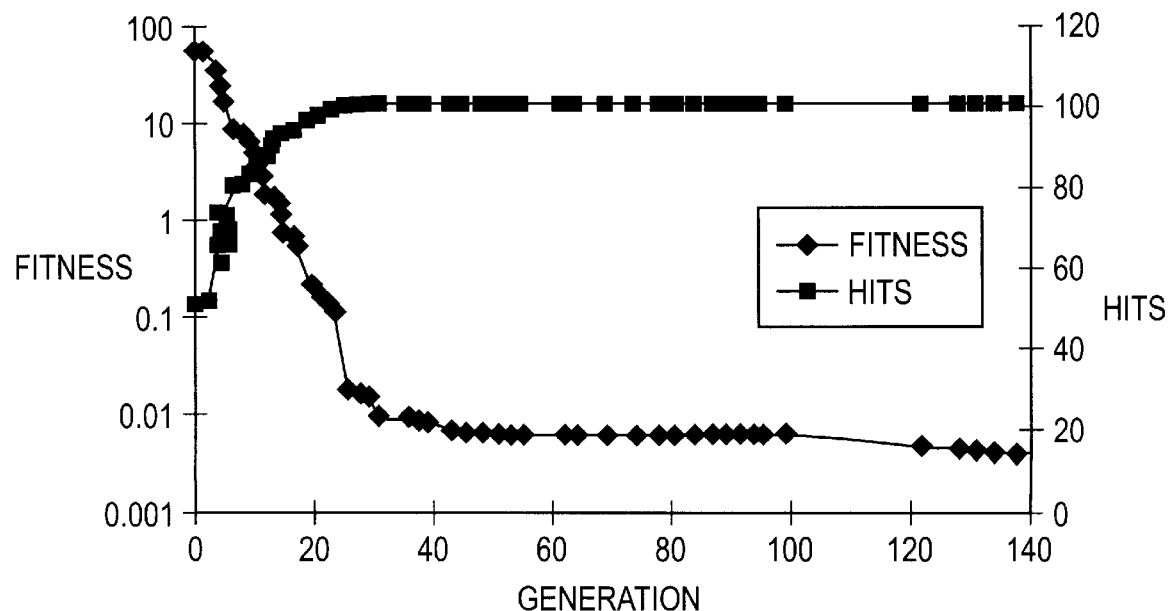
FIG. 16 illustrates the relationship, by generation, between the number of hits and fitness for the best-of-run circuits.

Both the average fitness of all individuals in the population and the fitness of the best individual in the population improve over successive generations, as shown in FIG. 16. FIG. 16 shows the total fitness value of the best-of-generation circuits and the number of hits of the frequency term of the fitness value by generation. The left-vertical axis is a logarithmic scale of the (falling) curve of the fitness of the best-of-generation individual circuits. The right-vertical axis is the rising curve showing the number of hits of the frequency term of the fitness value for the best-of-generation individual circuits. The maximum number of hits of the frequency term (101) is reached in generation 25.

Seventy-two percent of the programs of generation 0 for this problem produce circuits that cannot be simulated by SPICE. The unsimulatable programs are the worst-of-generation programs for each generation and receive the high penalty value of fitness ($10^8$). However, the percentage of unsimulatable programs drops to 31% by generation 1, 16% by generation 2, 15% by generation 3, and 7% by generation 10. In other words, the vast majority of the offspring created by Darwinian selection and the crossover operation are simulatable after just a few generations.

In trying to automatically create the topology, component sizing, placement, and routing of electronic circuits using genetic programming, one of the major threshold concerns was whether any significant number of the randomly created circuits of generation 0 in this highly epistatic search space would be simulatable. A second concern was whether the crossover operation would create any significant number of simulatable circuits. Neither of these concerns materialized with genetic programming on this problem. Darwinian selection apparently is very effective in quickly steering the population on successive generations into the portion of the search space where parents can beget simulatable offspring by use of the crossover operation.

Figure 19:
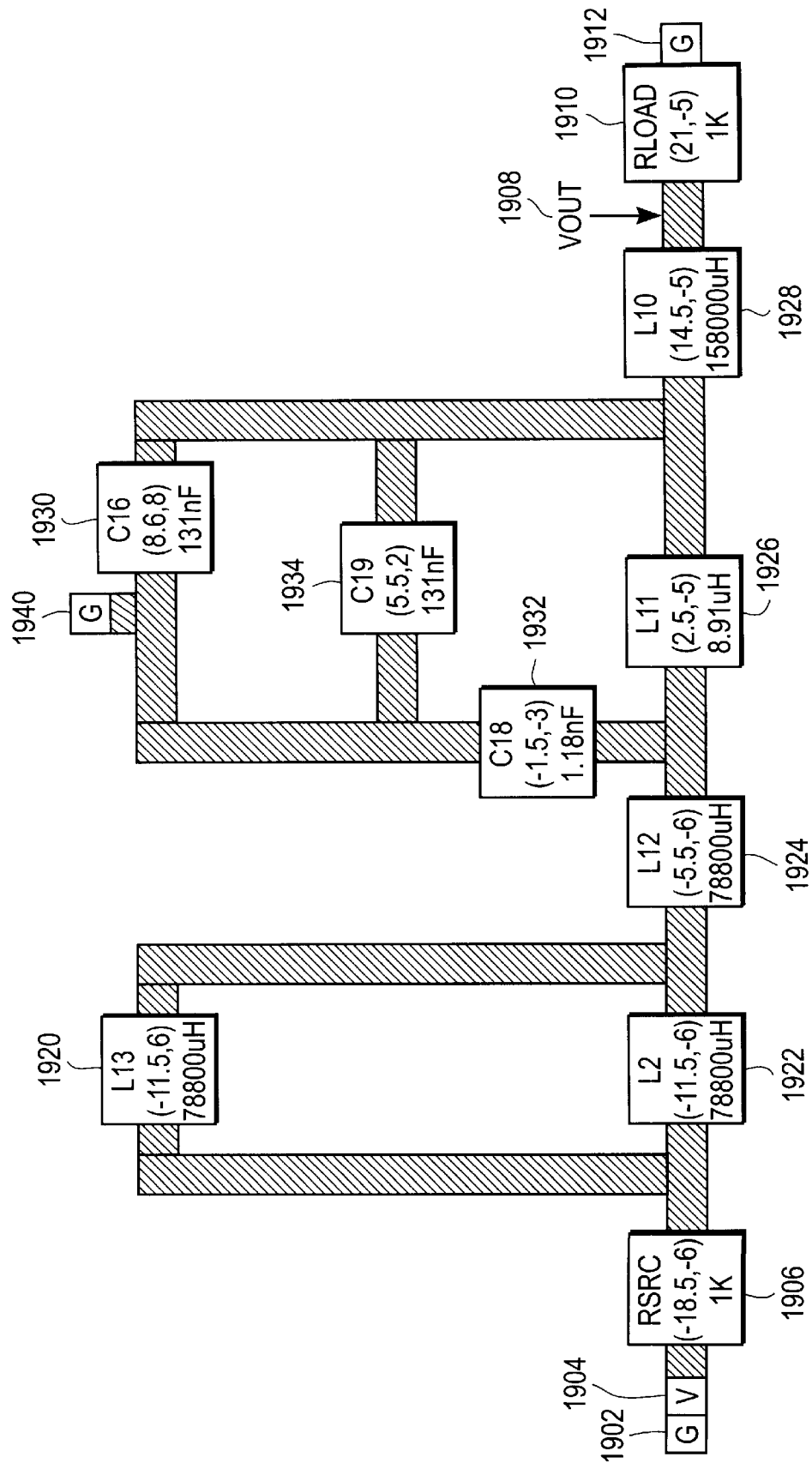
FIG. 19 illustrates the best-of-run circuit of generation 8.

The best individual program tree of generation 8 is shown in FIG. 19. This best-of-generation circuit has 82 hits, has a fitness of 9.731077 of which 0.608138 is contributed by the area-based fitness term. The result-producing branch of the circuit-constructing program tree that develops into the circuit of FIG. 19 contains 165 points. The FIG. 19 circuit has five inductors (1920, 1922, 1924, 1926, and 1928) and three capacitors (1930, 1932, and 1934). Incoming signal V 1904 passes through source resistor RSRC 1906 and is fed into a parallel-series combination of inductors L13 (1920), L2 (1922), and L12 (1924). This combination is equivalent to one inductor. In a lowpass filter, capacitors connected to ground are called shunts and the inductors positioned in series between the source resistor and the load resistor are called series inductors. When all the parallel and series combinations of like components are combined, the FIG. 19 circuit is equivalent to a first series inductor (combining L13 (1920), L2 (1922), and L12 (1924)), a first capacitive shunt (C18 (1932)) a second series inductor (L11 (1926)), a second capacitive shunt (combining C16 (1930) and C19 (1934)), and a third series inductor (L10 (1928)). The combined FIG. 19 circuit is a two-rung ladder lowpass filter.

Figure 17:
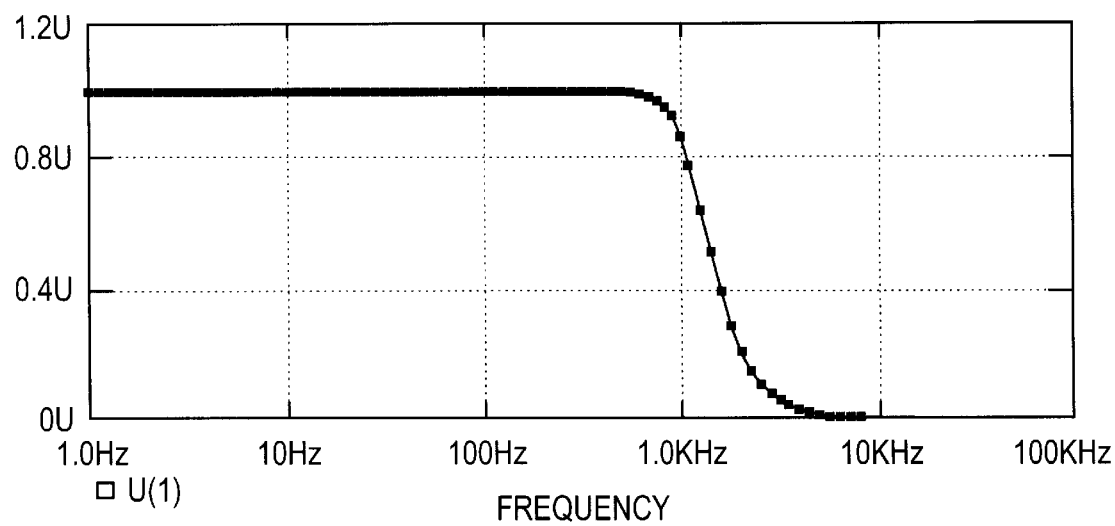
FIG. 17 illustrates the frequency domain behavior for the best-of-run circuit of generation 0.

FIG. 17 illustrates the frequency response of the FIG. 19 circuit of generation 8. The horizontal axis represents the five decades of frequency on a logarithmic scale and the vertical axis represents linear voltage. This circuit delivers 1 volt for all frequencies up to about 900 Hz and about 0 volts for all frequencies above 10,000 Hz. However, there is a leisurely transition from the passed to the blocked frequencies.

Figure 20A:
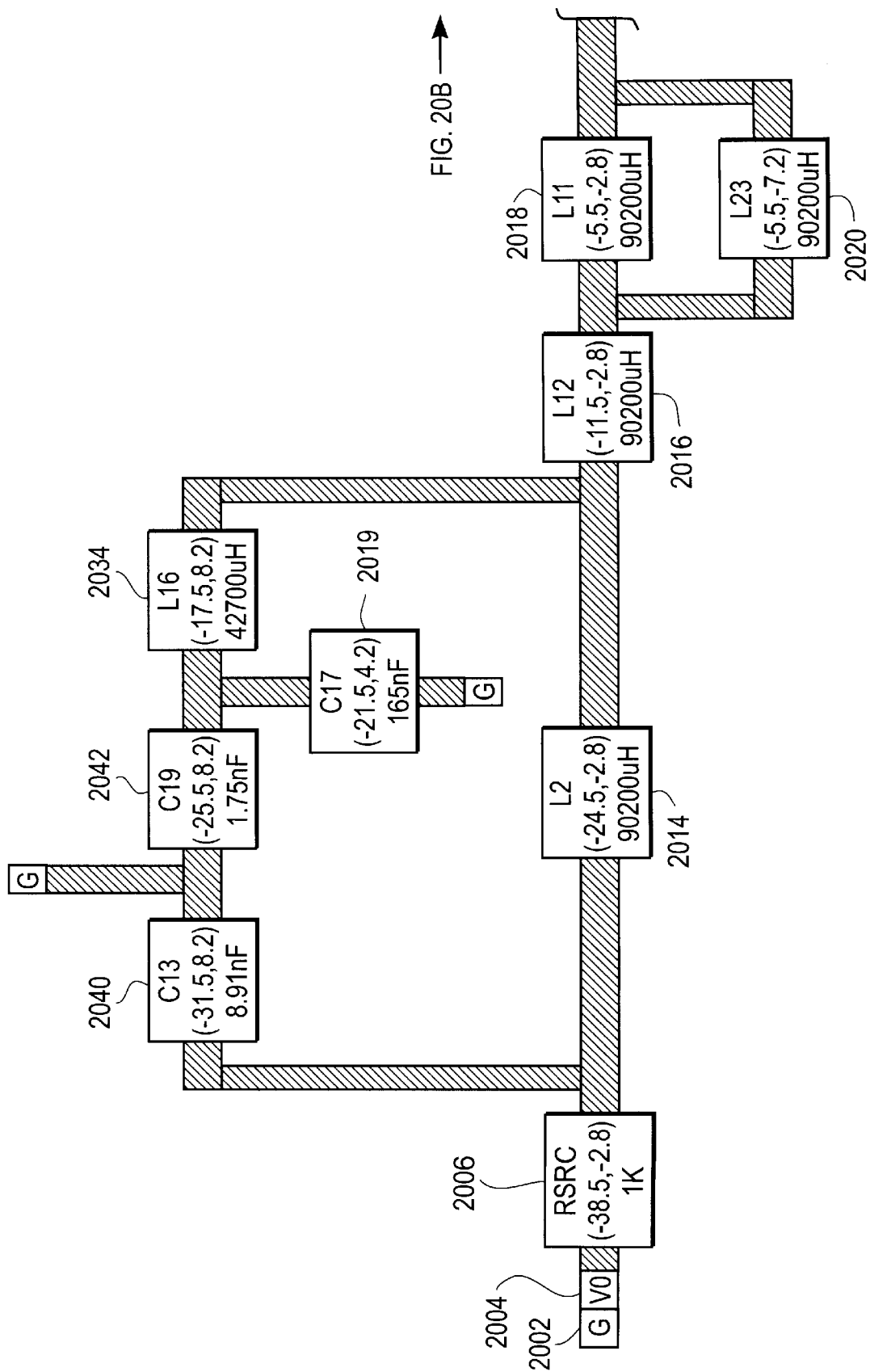
FIGS. 20A and 20B illustrate the best-of-run circuit of generation 25.
Figure 20B:
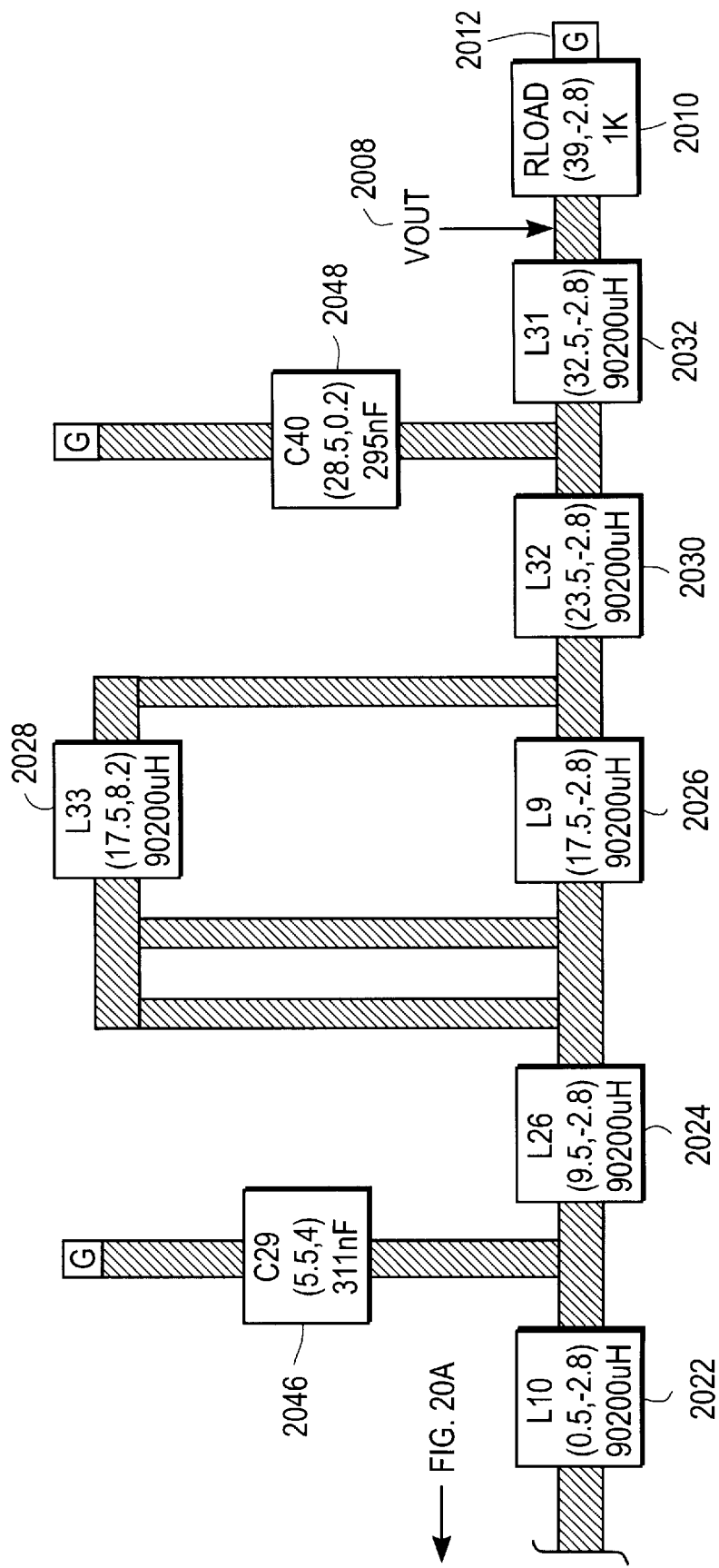

The first circuit scoring 101 hits (maximum hits for the frequency response) occurred in generation 25. FIGS. 20A and 20B illustrate the best-of-generation circuit of generation 25. This circuit has a fitness value of 0.01775. This fitness value is represented wholly by the area-bounded fitness term. The result-producing branch of the circuit-constructing program tree that develops into the circuit of FIGS. 20A and 20B circuit-constructing program tree contains 548 points. The circuit occupies an area of 1775.2 units.

The FIGS. 20A and 20B circuit comprises five capacitors (2040, 2042, 2044, 2046, and 2048) and eleven (11) inductors (2014, 2016, 2018, 2020, 2022, 2024, 2026, 2028, 2030, 2032, and 2034). Incoming signal V 2004 passes through source resistor RSRC 2006, series combination (L2 (2014) and L12 (2016)), parallel combination (L11 (2018) and L23 (2020)), L10 (2026), L26 (2024), parallel combination (L9 (2026) and L33 (2028)), L32 (2030), and L31 (2032). There are four shunts to ground G, C13 (2040), C29 (2046), C40 (2048), and the parallel combination C17 (2044), C19 (2042) and L16 (2034). The FIGS. 20A and 20B circuit occupies a considerable area.

Figure 18:
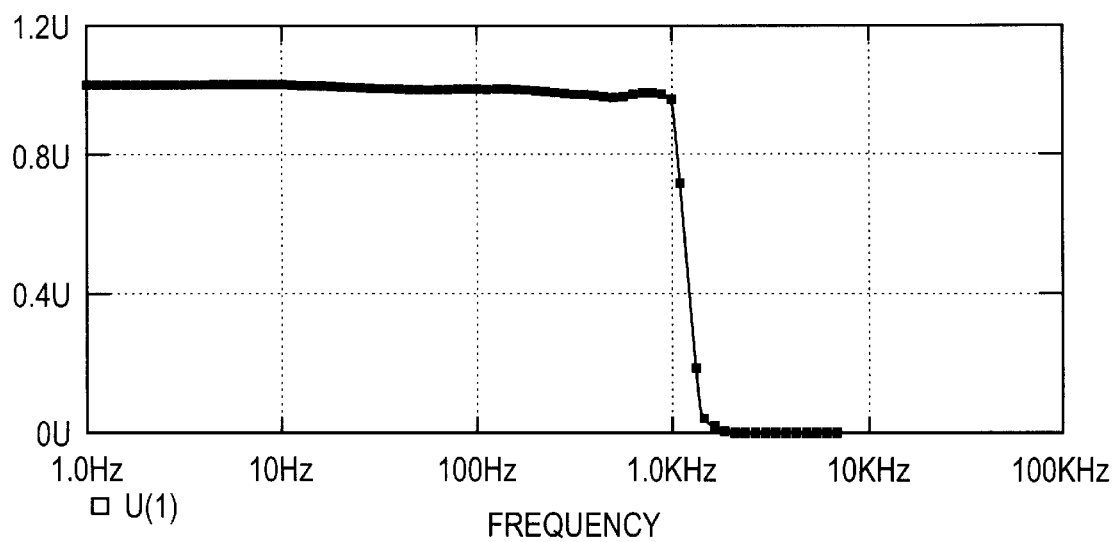
FIG. 18 illustrates the frequency domain behavior for the best-of-run circuit of generation 8.

FIG. 18 illustrates the frequency response of the FIGS. 20A and 20B circuit. The circuit delivers approximately 1 volt for all frequencies up to about 1,000 Hz and approximately 0 volts for all frequencies above 2,000 Hz. The transition from the passband to the stopband is very sharp. The circuit performs as a lowpass filter.

Thus, the circuit of FIGS. 20A and 20B is 100%-compliant with the frequency-based term of the fitness measure, but it occupies an excessive amount of area. In the remainder of the run, the amount of area is progressively reduced.

Figure 21A:
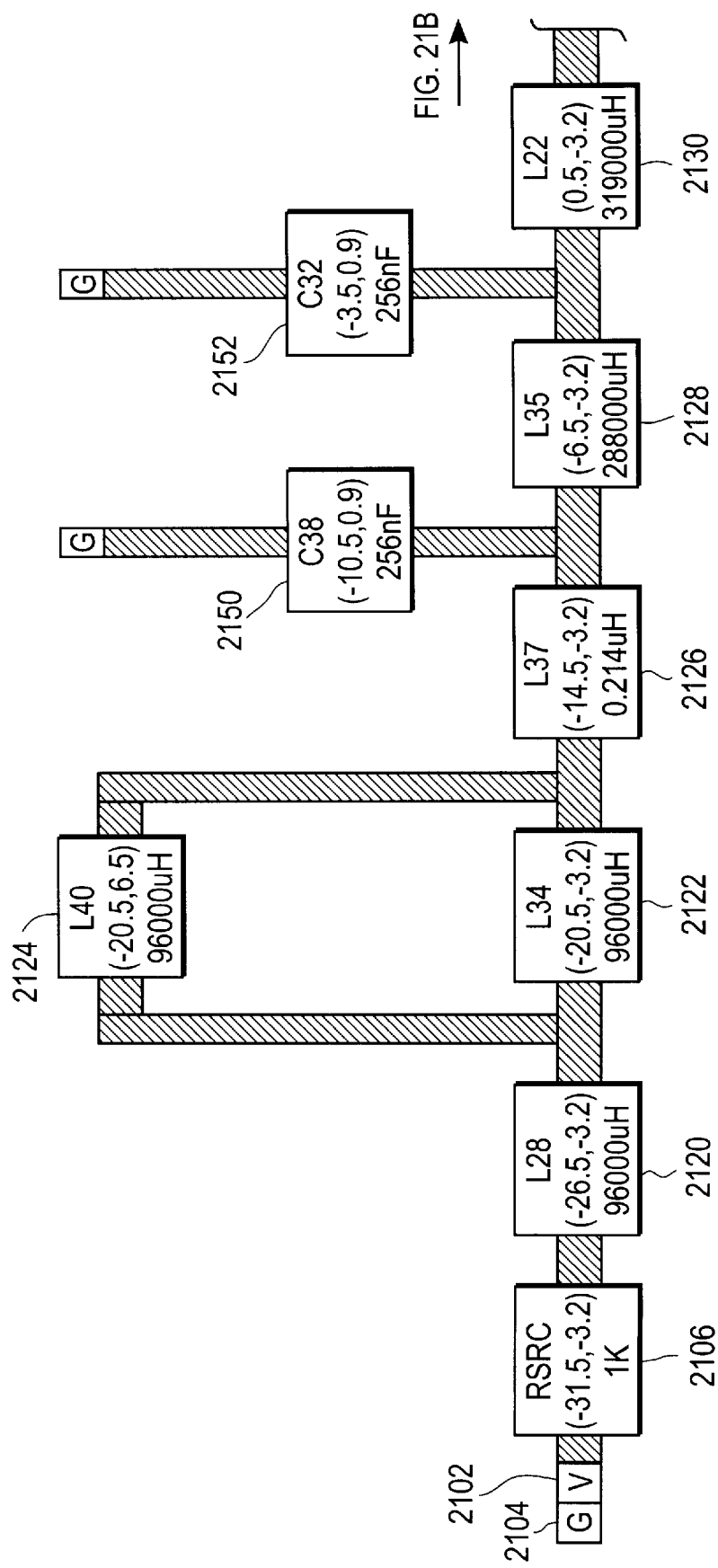
FIGS. 21A and 21B illustrate the best-of-run circuit of generation 30.
Figure 21B:
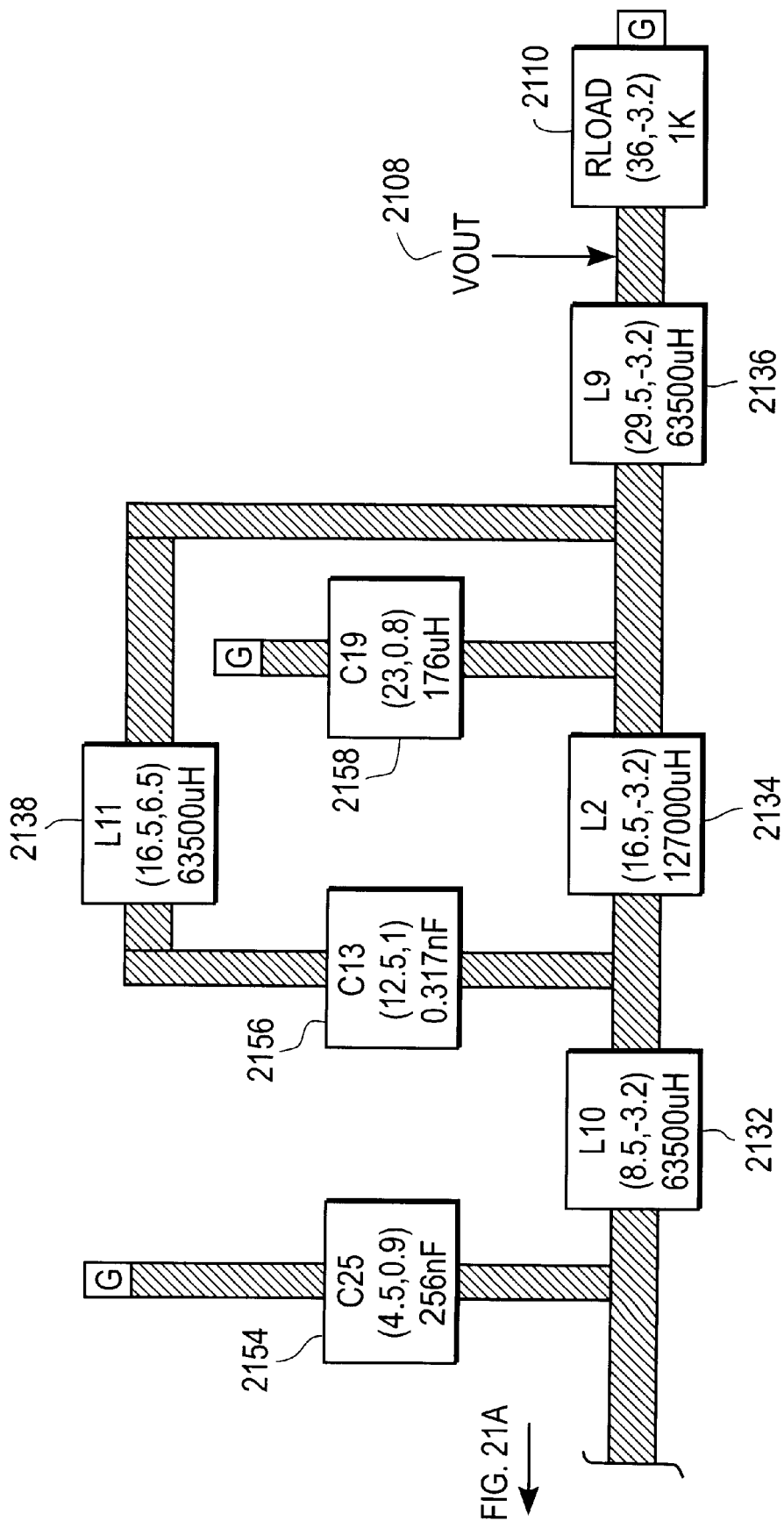

FIGS. 21A and 21B illustrates the best-of-generation circuit for generation 30. The FIG. 21 circuit scores 101hits and has a fitness of 0.00950. The circuit has 10 inductors (2120, 2122, 2124, 2126, 2128, 2130, 2132, 2134, 2136, and 2138) and five capacitors (2150, 2152, 2154,2156, and 2158).

Figure 23:
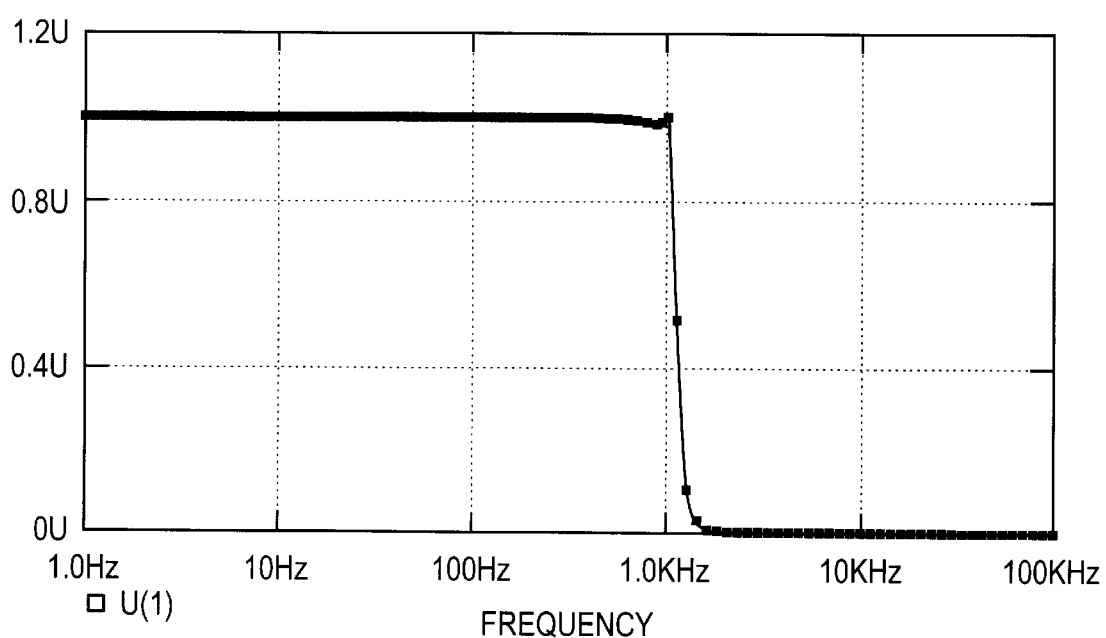
FIG. 23 illustrates the frequency domain behavior for the best-of-run circuit of generation 30.

The FIGS. 21A and 21B circuit is 100% compliant, contains 15 components and occupies an area of 950.3. The FIGS. 21A and 21B circuit occupies an area that is 54% the size of the 16-component circuit of generation 25 (FIGS. 20A and 20B). FIG. 23 illustrates the frequency response of the FIGS. 21A and 21B circuit.

Figure 22:
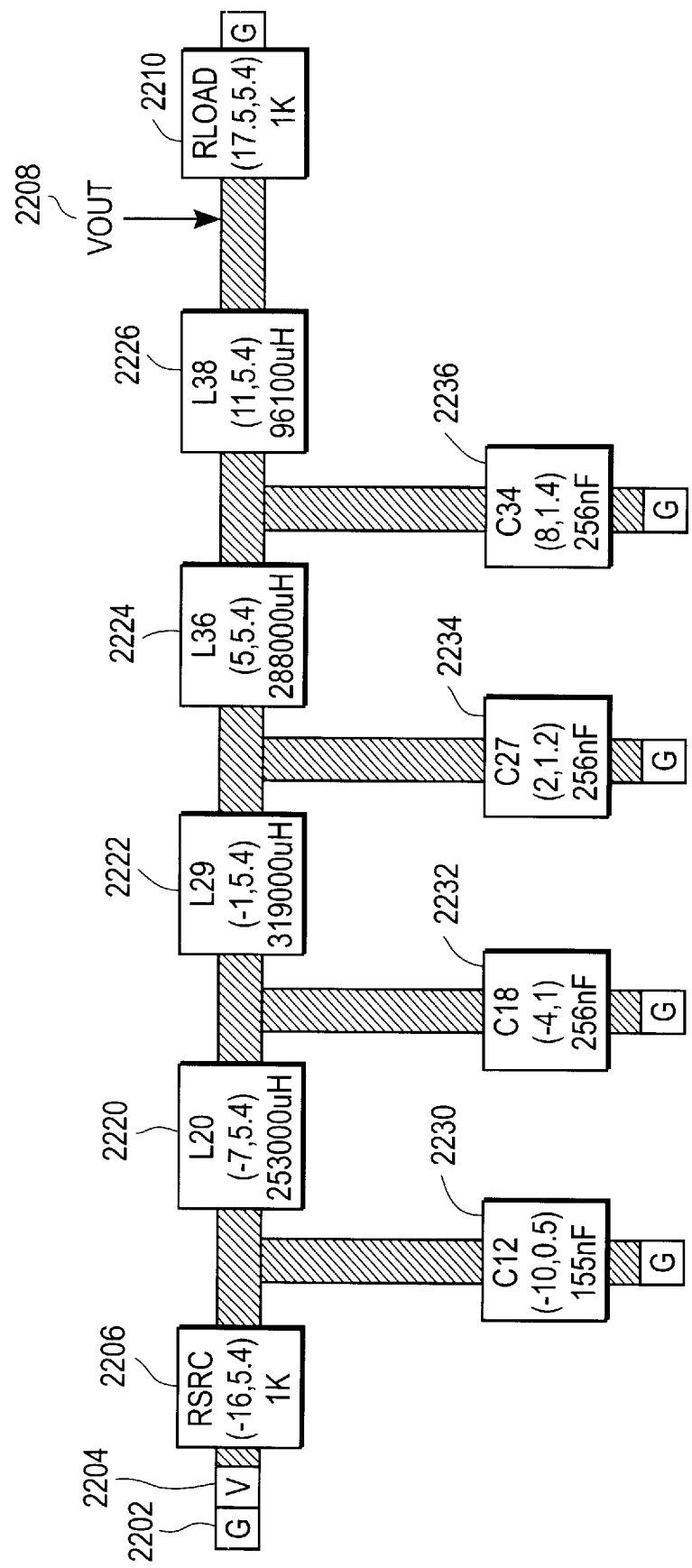
FIG. 22 illustrates the best-of-run circuit of generation 138.

FIG. 22 illustrates the best-of-generation, 100% compliant, eight-component circuit of generation 138. The FIG. 22 circuit has 101 hits, a fitness value of 0.00359, and occupies an area of 359.4 units. The result-producing branch of the FIG. 22 circuit-producing program tree contains 463 points. The circuit is 20% of the area of the 100%-compliant best-of-generation circuit of generation 25 (FIGS. 20A and 20B).

Figure 24:
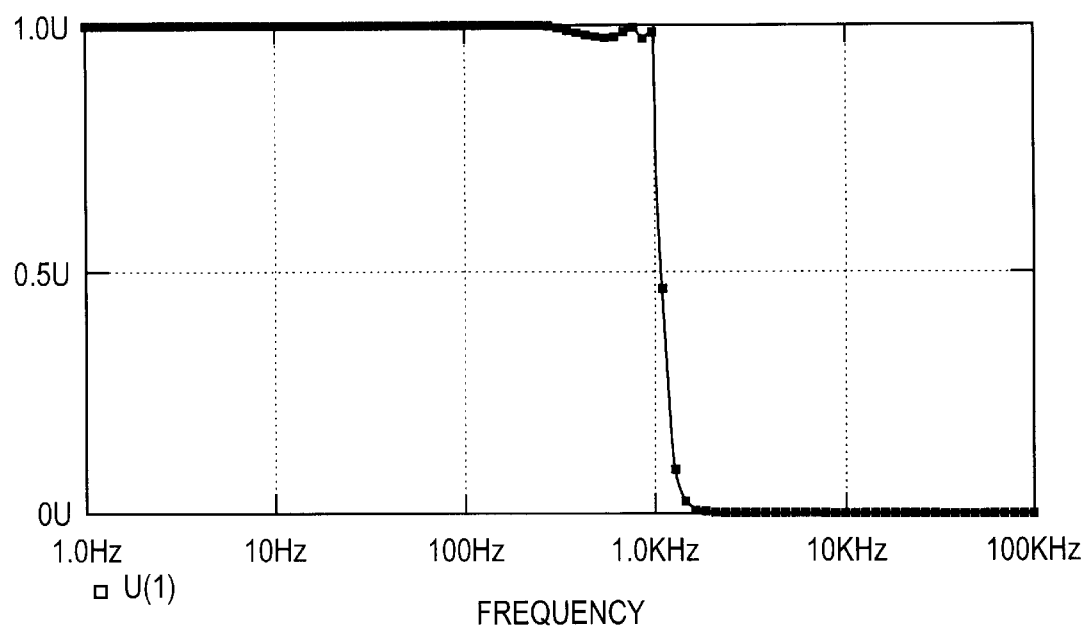
FIG. 24 illustrates the frequency domain behavior for the best-of-run circuit of generation 138.

The FIG. 22 circuit has four inductors (2220, 2222, 2224, and 2226) and four capacitors (2230, 2232, 2234, and 2236). There are no series or parallel combinations within the circuit. The FIG. 22 circuit is a four-run ladder lowpass filter. FIG. 24 illustrates the frequency response of the FIG. 22 circuit.

Table 1 shows the number of capacitors, number of inductors, number of capacitor or inductor shunts to ground, the area in terms of the number of square units of the bounding rectangle, the frequency-based term of the fitness value for the 101 hits, and the total fitness value for the three best-of-generation circuits from generation 25 (FIGS. 20A and 20B), generation 30 (FIGS. 21A and 21B), and generation 138 (FIG. 22). (The frequency-based term is shown for reference only as it is not used in defining the total fitness value of circuits that score 101 hits.)

TABLE 1

Comparison of three best-of-generation circuits scoring 101 hits

| Generation | Number of Capacitors | Number of Inductors | Number of Shunts | Area | Frequency-Based Term | Fitness |
|---|---|---|---|---|---|---|
| 25 | 5 | 11 | 4 | 1775.2 | 0.264698 | 0.01775 |
| 30 | 10 | 5 | 4 | 950.3 | 0.106199 | 0.00950 |
| 138 | 4 | 4 | 4 | 359.4 | 0.193066 | 0.00359 |

As can be seen in Table 1, all three of these 100%-compliant best-of-generation circuits have the same number (four) of capacitive or inductive shunts to ground. That is, they solve the problem with more or less the same general approach (i.e., a ladder filter topology). However, the best-of-generation circuits from the two earlier generations (25 (FIGS. 20A and 20B) and 30 (FIGS. 21A and 21B)) each have a total of 16 inductors and capacitors, while the best-of-run circuit from generation 138 (FIG. 22) has only eight. Moreover, the best-of-run circuit from generation 138 (FIG. 22) has only one fifth of the area of the best-of-generation circuit from generation 25 (FIGS. 20A and 20B).

When continuing the run of genetic programming after the emergence of the first 100%-compliant individual generation 25 (FIGS. 20A and 20B), additional 100%-compliant individuals often emerge. These additional solutions frequently have radically different topologies as well as different sizing, placement and routing. As the run continues, the quest for ever better values of fitness continues and even more fit (100%-compliant) individuals are often created. When a parallel computing system with demes is used, there are often especially pronounced differences between the harvested solutions from the same run (as contrasted with a serial computer implementation without demes).

Therefore, the embodiments allow the topology, sizing, placement, and routing of a useful electronic circuit that satisfies the user's design goal to be automatically created.

This run involving a population of 1,120,000 required $1.55 \times 10^8$ fitness evaluations and took 28.4 hours ($1.02 \times 10^5$ seconds) on the 56-node parallel computer system described above. The 56 533-MHz processors operate at an aggregate rate of $2.98 \times 10^{10}$ Hz, so that the run consumes a total of $3.04 \times 10^{15}$ computer cycles (about 3 petacycles).

Approximately 28 times more computer time is required by genetic programming to automatically create the circuit's topology, sizing, placement, and routing than is required to merely create the circuit's topology and sizing. The basis for this rough estimate is as follows. In *Genetic Programming III*, by Koza, John R., Bennett III, Forrest H., Andre, David, and Keane, Martin A., San Francisco, Calif.: Morgan Kaufmann, 1999, genetic programming automatically created the topology and sizing (but not placement and routing) of a lowpass filter circuit with the same specification as used herein. Based on 64 runs of the simpler version of this problem with a population size of 30,000, a computational effort of E=4,683,183 (30,000×43 generations×3.63 runs) was required to yield a solution with 99% probability. Although 30,000 may or may not be the optimal population size or that 4,683,183 fitness evaluations is the minimal computation effort required for the simpler form of this problem, 4,683,183 fitness evaluations is the best available estimate of the computational effort for the simpler form of this problem (i.e. with placement and routing).

Each fitness evaluation (in both the simpler form of the problem and the run described involving automatic creation of the topology, sizing, placement, and routing) entails a SPICE simulation consuming an average of $2.3 \times 10^7$ cycles. Thus, the simpler form of this problem can be solved with a total of $1.08 \times 10^{14}$ cycles with 99% probability.

Although 1,120,000 may or may not be the optimal population size for this version of this problem, $3.04 \times 10^{15}$ cycles is used as the best available estimate of the computational effort for the more difficult version of this problem. With these qualifications, the automatic creation of the topology, sizing, placement, and routing of a lowpass filter takes roughly about 28 times more computer cycles than the automatic creation of merely the circuit's topology and sizing.

Example of Run of Bandstop Filter Problem

As a second example, the results of a run are shown calling for the automatic creation of the topology, component sizing, placement, and routing of a bandstop filter. A bandstop filter stops all frequencies in a specified range while passing all other frequencies. This problem differs from the lowpass filter described above in that there are two layers (in addition to the main layer) of the printed circuit board, silicon chip, or substrate to which a via can potentially be run.

Figure 27:
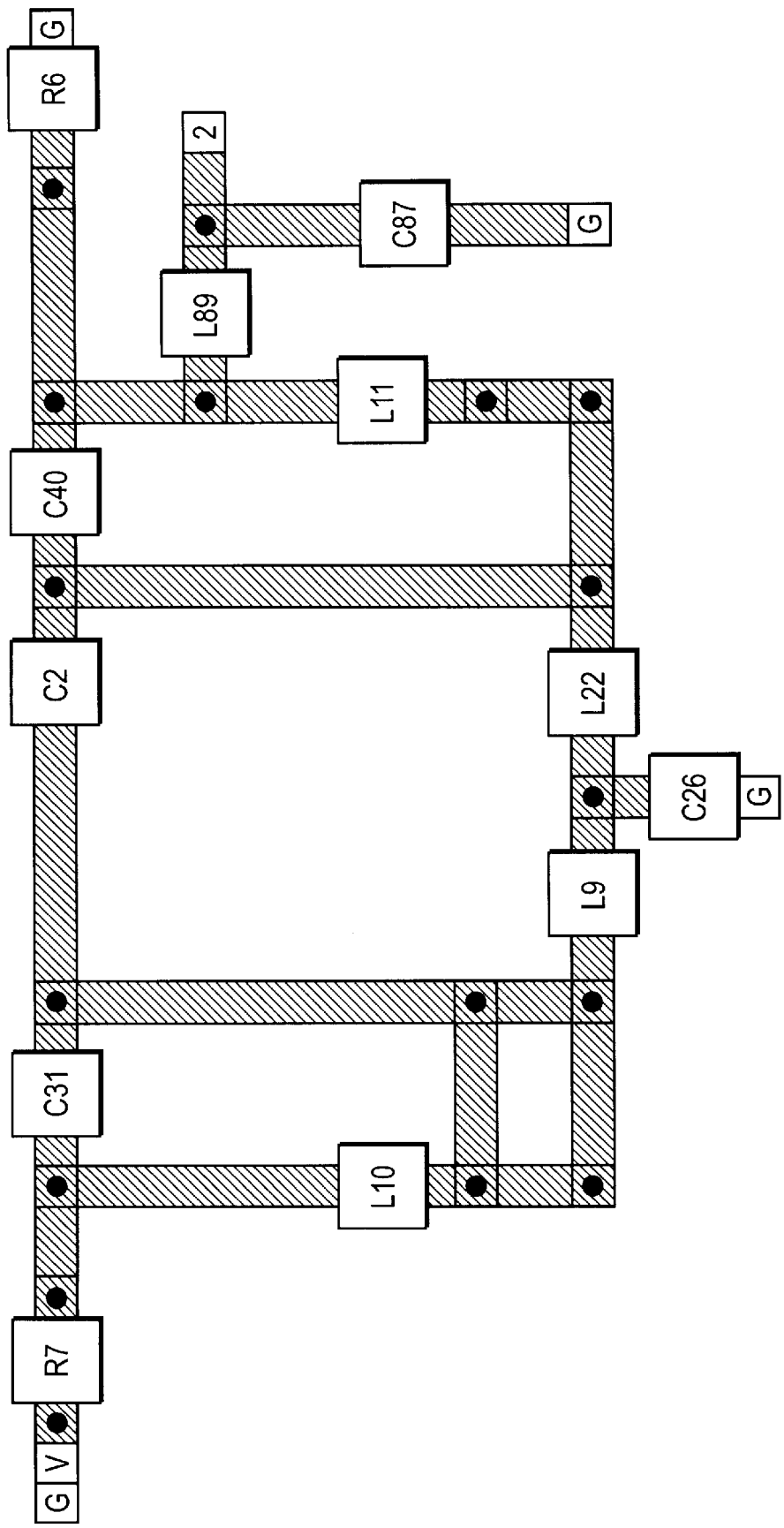
FIG. 27 shows the evolved best-of-generation circuit from generation 219 for the bandstop filter problem.

FIG. 27 shows the evolved best-of-generation circuit from generation 219 of the bandstop filter problem. This circuit has a fitness value of 0.011073 and is 100%-compliant in that it scores 101 hits (out of 101). The circuit has five capacitors and five inductors (in addition to the source resistor R7, the load resistor R6, and the source V).

Table 2 shows the list of components in the evolved best-of-run bandstop filter from generation 219, the physical X-location, the physical Y-location, and the component sizing for each of the components (other than wires). In addition to the 13 components mentioned above, the circuit also has 13 resistive traces (listed as "RT" in table). These resistive traces correspond to wires and have very small, but non-zero resistances as their component values.

TABLE 2

List of components, their physical location, and component values for evolved bandstop filter from generation 219.

| Component | Physical X-location | Physical Y-location | Component sizing |
|---|---|---|---|
| V0 | 3 | 0 | SIN(0 2 166 00) AC |
| RT1 | 4 | 5 | 1.00e−12K |
| C2 | 6 | 7 | 6.10e+02nF |
| RT3 | 8 | 1 | 1.00e−12K |
| R1 | 1 | 0 | 1.00e+00K |
| R7 | 3 | 4 | 1.00e+00K |
| L9 | 9 | 10 | 8.75e+04uH |
| L10 | 11 | 5 | 2.00e+05uH |
| L11 | 64 | 37 | 4.10e+05uH |
| L22 | 10 | 16 | 2.05e+05uH |
| C26 | 10 | 0 | 7.14e+02nF |
| RT29 | 30 | 6 | 1.00e−12K |
| RT30 | 9 | 31 | 1.00e−12K |
| C31 | 6 | 5 | 1.28e+02nF |
| RT35 | 30 | 11 | 1.00e−12K |
| RT36 | 30 | 9 | 1.00e−12K |
| RT37 | 11 | 31 | 1.00e−12K |
| RT38 | 16 | 7 | 1.00e−12K |
| RT39 | 16 | 34 | 1.00e−12K |
| C40 | 7 | 8 | 9.16e+01nF |
| RT42 | 36 | 34 | 1.00e−12K |
| RT43 | 36 | 37 | 1.00e−12K |
| RT70 | 64 | 8 | 1.00e−12K |
| RT86 | 77 | 2 | 1.00e−12K |
| C87 | 77 | 0 | 5.04e+02nF |
| L89 | 64 | 77 | 1.01e+05uH |

Example of Run of Bandpass Filter Problem

As a third example, the results of a run calling for the automatic creation of the topology, component sizing, placement, and routing of a bandpass filter are shown. A bandpass filter passes all frequencies in a specified range while stopping all other frequencies.

Figure 28:
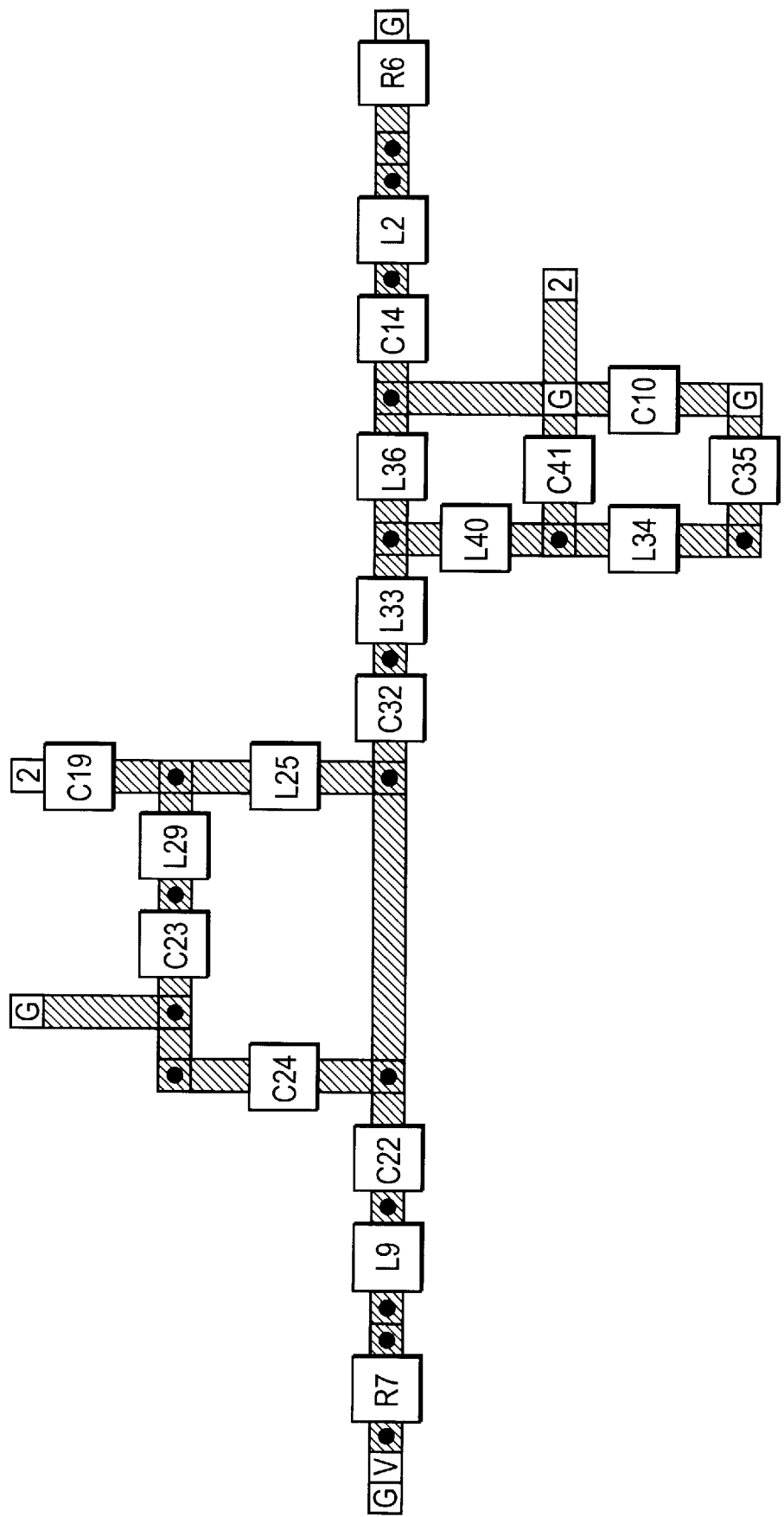
FIG. 28 illustrates an evolved best-of-run bandpass filter from generation 182 for the bandpass filter problem.

FIG. 28 shows the evolved best-of-generation circuit from generation 182. This circuit has a fitness value of 0.020305 and is 100%-compliant in that it scores 101 hits (out of 101). The circuit has nine capacitors and eight inductors (in addition to the source resistor, the load resistor, and the source). This problem differs from the lowpass filter described above in that there are two layers (in addition to the main layer) of the printed circuit board, silicon chip, or substrate to which a via can potentially be run.

Table 3 shows the list of components in the evolved best-of-run bandpass filter from generation 182, the physical X-location, the physical Y-location, and the component sizing for each of the components (other than wires). In addition to the 20 components mentioned above, the circuit also has seven resistive traces corresponding to wires with very small, but non-zero resistances.

TABLE 3

List of components, their physical location, and component values for evolved best-of-run bandpass filter from generation 182.

| Component | Physical X-location | Physical Y-location | Component sizing |
|---|---|---|---|
| V0 | 3 | 0 | SIN(0 2 166 00) AC2 |
| RT1 | 4 | 5 | 1.00e−12K |
| L2 | 8 | 13 | 3.10e+05uH |
| RT3 | 8 | 1 | 1.00e−12K |
| R6 | 1 | 0 | 1.00e+00K |
| R7 | 3 | 4 | 1.00e+00K |
| L9 | 5 | 9 | 1.00e+05uH |
| C10 | 0 | 10 | 3.06e+02nF |
| C14 | 13 | 14 | 1.66e+02nF |
| C19 | 19 | 2 | 1.65e+01nF |
| RT21 | 20 | 21 | 1.00e−12K |
| C22 | 9 | 20 | 5.59e+02nF |
| C23 | 22 | 23 | 4.33e+03nF |
| C24 | 24 | 20 | 3.81e+02nF |
| L25 | 22 | 21 | 1.00e+05uH |
| RT26 | 24 | 22 | 1.00e−12K |
| RT27 | 22 | 0 | 1.00e−12K |
| L29 | 23 | 19 | 7.96e+04uH |
| C32 | 18 | 21 | 1.66e+02nF |
| L33 | 18 | 16 | 3.10e+05uH |
| L34 | 27 | 28 | 7.96e+04uH |
| C35 | 27 | 0 | 2.58e+03nF |
| L36 | 16 | 14 | 2.77e+04uH |
| RT37 | 10 | 14 | 1.00e−12K |
| RT38 | 10 | 2 | 1.00e−12K |
| L40 | 28 | 16 | 8.99e+04uH |
| C41 | 28 | 0 | 1.66e+02nF |

If the resistance of resistive traces (wires) is required to accurately analyze a particular circuit, an appropriate (and different) resistance would be assigned to each wire. This resistance can easily be calculated based on the known length of each resistive trace. Since the boundaries in the frequency domain of the passbands of the just-described circuits for lowpass, bandstop, or bandpass filters are all within the audio range of frequencies, the resistances of the wires have no appreciable effect on the behavior of these particular circuits. These resistive traces (wires) are listed in the table with a common nominal nonzero resistance of $10^{12}$.

The resistances of wires have no appreciable effect on the behavior of the just-described circuits for lowpass, bandstop, or bandpass filters whose passband boundaries are inside the audio range of frequencies. The parasitic interactions between the components of the above three circuits likewise have no appreciable effect. However, since the process described herein produces a table (such as those shown above) containing a list of components and wires with an assigned physical location and value for each component and wire, it is possible to perform a parasitic analysis on the overall circuit if desired.

Note in FIG. 27 (concerning the bandstop filter problem) that a "via" connection was attempted to the right of capacitor C41 by the one point labeled "2" in the circuit. However, this connection was not completed because there is no second point labeled "2" in that figure. However, in FIG. 28 concerning the bandpass filter problem, there are two points (each labeled "2") where a connection is actually completed between two distant parts of the circuit using a "via." These two points are above capacitor C19 and to the right of capacitor C41. In the embodiment used for this problem, the layer (layer 2) to which the two points labeled "2" makes connection can be viewed as a solid rectangular piece of conducting material. Thus, any via from the main layer to layer 2 makes electrical connection with any other via from the main layer to layer 2. Thus, FIG. 28 shows an automatically created bandpass filter (including its topology, sizing, placement, and routing) that actually employs one of two available layers for vias for connecting distant points.

There are alternatives to the embodiment of via's illustrated by FIG. 28 for the bandpass filter problem. In one alternative embodiment, two special additional layers (called A and B below) are used to implement multiple (i.e., many more than two) differently numbered vias. These two layers are in addition to the main layer of the printed circuit board, silicon wafer, or other substrate. Layers A and B serve different purposes in implementing multiple differently numbered vias. These layers differ from the above embodiment in that they are not solid areas of conducting material.

Suppose, for purpose of example, that eight vias are to be available for connecting distant points on the main layer of the printed circuit board, silicon wafer, or other substrate. Each of the eight possible vias is created by execution of a particular VIA-LAYOUT function. For example, the fifth via (of the eight possible vias) is implemented by executing a VIA-LAYOUT-5 function. The VIA-LAYOUT-5 function (and each of the other functions of this family) operate in a manner similar to the VIA-TO-GROUND functions. In particular, the execution of the VIA-LAYOUT-5 function causes a "5" to be inserted at point 1030 of FIG. 11 (instead of the "G" shown at 1030 of FIG. 11). This point "5" at 1030 is located on the main layer of the printed circuit board, silicon wafer, or other substrate.

Figure 29:
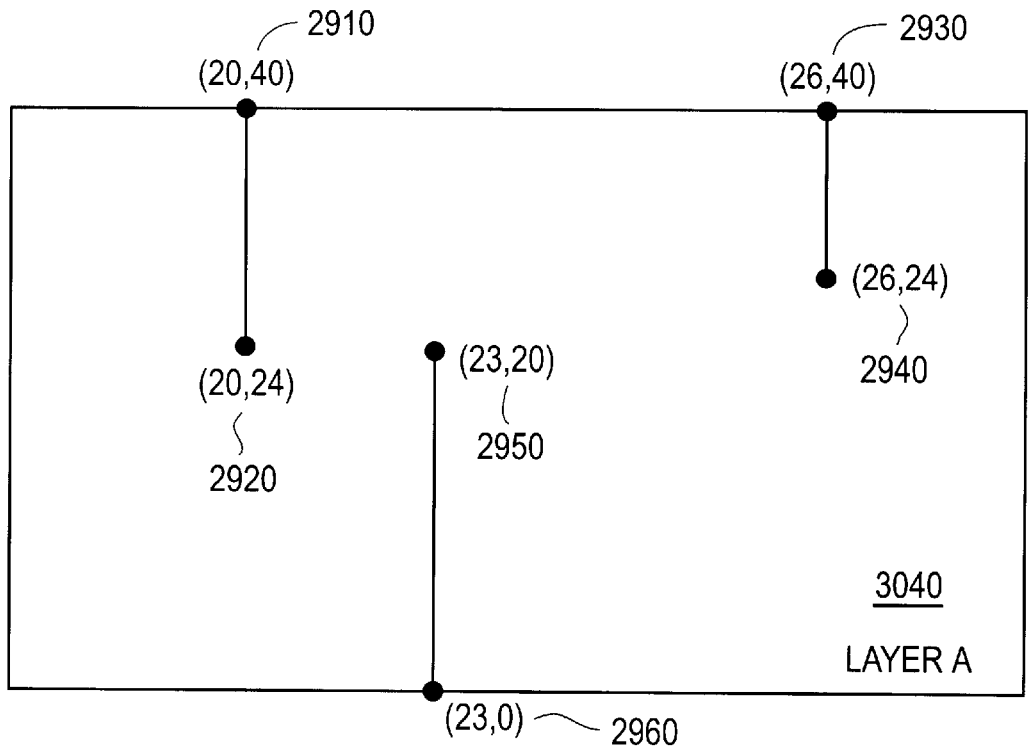
FIG. 29 shows an intermediate layer containing wires that partially implement the via function.

Assume now (for simplicity of description and without loss of generality) that the main layer, layer A, and layer B are all rectangles and all of the same size. Assume also that the point 1030 (labeled "5") on the main layer has coordinates (20, 24). Then there is a point 2920 in FIG. 29 with coordinates (20, 24) on layer A and this point corresponds to point 1030 of the main layer. In fact, the via connects these two points. Then, on layer A, the fixed system controlling the present invention (i.e., not any branch of a circuit-constructing program tree) mechanically lays down a non-modifiable wire from the point 2920 (20, 24) in FIG. 29 on layer A to one particular designated edge of layer A such that the non-modifiable wire is perpendicular to that edge. Suppose that the edge of layer A has second coordinate 40 (the edge). Then, the non-modifiable wire is laid down from 2920 (20, 24) in FIG. 29 of layer A to 2910 (20, 40) of layer A. As other vias are created on the main layer, other non-modifiable wires are laid down on layer A from the corresponding point on layer A to the designated edge. For example, if another via starts at (26,24) of the main layer, it appears at corresponding point 2940 (26,24) of FIG. 29 of layer A and a non-modifiable wire running then runs from corresponding point 2940 (26,24) of layer A to 2930 (26,40) of FIG. 29 at the designated edge of layer A. Both of these non-modifiable wires on layer A are guaranteed to be parallel to each other because of the fixed procedure for mechanically laying them down. In the event that two such non-modifiable wires were to be too close to one another, the newer of the two non-modifiable wires is immediately displaced to the right by an appropriate minimal separating distance (and components and wires on the main layer are immediately and similarly immediately adjusted to the right by the same distance). In any case, the result is that a wire is created from each via on the main layer to a particular point on the designated edge of layer A.

In yet another alternative embodiment, each consecutive non-modifiable wire is routed to one of two opposite edges of layer A. That is, each consecutive via is routed to one of two opposite designated edges of layer A such that all the non-modifiable wires are again parallel and separated by the minimal separating distance for wires. For example, assume the second via was at (23, 20) of the main layer. Its corresponding point on layer A is 2950 (23,20). The non-modifiable wire is then run from 2950 (23, 20) to 2960 (23, 0) of FIG. 29 at the opposite edge. If a third via is at (23, 20) of the main layer, the non-modifiable wire is then run from 2940 (23, 20) to 2930 (23, 40) of FIG. 29 on layer A. The alternation from one edge to the opposite edge leads to more efficient handling of the connections on layer B (described below). Alternatively, wires can be run to the nearest of the two designated edges.

All the non-modifiable wires that are laid down on layer A (and any adjustment, if any, to the main layer) are made mechanically under control of the fixed system controlling the present invention (i.e., not by any branch of a circuit-constructing program tree).

Figure 30:
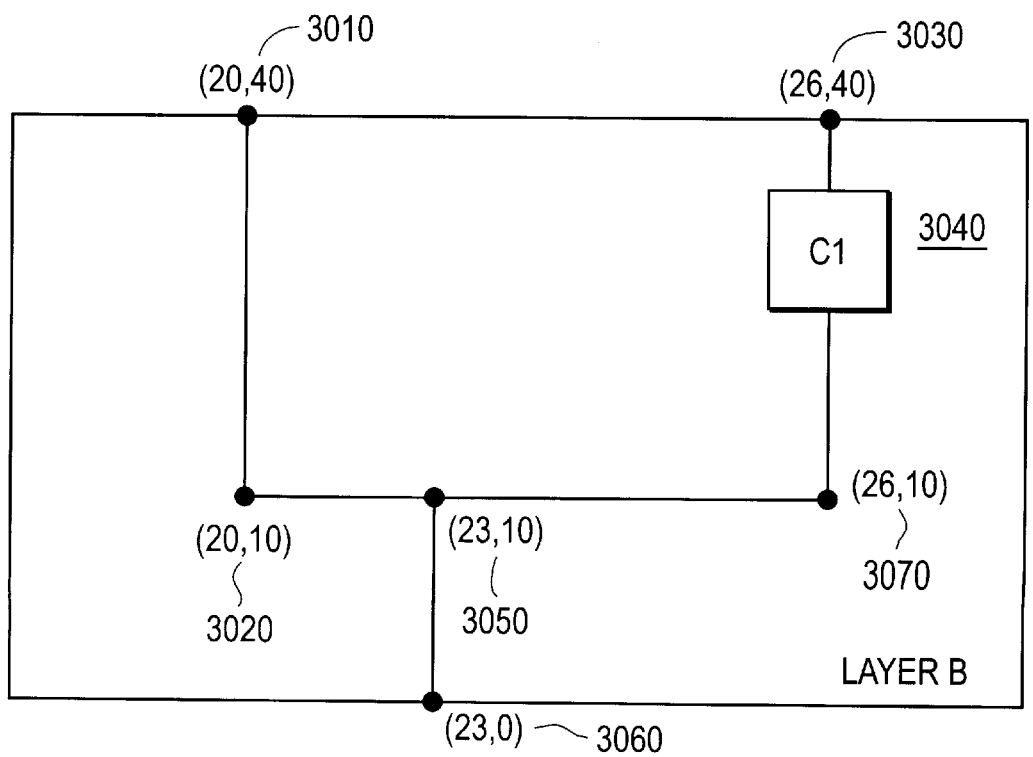
FIG. 30 shows another layer such as would be used on the back side of a printed circuit board.

Now consider layer B. Non-modifiable wires (and possibly other components) are also laid down on the second of the two additional special layers (i.e., layer B). Each of the points on the edge(s) of layer A are connected to the corresponding point on layer B. For example, the previously mentioned point 2910 (20, 40) of FIG. 29 of layer A is connected to 3010 (20, 40) of FIG. 30 of layer B. Similarly, the previously mentioned point 2930 (26, 40) of FIG. 29 of layer A is connected to 3030 (26, 40) of FIG. 30 of layer B. The previously mentioned point 2960 (23, 0) of FIG. 29 of layer A is connected to 3060 (23, 0) of FIG. 30 of layer B. The connections on layer B differ from those on layer A in that the connections on layer B are made under the control of additional branches of the overall circuit-constructing program tree that are subject to evolutionary change using the process of the present invention. The component-creating NON-MODIFIABLE-WIRE-LAYOUT functions are used for laying down non-modifiable wires on layer B. If components other than non-modifiable wires are permitted on layer B (as would be the case on a two-sided printed circuit board that is capable of having components on both sides), then additional component-creating functions are allowed in these additional branches of the overall circuit-constructing program tree. That is, the function set for layer B includes component-creating functions for whatever ordinary components (e.g., transistors, resistors, capacitors) that are permitted on layer B as well as the NON-MODIFIABLE-WIRE-LAYOUT function. For example, if capacitors are allowed on layer B, a capacitor, such as C1 3040, could be placed on layer B. Capacitor C1 appears between edge point (26,40) 3030 and point (26,10) 3070.

There are as many such additional branches as the maximum number of points on the edge of layer B. That is, there are as many modifiable wires in the embryo for layer B as the maximum number of points on the edge of layer B. The placement and routing of non-modifiable wires of layer B (and the placement and routing of other components permitted on layer B) are all determined by the branches of the circuit-constructing applicable to layer B.

CONCLUSION

Several variations in the implementation of genetic programming that are useful for the automated synthesis, placement, and routing of electrical circuits and other complex structures have been described. The specific arrangements and methods described here are merely illustrative of the principles of this invention. Numerous modifications in form and detail may be made by those skilled in the art without departing from the true spirit and scope of the invention. Although this invention has been shown in relation to a particular embodiment, it should not be considered so limited. Rather it is limited only by the appended claims.

What is claimed is:

1. In a system having at least one entity, wherein each entity comprises at least one constructing action, a system-implemented iterative process for creating a design of a structure that satisfies prespecified design goals, the iterative process comprising the iteration of a series of steps which comprises:

executing at least one constructing action in the at least one entity to develop a structure comprising a plurality of components, the execution of the at least one constructing actions determining both the topological connections between components of the structure and the physical location of each of the components of the structure, ascertaining the degree to which the structure satisfies the prespecified design goals, selecting from among the at least one entity, wherein an entity that satisfies the prespecified design goals to a greater degree than another entity is preferred, creating at least one candidate entity by applying an operation to modify at least one of the selected entities.

2. The process defined in claim 1 wherein executing at least one constructing action comprises determining at least one value for at least one of the plurality of components.

3. The process defined in claim 1 wherein executing at least one constructing action comprises determining the physical location of connections between components of the structure.

4. The process defined in claim 1 wherein creating at least one candidate entity comprises performing a mutation operation on the at least one selected entity.

5. The process defined in claim 4 wherein selecting from among at least one entity is performed by simulating annealing.

6. The process defined in claim 4 wherein selecting from among at least one entity is performed by hill climbing.

7. The process defined in claim 1 wherein said at least one entity comprises a population of entities.

8. The process defined in claim 7 wherein creating at least one candidate entity comprises performing crossover among a group of at least two entities of the population, the group comprising a selected entity and at least one other entity from the population, wherein crossover is performed so that the new entity created comprises at least a portion of each of the at least two entities.

9. The process defined in claim 1, wherein creating at least one candidate entity comprises performing reproduction.

10. The process defined in claim 7 wherein creating at least one candidate entity comprises performing an architecture-altering operation.

11. The process defined in claim 7 wherein selecting one of the at least one entity is performed by fitness proportionate selection.

12. The process defined in claim 7 wherein selecting one of the at least one entity is performed by tournament selection.

13. The process defined in claim 1 wherein at least one of entity comprises at least one externally invokable sub-entity and at least one internally invokable sub-entity, said at least one externally invokable sub-entity capable of including at least one invocation of said at least one internally invokable sub-entity.

14. The process defined in claim 13 wherein said at least one entity comprises at least two internally invokable sub-entities and wherein at least one of said internally invokable sub-entities is capable of including at least one invocation of another of said internally invokable sub-entities.

15. The process defined in claim 1 wherein said at least one entity comprises a randomly created entity.

16. The process defined in claim 1 wherein said at least one entity comprises an entity supplied to the process.

17. The process defined in claim 1 wherein ascertaining the degree to which an entity satisfies the prespecified design goals comprises evaluating the entity by simulating the entity.

18. The process defined in claim 1 wherein ascertaining the degree to which an entity satisfies the prespecified design goals comprises evaluating the entity by observing a physical realization of the entity.

19. The method defined in claim 1 wherein each of said at least one entities conforms to a constrained syntactic structure.

20. The process defined in claim 1 wherein each of said at least one entities is an electrical circuit.

21. The process defined in claim 20 wherein the connections comprise wires.

22. The process defined in claim 1 wherein each of said at least one entities is a mechanical system.

23. The process defined in claim 2 further comprises using an arithmetic-performing subtree to determine said at least one value.

24. The process defined in claim 2 further comprising using a number subject to perturbation by a Gaussian probability distribution to determine said at least one value.

25. The process defined in claim 1 further comprising determining physical location of each of the components of the structure after execution of constructing actions in the entity.

26. The process defined in claim 1 further comprising determining physical location components of the structure during a developmental process by progressively adjusting the physical location of at least one component.

27. The method defined in claim 1 further comprising adjusting the topology of the components by:
   determining a size of a first component within the structure; and
   adjusting positions of all other components in the structure to compensate for the size of the first component.

28. The process defined in claim 1 wherein ascertaining the degree to which an entity satisfies the prespecified design goals comprises considering parasitic effects between the components of said structure.

29. The process defined in claim 1 wherein ascertaining the degree to which an entity satisfies the prespecified design goals comprises considering the total area occupied by all the components of the structure.

30. The process defined in claim 1 wherein executing constructing actions comprises restraining execution of constructing actions to ensure components are physically located inside a prespecified area.

31. The process defined in claim 1 wherein the at least one entity comprises a population of entities, and further comprising:
   dividing the population entities into a plurality of groups;
   performing one or more operations of each iteration with respect to each entity in each group using a separate processing node.

32. An iterative computer-implemented process for creating a structural design that satisfies prespecified design goals, the process invoking iterations, each iteration comprising:
   developing a structure by executing constructing actions in an entity to simultaneously specify a topological arrangement of components, component values and placement of components with respect to each other; and
   determining behavior of the developed structure.

33. An apparatus, for creating a design of a structure that satisfies prespecified design goals, in a system having at least one entity, wherein each entity comprises at least one constructing action, the apparatus comprising:
   means for executing at least one constructing action in the at least one entity to develop a structure comprising a plurality of components, the execution of the at least one constructing actions determining both the topological connections between components of the structure and the physical location of each of the components of the structure;
   means for ascertaining the degree to which the structure satisfies the prespecified design goals;
   means for selecting from among the at least one entity, wherein an entity that satisfies the prespecified design goals to a greater degree than another entity is preferred; and
   means for creating at least one candidate entity by applying an operation to modify at least one of the selected entities.

34. The apparatus defined in claim 33 wherein the means for executing at least one constructing action comprises means for determining at least one value for at least one of the plurality of components.

35. The apparatus defined in claim 33 wherein the means for executing at least one constructing action comprises means for determining the physical location of connections between components of the structure.

36. The apparatus defined in claim 33 wherein the means for creating at least one candidate entity comprises means for performing a mutation operation on the at least one selected entity.

37. The apparatus defined in claim 36 wherein the means for selecting selects from among at least one entity using simulating annealing.

38. The apparatus defined in claim 36 wherein the means for selecting selects from among at least one entity using hill climbing.

39. The apparatus defined in claim 33 wherein said at least one entity comprises a population of entities.

40. The apparatus defined in claim 39 wherein the means for creating at least one candidate entity comprises means for performing crossover among a group of at least two entities of the population, the group comprising a selected entity and at least one other entity from the population, wherein crossover is performed so that the new entity created comprises at least a portion of each of the at least two entities.

41. The apparatus defined in claim 33 wherein the means for creating at least one candidate entity comprises means for performing reproduction.

42. The apparatus defined in claim 39 wherein the means for creating at least one candidate entity comprises means for performing an architecture-altering operation.

43. The apparatus defined in claim 39 wherein the means for selecting selects one of the at least one entity using fitness proportionate selection.

44. The apparatus defined in claim 39 wherein the means for selecting selects one of the at least one entity using tournament selection.

45. The apparatus defined in claim 33 wherein at least one of entity comprises at least one externally invokable sub-entity and at least one internally invokable sub-entity, said at least one externally invokable sub-entity capable of including at least one invocation of said at least one internally invokable sub-entity.

46. The apparatus defined in claim 45 wherein said at least one entity comprises at least two internally invokable sub-entities and wherein at least one of said internally invokable sub-entities is capable of including at least one invocation of another of said internally invokable sub-entities.

47. The apparatus defined in claim 33 wherein said at least one entity comprises a randomly created entity.

48. The apparatus defined in claim 33 wherein said at least one entity comprises an entity supplied to the process.

49. The apparatus defined in claim 33 wherein the means for ascertaining the degree to which an entity satisfies the prespecified design goals comprises means for evaluating the entity by simulating the entity.

50. The apparatus defined in claim 33 wherein the means for ascertaining the degree to which an entity satisfies the prespecified design goals comprises means for evaluating the entity by observing a physical realization of the entity.

51. The apparatus defined in claim 33 wherein each of said at least one entities conforms to a constrained syntactic structure.

52. The apparatus defined in claim 33 wherein each of said at least one entities is an electrical circuit.

53. The apparatus defined in claim 52 wherein the connections comprise wires.

54. The apparatus defined in claim 33 wherein each of said at least one entities is a mechanical system.

55. The apparatus defined in claim 34 further comprises means for determining said at least one value using an arithmetic-performing subtree.

56. The apparatus defined in claim 34 further comprising means for determining said at least one value using a number subject to perturbation by a Gaussian probability distribution.

57. The apparatus defined in claim 33 further comprising means for determining physical location of each of the components of the structure after execution of constructing actions in the entity.

58. The apparatus defined in claim 33 further comprising means for determining physical location components of the structure during a developmental process by progressively adjusting the physical location of at least one component.

59. The apparatus defined in claim 33 further comprising means for adjusting the topology of the components, wherein the means for adjusting comprises:
  means for determining a size of a first component within the structure; and
  means for adjusting positions of all other components in the structure to compensate for the size of the first component.

60. The apparatus defined in claim 33 wherein the means for ascertaining the degree to which an entity satisfies the prespecified design goals comprises means for considering parasitic effects between the components of said structure.

61. The apparatus defined in claim 33 wherein the means for ascertaining the degree to which an entity satisfies the prespecified design goals comprises means for considering the total area occupied by all the components of the structure.

62. The apparatus defined in claim 33 wherein the means for executing constructing actions comprises means for restraining execution of constructing actions to ensure components are physically located inside a prespecified area.

63. The apparatus defined in claim 33 wherein the at least one entity comprises a population of entities, and further comprising:
  means for dividing the population entities into a plurality of groups; and
  means for performing one or more operations of each iteration with respect to each entity in each group using a separate processing node.

64. An apparatus for creating a structural design that satisfies prespecified design goals, the apparatus comprising:
  means for developing a structure by executing constructing actions in an entity to simultaneously specify a topological arrangement of components, component values and placement of components with respect to each other; and
  means for determining behavior of the developed structure.

65. A machine-readable medium having stored thereon executable code which causes a machine to perform a method, for creating a design of a structure that satisfies prespecified design goals, in a system having at least one entity, wherein each entity comprises at least one constructing action, the method comprising:
  executing at least one constructing action in the at least one entity to develop a structure comprising a plurality of components, the execution of the at least one constructing actions determining both the topological connections between components of the structure and the physical location of each of the components of the structure;
  ascertaining the degree to which the structure satisfies the prespecified design goals;
  selecting from among the at least one entity, wherein an entity that satisfies the prespecified design goals to a greater degree than another entity is preferred; and
  creating at least one candidate entity by applying an operation to modify at least one of the selected entities.

66. The machine-readable medium defined in claim 65 wherein executing at least one constructing action comprises determining at least one value for at least one of the plurality of components.

67. The machine-readable medium defined in claim 65 wherein executing at least one constructing action comprises determining the physical location of connections between components of the structure.

68. The machine-readable medium defined in claim 65 wherein creating at least one candidate entity comprises performing a mutation operation on the at least one selected entity.

69. The machine-readable medium defined in claim 68 wherein selecting from among at least one entity is performed by simulating annealing.

70. The machine-readable medium defined in claim 68 wherein selecting from among at least one entity is performed by hill climbing.

71. The machine-readable medium defined in claim 65 wherein said at least one entity comprises a population of entities.

72. The machine-readable medium defined in claim 71 wherein creating at least one candidate entity comprises performing crossover among a group of at least two entities of the population, the group comprising a selected entity and at least one other entity from the population, wherein crossover is performed so that the new entity created comprises at least a portion of each of the at least two entities.

73. The machine-readable medium defined in claim 65 wherein creating at least one candidate entity comprises performing reproduction.

74. The machine-readable medium defined in claim 71 wherein creating at least one candidate entity comprises performing an architecture-altering operation.

75. The machine-readable medium defined in claim 71 wherein selecting one of the at least one entity is performed by fitness proportionate selection.

76. The machine-readable medium defined in claim 71 wherein selecting one of the at least one entity is performed by tournament selection.

77. The machine-readable medium defined in claim 65 wherein at least one of entity comprises at least one externally invokable sub-entity and at least one internally invokable sub-entity, said at least one externally invokable sub-entity capable of including at least one invocation of said at least one internally invokable sub-entity.

78. The machine-readable medium defined in claim 77 wherein said at least one entity comprises at least two internally invokable sub-entities and wherein at least one of said internally invokable sub-entities is capable of including at least one invocation of another of said internally invokable sub-entities.

79. The machine-readable medium readable medium defined in claim 65 wherein said at least one entity comprises a randomly created entity.

80. The machine-readable medium defined in claim 65 wherein said at least one entity comprises an entity supplied to the process.

81. The machine-readable medium defined in claim 65 wherein ascertaining the degree to which an entity satisfies the prespecified design goals comprises evaluating the entity by simulating the entity.

82. The machine-readable medium defined in claim 65 wherein ascertaining the degree to which an entity satisfies the prespecified design goals comprises evaluating the entity by observing a physical realization of the entity.

83. The machine-readable medium defined in claim 65 wherein each of said at least one entities conforms to a constrained syntactic structure.

84. The machine-readable medium defined in claim 65 wherein each of said at least one entities is an electrical circuit.

85. The machine-readable medium defined in claim 84 wherein the connections comprise wires.

86. The machine-readable medium defined in claim 65 wherein the method each of said at least one entities is a mechanical system.

87. The machine-readable medium defined in claim 66 wherein the method further comprises using an arithmetic-performing subtree to determine said at least one value.

88. The machine-readable medium defined in claim 66 wherein the method further comprises using a number subject to perturbation by a Gaussian probability distribution to determine said at least one value.

89. The machine-readable medium defined in claim 65 wherein the method further comprises determining physical location of each of the components of the structure after execution of constructing actions in the entity.

90. The machine-readable medium defined in claim 65 where in the method further comprises determining physical location components of the structure during a developmental process by progressively adjusting the physical location of at least one component.

91. The machine-readable medium defined in claim 65 wherein the method further comprises adjusting the topology of the components by:
 determining a size of a first component within the structure; and
 adjusting positions of all other components in the structure to compensate for the size of the first component.

92. The machine-readable medium defined in claim 65 wherein ascertaining the degree to which an entity satisfies the prespecified design goals comprises considering parasitic effects between the components of said structure.

93. The machine-readable medium defined in claim 65 wherein ascertaining the degree to which an entity satisfies the prespecified design goals comprises considering the total area occupied by all the components of the structure.

94. The machine-readable medium defined in claim 65 wherein executing constructing actions comprises restraining execution of constructing actions to ensure components are physically located inside a prespecified area.

95. The machine-readable medium defined in claim 65 wherein the at least one entity comprises a population of entities, and wherein the method further comprises:
 dividing the population entities into a plurality of groups; and
 performing one or more operations of each iteration with respect to each entity in each group using a separate processing node.

96. A machine-readable medium having stored thereon executable code which causes a machine to perform a method, for creating a structural design that satisfies prespecified design goals, the method comprising:
 developing a structure by executing constructing actions in an entity to simultaneously specify a topological arrangement of components;
 component values and placement of components with respect to each other; and
 determining behavior of the developed structure.

* * * * *

UNITED STATES PATENT AND TRADEMARK OFFICE
CERTIFICATE OF CORRECTION

PATENT NO.    : 6,424,959 B1
DATED         : July 23, 2002
INVENTOR(S)   : Bennett, III et al.

It is certified that error appears in the above-identified patent and that said Letters Patent is hereby corrected as shown below:

<u>Title page, Item [54] and Column 1, lines 2-3,</u>
Delete "PLACEMENT AND" and insert -- PLACEMENT, AND --.
Item [75], Inventors, delete "25372 La Rena La.,".
Delete "94022".

Signed and Sealed this

Thirty-first Day of December, 2002

JAMES E. ROGAN
*Director of the United States Patent and Trademark Office*